US009023586B2

(12) United States Patent
Hatakeyama

(10) Patent No.: US 9,023,586 B2
(45) Date of Patent: May 5, 2015

(54) POSITIVE RESIST COMPOSITION AND PATTERNING PROCESS USING SAME

(71) Applicant: Shin-Etsu Chemical Co., Ltd., Tokyo (JP)

(72) Inventor: Jun Hatakeyama, Jyoetsu (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 0 days.

(21) Appl. No.: 14/085,502

(22) Filed: Nov. 20, 2013

(65) Prior Publication Data

US 2014/0170563 A1 Jun. 19, 2014

(30) Foreign Application Priority Data

Dec. 18, 2012 (JP) ................................ 2012-276087

(51) Int. Cl.

*C08F 30/04* (2006.01)
*G03F 7/004* (2006.01)
*G03F 7/40* (2006.01)
*G03F 7/039* (2006.01)
*G03F 7/30* (2006.01)

(52) U.S. Cl.

CPC ................ *G03F 7/0397* (2013.01); *G03F 7/30* (2013.01); *G03F 7/40* (2013.01); *Y10S 430/114* (2013.01)

(58) Field of Classification Search

USPC .............. 430/270.1, 322, 325, 330, 331, 913; 526/241

See application file for complete search history.

(56) References Cited

U.S. PATENT DOCUMENTS

| | | | | |
|---|---|---|---|---|
| 5,686,223 | A * | 11/1997 | Cleeves | 430/312 |
| 5,879,851 | A | 3/1999 | Takahashi et al. | |
| 6,171,757 | B1 * | 1/2001 | Angelopoulos et al. | 430/270.1 |
| 6,436,605 | B1 | 8/2002 | Angelopoulos et al. | |
| 6,448,420 | B1 | 9/2002 | Kinsho et al. | |
| 6,458,907 | B1 * | 10/2002 | Angelopoulos et al. | 526/241 |
| 8,057,982 | B2 * | 11/2011 | Hatakeyama et al. | 430/270.1 |
| 8,198,016 | B2 * | 6/2012 | Hatakeyama et al. | 430/312 |
| 8,394,570 | B2 * | 3/2013 | Ohashi et al. | 430/270.1 |
| 8,426,115 | B2 * | 4/2013 | Hatakeyama et al. | 430/312 |
| 8,440,386 | B2 * | 5/2013 | Hatakeyama et al. | 430/270.1 |
| 8,507,173 | B2 * | 8/2013 | Hatakeyama et al. | 430/270.1 |
| 2002/0081521 | A1 | 6/2002 | Takeda et al. | |
| 2007/0231708 | A1 | 10/2007 | Matsumaru et al. | |
| 2008/0090172 | A1 | 4/2008 | Hatakeyama et al. | |
| 2008/0096134 | A1 * | 4/2008 | Sugimoto et al. | 430/287.1 |
| 2008/0118860 | A1 | 5/2008 | Harada et al. | |
| 2008/0241736 | A1 | 10/2008 | Kobayashi et al. | |
| 2009/0226843 | A1 * | 9/2009 | Hatakeyama et al. | 430/286.1 |
| 2011/0033803 | A1 * | 2/2011 | Hatakeyama et al. | 430/285.1 |
| 2011/0208941 | A1 * | 8/2011 | Gill et al. | 711/170 |
| 2011/0294070 | A1 * | 12/2011 | Hatakeyama et al. | 430/285.1 |

FOREIGN PATENT DOCUMENTS

| | | |
|---|---|---|
| JP | A-2000-327633 | 11/2000 |
| JP | A-2001-66767 | 3/2001 |
| JP | B2-3429592 | 7/2003 |
| JP | A-2006-45311 | 2/2006 |
| JP | A-2006-169302 | 6/2006 |
| JP | A-2006-178317 | 7/2006 |
| JP | B2-3865048 | 1/2007 |
| JP | A-2008-111103 | 5/2008 |
| JP | A-2008-122932 | 5/2008 |
| JP | A-2008-239918 | 10/2008 |

OTHER PUBLICATIONS

Archer, Inorganic and Organometallic Polymers, Wiley-VCH, Inc. (2001).*

Pittman et al, Polymerization of Ferrocenylmethyl Acrylate and Ferrocenylmethyl Methacrylate. Characterization of Their Polymers and Their Polymeric Ferricinium Salts. Extension to Poly(ferricenylethylene), Macromolecules, vol. 3, (6), pp. 746-754 (1970).*

* cited by examiner

*Primary Examiner* — Amanda C Walke
(74) *Attorney, Agent, or Firm* — Oliff PLC

(57) ABSTRACT

The invention provides a positive resist composition, wherein a polymer compound having the weight-average molecular weight in the range of 1,000 to 500,000 and comprising a repeating unit having a hydrogen atom in a carboxyl group and/or in a phenolic hydroxy group therein been substituted by an acid-labile group and a repeating unit "a" having a cyclopentadienyl complex shown by the following general formula (1) is used as a base resin therein. There can be a positive resist composition having not only small edge roughness (LER and LWR) while having a higher resolution than conventional positive resist compositions, but also a good pattern form after exposure and an extremely high etching resistance, especially a positive resist composition using a polymer compound suitable as a base resin for a chemically amplifying resist composition; and a patterning process.

(1)

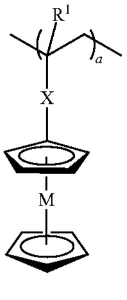

16 Claims, No Drawings

POSITIVE RESIST COMPOSITION AND PATTERNING PROCESS USING SAME

BACKGROUND OF THE INVENTION

1. Field of the Invention

The present invention relates to a positive resist composition, especially to a positive resist composition using a polymer compound suitable as a base resin for a chemically amplifying positive resist composition, and to a patterning process using the same.

2. Description of the Related Art

As LSI advances toward higher integration and processing speed, miniaturization of the pattern rule is progressing rapidly. Especially expansion of the flash memory market and increase in the memory capacity lead this miniaturization. The 65-nm node device is being mass-produced by an ArF lithography as the cutting-edge technology for miniaturization; and mass-production of the 45-nm node by an ArF immersion lithography as the next generation technology is under preparation. Candidate for the next generation 32-nm node that is being under investigation includes; the immersion lithography by a super high NA lens formed of a combination of a liquid having a higher refractive index than water, a lens having a high refractive index, and a resist film having a high refractive index; a lithography by a vacuum ultraviolet (EUV) of the wavelength of 13.5 nm; and a double exposure of an ArF lithography (double patterning lithography).

In high energy beams of extremely short wavelengths such as EB and X-ray, a light element such as hydrocarbon that is used in a resist composition hardly shows absorbance, so that a resist composition based on polyhydroxy styrene is being under investigation.

As to the exposure instrument for mask production, in order to enhance line-width precision, the exposure instrument using an electron beam (EB) has been used from the exposure instrument using a laser beam. Moreover, by increasing the acceleration voltage of an electron beam gun, further miniaturization becomes possible; and thus, the acceleration voltage has been increased from 10 kV to 30 kV, with the recent main stream thereof being 50 kV, and further study of even 100 kV is currently taking place.

Note that, deterioration in sensitivity of the resist film is becoming a problem as the acceleration voltage is increased. As the acceleration voltage is increased, the forward scattering effect within the resist film becomes smaller so that contrast of the electron beam drawing energy is enhanced thereby leading to improvement in resolution and size controllability, while sensitivity of the resist film is deteriorated because the electron passes through the resist film with free draining condition. In the mask exposure instrument, direct drawing is done by way of the one-stroke sketch so that deterioration in sensitivity of the resist film causes decrease in the productivity; and thus, this is not desirable. Accordingly, because of the request for higher sensitivity, investigation of a chemically amplifying resist composition is getting underway.

Simultaneously with miniaturization of the pattern of the EB lithography for mask production, thinning of the resist is progressing in order to prevent pattern fall during development due to a high aspect ratio. In the photolithography, thinning of the resist contributes significantly to enhancement of the resolution. This is because a device became more flattened by introduction of CMP and others. In mask production, a substrate is flat so that film thickness of the substrate to be processed (such as for example, Cr, MoSi, and $SiO_2$) has been determined based on the light shielding rate and the phase difference control. To make the film thinner, the dry etching resistance of the resist needs to be enhanced.

Generally, it is said that there is a relationship between the resist carbon density and the dry etching resistance. In the EB drawing which is not influenced by absorption, the resist based on a novolak polymer having a high etching resistance has been developed.

To enhance the etching resistance, a styrene copolymer was firstly shown, and then, an indene copolymer and an acenaphthylene copolymer were shown in Patent Document 1 and in Patent Document 2, respectively, in which attempts were made to enhance the etching resistance by utilizing not only the high carbon density but also the rigid main chain structures due to these cycloolefin structures.

In Patent Document 3, a proposal was made to enhance the etching resistance by blending an existing resist compound with a compound having yttrium, aluminum, iron, titanium, zirconium, or hafnium; and as the iron-containing compound, ferrocene compounds such as ferrocene aldehyde, ferrocene methanol, ferrocene ethanol, ferrocene carboxylic acid, and ferrocene dicarboxylic acid were mentioned.

PRIOR ART DOCUMENTS

Patent Documents

Patent Document 1: Japanese Patent No. 3865048

Patent Document 2: Japanese Patent Laid-Open Publication No. 2006-169302

Patent Document 3: Japanese Patent Laid-Open Publication No. 2001-066767

SUMMARY OF THE INVENTION

The present invention was made in view of the circumstance as mentioned above, and thus, an object thereof is to provide; a positive resist composition having not only small edge roughness (LER and LWR) while having a higher resolution than conventional positive resist compositions, but also a good pattern form after exposure and an extremely high etching resistance, especially a positive resist composition using a polymer compound suitable as a base resin for a chemically amplifying resist composition; and a patterning process.

In order to solve the problems mentioned above, according to the present invention, provided is a positive resist composition, wherein a polymer compound having the weight-average molecular weight in the range of 1,000 to 500,000 and comprising a repeating unit having a hydrogen atom in a carboxyl group and/or in a phenolic hydroxy group therein been substituted by an acid-labile group and a repeating unit "a" having a cyclopentadienyl complex shown by the following general formula (1) is used as a base resin therein, (1)

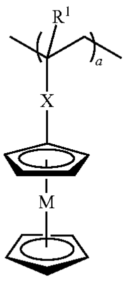

wherein $R^1$ represents a hydrogen atom or a methyl group; X represents a single bond, a methylene group, —C(═O)—O—$R^2$—, —O—$R^2$—, —O—C(═O)—$R^2$—, or —Ar—$R^2$—; and M represents Fe, Co, Ni, Cr, or Ru. Ar represents a phenylene group or a naphthylene group. $R^2$ are the same or different, representing a single bond, or a linear, a branched, or a cyclic alkylene group having 1 to 6 carbon atoms, an arylene group having 6 to 10 carbon atoms, or an alkenylene group having 2 to 10 carbon atoms, wherein $R^2$ may optionally contain an ester group or an ether group.

The positive resist composition like this has a high suppression effect of acid diffusion, a high resolution, a small edge roughness, a good process adaptability, an excellent pattern form after development, and an extremely high etching resistance. Accordingly, this composition has a high practical value, being advantageous as a resist composition for VLSI and as a mask patterning composition.

In addition, it is preferable that a polymer compound shown by the following general formula (2) having a repeating unit shown by the following general formula (b1) and/or (b2) as the repeating unit having a hydrogen atom in a carboxyl group and/or in a phenolic hydroxy group therein been substituted by an acid-labile group is used as the base resin, (2)

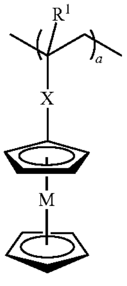

(a)

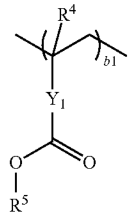

(b1)

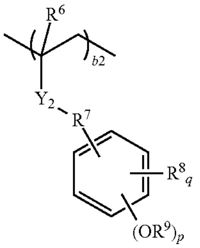

(b2)

wherein $R^1$, X, and M represent the same meanings as before. $R^4$ and $R^6$ represent a hydrogen atom or a methyl group; and $R^5$ and $R^9$ represent an acid-labile group. $R^7$ represents a single bond, or a linear or a branched alkylene group having 1 to 6 carbon atoms; $R^8$ represents a hydrogen atom, a fluorine atom, a trifluoromethyl group, a cyano group, or a linear, a branched, or a cyclic alkyl group having 1 to 6 carbon atoms; "p" represents 1 or 2; and "q" represents an integer of 0 to 4. $Y_1$ represents a single bond, a connecting group having 1 to 12 carbon atoms which has an ester group, an ether group, or a lactone ring, a phenylene group, or a naphthylene group. $Y_2$ represents a single bond, —C(═O)—O—, or —C(═O)—NH—; and $0<a<1.0$, $0 \le b1<1.0$, $0 \le b2<1.0$, $0<b1+b2<1.0$, and $0.1 \le a+b1+b2 \le 1.0$.

As mentioned above, as the repeating unit having the hydrogen atom in the carboxyl group and/or the phenolic hydroxy group therein been substituted by an acid-labile group, it is preferable that the polymer compound have a repeating unit shown by the general formula (b1) and/or (b2).

In addition, it is preferable that a polymer compound having, in addition to the repeating unit "a" and the repeating unit shown by (b1) and/or (b2) in the general formula (2), a repeating unit "c" which has an adhesive group selected from a hydroxy group, a carboxyl group, a lactone ring, a carbonate group, a thiocarbonate group, a carbonyl group, a cyclic acetal group, an ether group, an ester group, a sulfonate ester group, a cyano group, an amide group, and —O—C(═O)-G- (G represents a sulfur atom or NH) be used as the base resin (note here, $0<c \le 0.9$ and $0.2 \le a+b1+b2+c \le 1.0$).

As mentioned above, a polymer compound having, in addition to the repeating unit "a" and the repeating unit shown by (b1) and/or (b2) in the general formula (2), a repeating unit "c" having the adhesive group as shown above is preferable, because adhesion with a substrate can be enhanced further.

Moreover, preferably the present invention is a chemically amplifying resist composition which contains an organic solvent and an acid-generator further.

By blending an organic solvent therein as mentioned above, for example, a coating property of the resist composition onto a substrate and the like can be enhanced. In addition, if an acid-generator is added therein whereby allowing to make it to a chemically amplifying positive resist composition utilizing an acid catalysis reaction, the composition becomes extremely useful because not only a further higher sensitivity but also further excellent various properties can be obtained.

Further in addition, in the present invention, it is preferable that the composition contain a basic compound and/or a surfactant further as additives.

By adding a basic compound as mentioned above, for example, a diffusion rate of an acid in the resist film can be suppressed thereby leading to further enhancement in the resolution; and by adding a surfactant, a coating property of the resist composition can be enhanced further or controlled more easily.

In addition, the present invention provides a patterning process comprising a step of applying the above-mentioned positive resist composition onto a substrate, after heat treatment thereof, a step of exposing to a high energy beam, and a step of development by using a developer.

If the patterning process using the positive resist composition of the present invention is used as mentioned above, a resist pattern having a high suppression effect of the acid diffusion, a high resolution, a small edge roughness, an excellent process adaptability, an excellent pattern form after photo-exposure, and an extremely high etching resistance can be formed.

And in addition, it is preferable that the high energy beam for exposure be a g-beam of the wavelength of 430 nm, an i-beam of the wavelength of 365 nm, a KrF excimer laser beam of the wavelength of 248 nm, an electron beam, or a soft X-ray with the wavelength in the range of 3 to 15 nm.

If the high energy beam as mentioned above is used, the line-width precision can be enhanced thereby allowing further improvement in miniaturization.

It is preferable that a resist pattern after development be cured by baking it in the temperature range of 130 to 300° C. and for the time range of 5 to 1000 seconds.

If the resist pattern after development is baked in the temperature range of 130 to 300° C. and for the time range of 5 to 1000 seconds, a developer and a rinsing liquid can be evaporated; and as a result, curing of the resist pattern and the adhesion with a substrate can be enhanced furthermore.

The positive resist composition of the present invention has not only a high suppression effect of the acid diffusion and a high resolution but also a high sensitivity and a high etching resistance. Accordingly, a positive resist composition, especially a chemically amplifying positive resist composition, suitably applicable, among others, for a VLSI manufacturing or as a fine patterning material for a photo mask by the EB drawing can be obtained.

DESCRIPTION OF THE PREFERRED EMBODIMENTS

Hereinafter, the present invention will be explained in more detail.

As mentioned above, it has been wanted to develop; a positive resist composition using a polymer compound suitable as a base resin of a positive resist composition, especially a chemically amplifying positive composition, having a small edge roughness (LER and LWR) with a higher resolution than conventional positive resist compositions while having an excellent pattern form after exposure and an extremely good etching resistance; and a patterning process having such characteristics.

Accordingly, inventors of the present invention carried out an extensive investigation to obtain a positive resist composition having a high sensitivity, a high resolution, a small edge roughness, and an excellent etching resistance, these properties being required in recent years; and as a result, they found that it is very effective for this if a polymer having a repeating unit of a cyclopentadienyl complex is used as a base resin for a positive resist composition, especially for a chemically amplifying positive resist composition.

In addition, in order to enhance the dissolution contrast by suppressing the acid diffusion, if a polymer obtained by copolymerization of a monomer giving a repeating unit having the hydrogen atom in the carboxyl group and/or the phenolic hydroxy group therein been substituted by an acid-labile group with an olefin having a cyclopentadienyl complex was used as the base resin for a positive resist composition, especially for a chemically amplifying positive resist composition, it was found that a positive resist composition, especially a chemically amplifying positive resist composition, having an extremely high dissolution rate contrast into an alkaline solution after photo-exposure, a high suppression effect of the acid diffusion, a high resolution, and a good pattern form and a small edge roughness after exposure, suitably applicable, among others, for a VLSI manufacturing or as a fine patterning material for a photo mask could be obtained. Based on this finding, the present invention could be completed.

Hereinafter, the present invention will be explained further in more detail.

The positive resist composition of the present invention is a positive resist composition containing as a base resin a polymer compound having the weight-average molecular weight in the range of 1,000 to 500,000 and comprising a repeating unit having a hydrogen atom in a carboxyl group and/or in a phenolic hydroxy group therein been substituted by an acid-labile group and a repeating unit "a" having a cyclopentadienyl complex shown by the following general formula (1), (1)

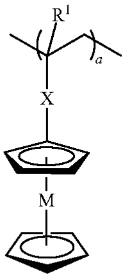

wherein $R^1$ represents a hydrogen atom or a methyl group; X represents a single bond, a methylene group, —C(═O)—O—$R^2$—, —O—$R^2$—, —O—C(═O)—$R^2$—, or —Ar—$R^2$—; and M represents Fe, Co, Ni, Cr, or Ru. Ar represents a phenylene group or a naphthylene group. $R^2$ are the same or different, representing a single bond, or a linear, a branched, or a cyclic alkylene group having 1 to 6 carbon atoms, an arylene group having 6 to 10 carbon atoms, or an alkenylene group having 2 to 10 carbon atoms, wherein $R^2$ may optionally contain an ester group or an ether group.

In this case, especially the base resin is preferably the polymer having the weight-average molecular weight of 1,000 to 500,000 and shown by the following general formula (2) that is a copolymer comprising at least a repeating unit shown by the following general formula (a) and a repeating unit shown by the following general formula (b1) and/or (b2), (2)

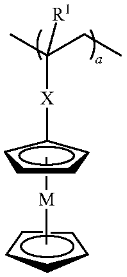

(a)

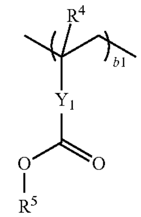

(b1)

-continued

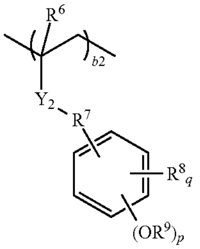

(b2)

wherein $R^1$, X, and M represent the same meanings as before. $R^4$ and $R^6$ represent a hydrogen atom or a methyl group; and $R^5$ and $R^9$ represent an acid-labile group. $R^7$ represents a single bond, or a linear or a branched alkylene group having 1 to 6 carbon atoms; $R^8$ represents a hydrogen atom, a fluorine atom, a trifluoromethyl group, a cyano group, or a linear, a branched, or a cyclic alkyl group having 1 to 6 carbon atoms; "p" represents 1 or 2; and "q" represents in integer of 0 to 4. $Y_1$ represents a single bond, a connecting group having 1 to 12 carbon atoms which has an ester group, an ether group, or a lactone ring, a phenylene group, or a naphthylene group. $Y_2$ represents a single bond, —C(═O)—O—, or —C(═O)—NH—; and $0<a<1.0$, $0\leq b2<1.0$, $0\leq b2<1.0$, $0<b1+b2<1.0$, and $0.1\leq a+b1+b2\leq 1.0$.

Specific example of the olefin having the cyclopentadienyl complex shown by the general formula (a) includes the following compounds,

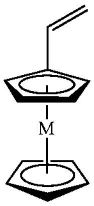
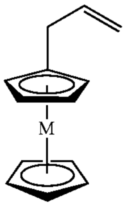
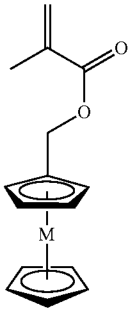
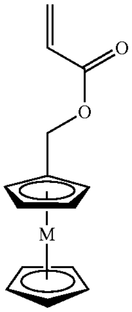

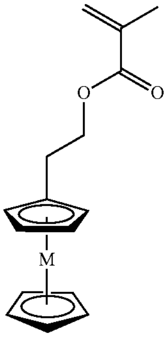
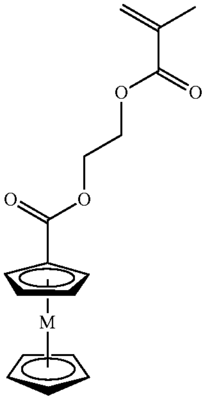

-continued

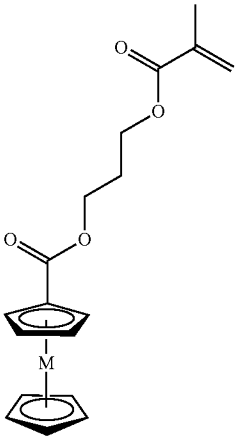
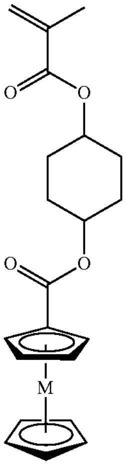
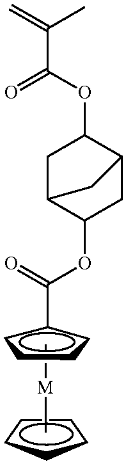

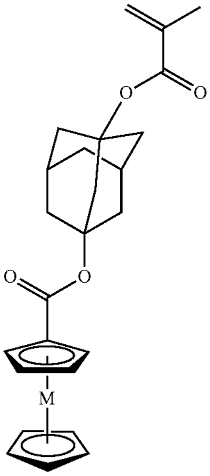
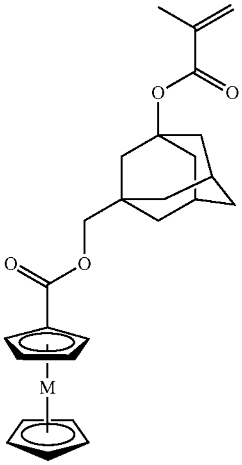

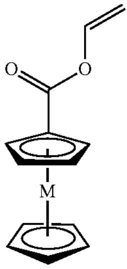
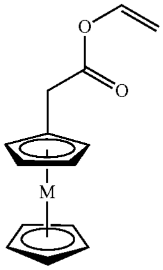
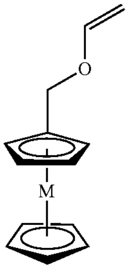

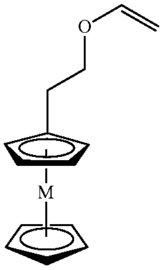
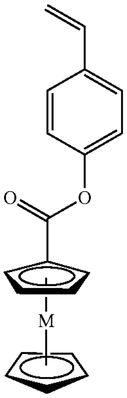
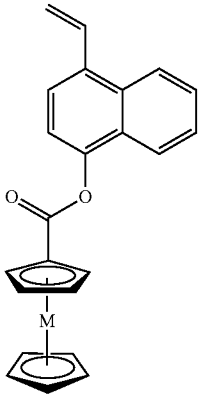

-continued

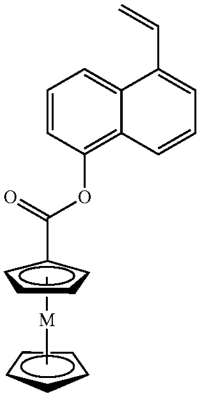
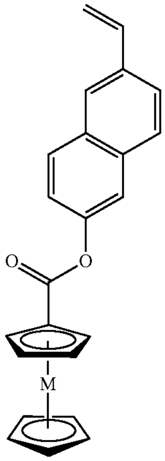
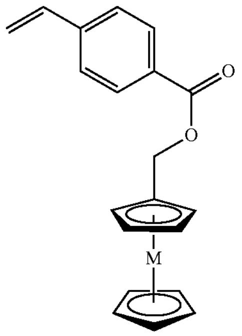
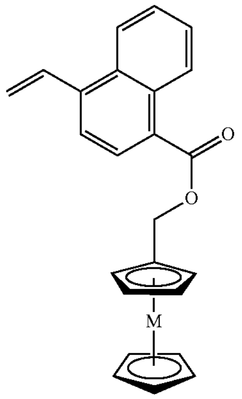
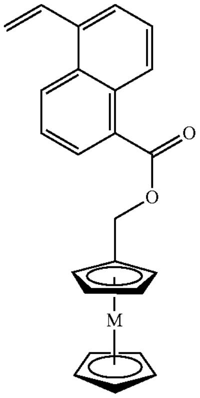
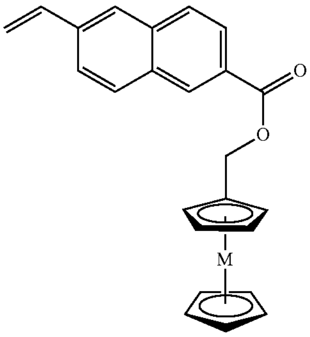
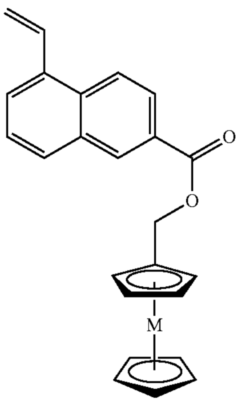
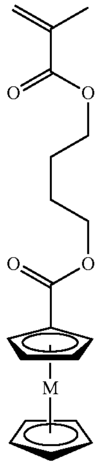
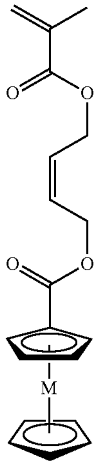

-continued

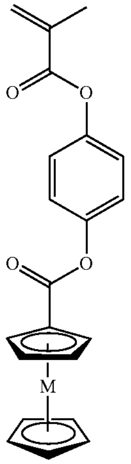
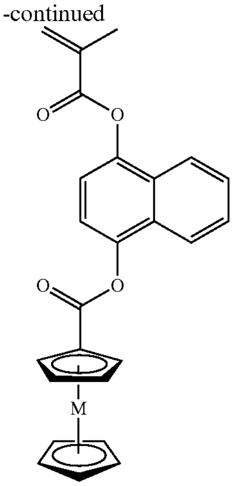
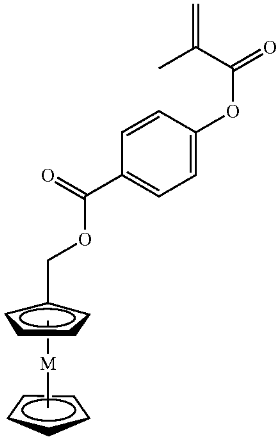
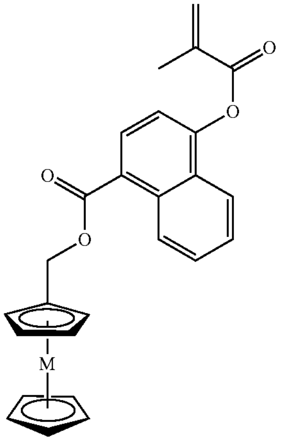
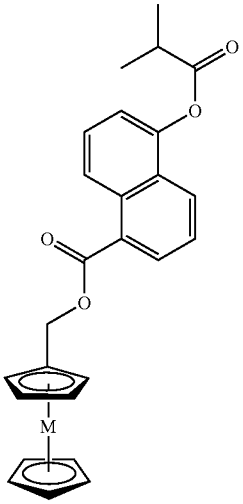
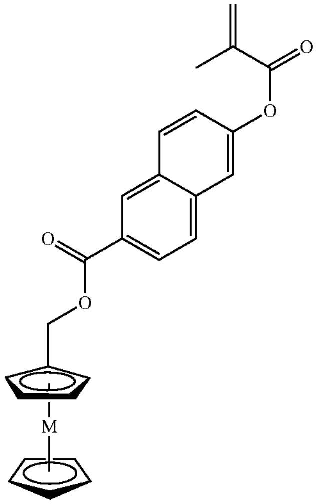

wherein M represents the same meaning as before.

To have the cyclopentadienyl complex contained therein, as shown in the present invention, it is preferable to copolymerize a cyclopentadienyl complex having a polymerizable olefin with a monomer having an acid-labile group and an adhesive group. In the Japanese Patent Laid-Open Publication No. 2001-66767, a method wherein a cyclopentadienyl complex is blended is shown; but, in the case of blending, the acid diffusion becomes so large that there may occur deterioration of the resolution in a certain instance.

Specific examples of the monomers Mb1 and Mb2 to obtain the repeating units (b1) and (b2) having the hydrogen atom in the carboxyl group and/or the phenolic hydroxy group in the general formula (2) been substituted by an acid-labile group are shown below, Mb1

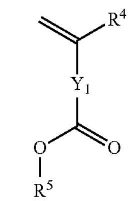

Mb2

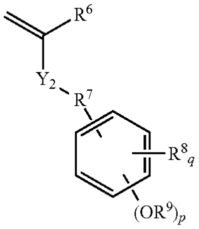

wherein $R^4$ to $R^9$, $Y_1$, $Y_2$, “p”, and “q” represent the same meanings as before.

In this case, an example of the connecting group $Y_1$ having a lactone ring with 1 to 12 carbon atoms can be shown below.

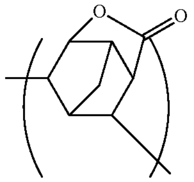

Specific example of the monomer Mb1 to obtain the repeating unit (b1) includes the following compounds,

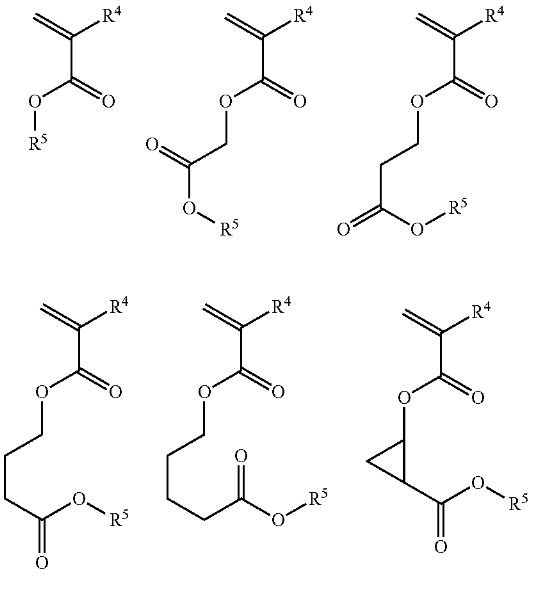

-continued

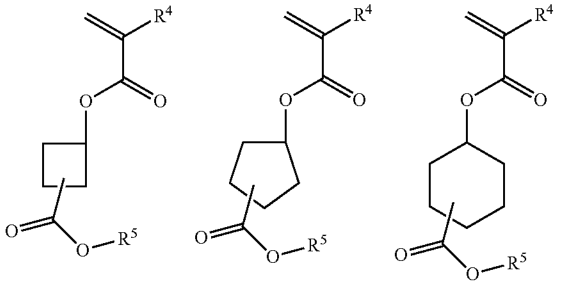

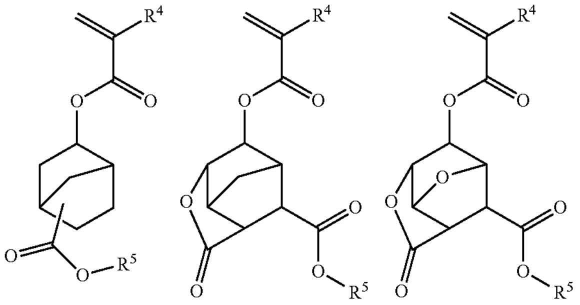

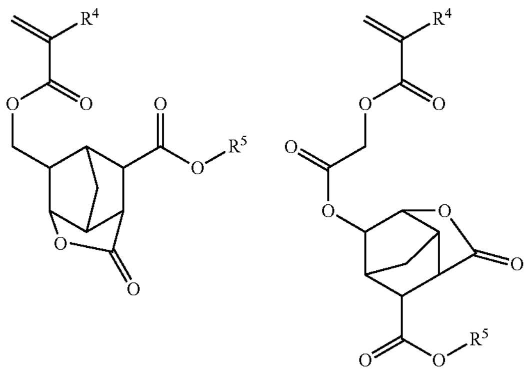

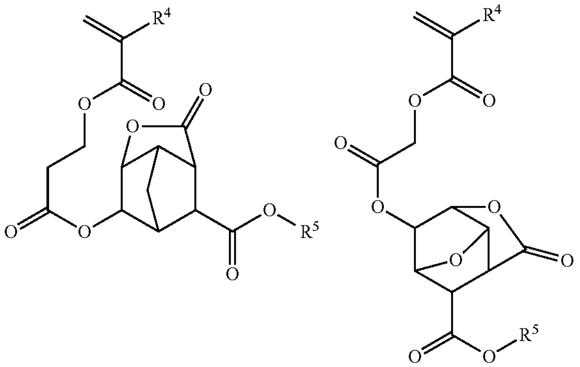

-continued
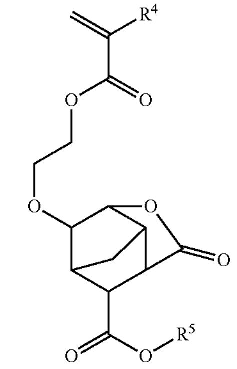
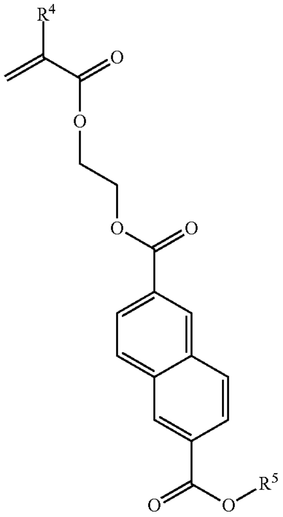
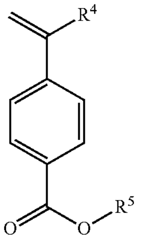
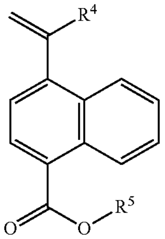
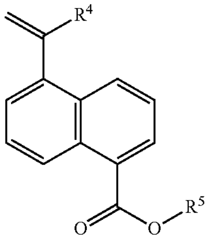
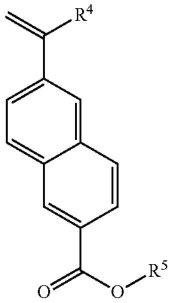
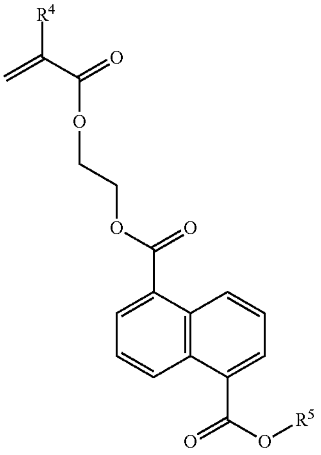
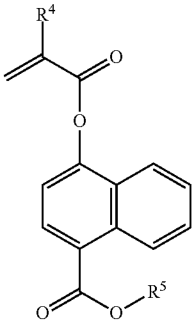
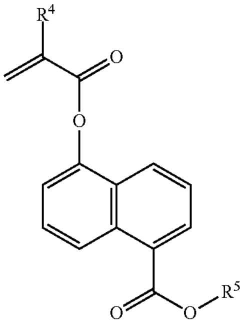
-continued
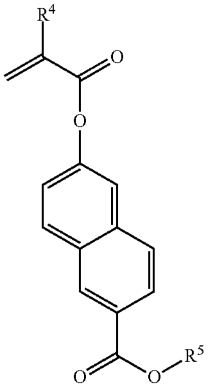
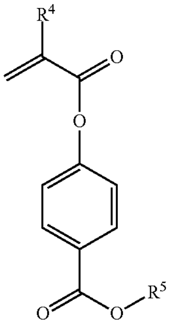
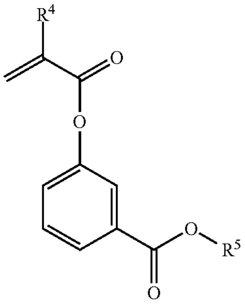
wherein $R^4$ and $R^5$ represent the same meanings as before.
Specific example of the monomer Mb2 to obtain the repeating unit (b2) includes the following compounds.
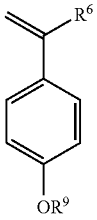
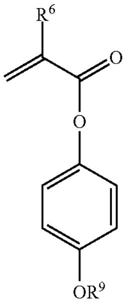
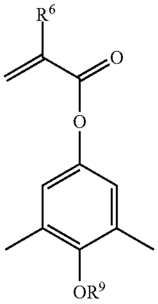
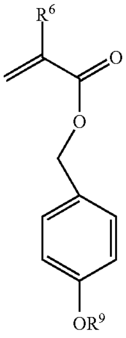
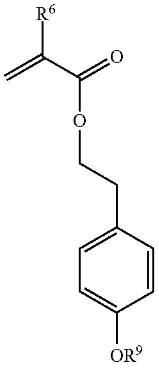
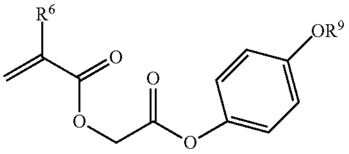

-continued

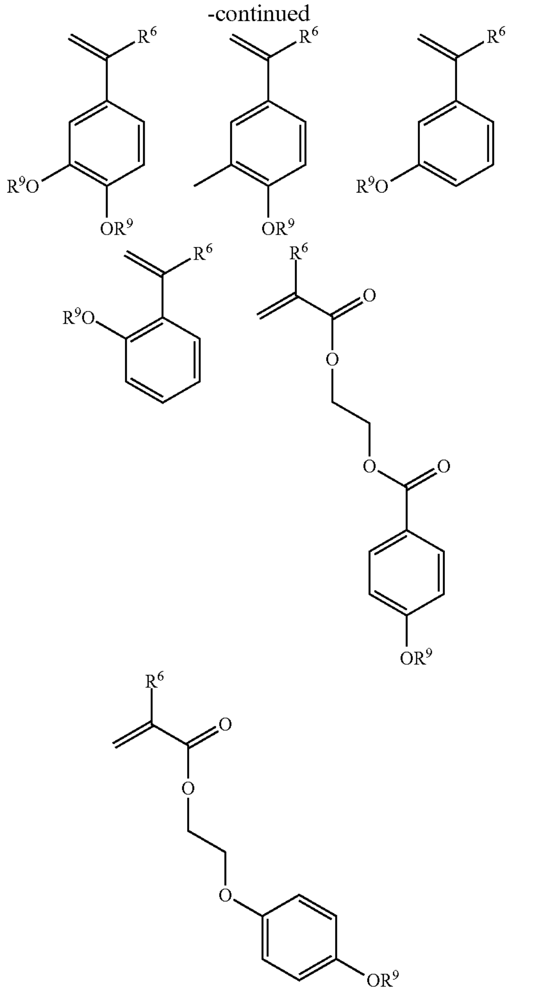

Wherein $R^6$ and $R^9$ represent the same meanings as before.

The acid-labile group (acid-labile groups shown by $R^5$ and $R^9$ in the general formula (2)) may be selected optionally, wherein they may be the same or different with each other, and especially the groups substituted by the following formulae (A-1) to (A-3) may be mentioned.

(A-1)

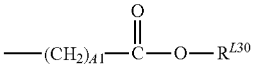

(A-2)

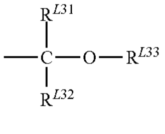

(A-3)

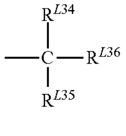

In the formula (A-1), $R^{L30}$ represents a tertiary alkyl group having 4 to 20, preferably 4 to 15 carbon atoms, wherein each alkyl group represents a trialkylsilyl group having 1 to 6 carbon atoms, an oxoalkyl group having 4 to 20 carbon atoms, or a group shown by the above general formula (A-3), wherein specific example of the tertiary alkyl group includes a tert-butyl group, a tert-amyl group, a 1,1-diethylpropyl group, a 1-ethylcyclopentyl group, a 1-butylcyclopentyl group, a 1-ethylcyclohexyl group, a 1-butylcyclohexyl group, a 1-ethyl-2-cyclopentenyl group, a 1-ethyl-2-cyclohexenyl group, and a 2-methyl-2-adamantyl group; specific example of the trialkylsilyl group includes a trimethylsilyl group, a triethylsilyl group, and a dimethyl-tert-butylsilyl group; and specific example of the oxoalkyl group includes a 3-oxocyclohexyl group, a 4-methyl-2-oxooxane-4-yl group, and a 5-methyl-2-oxooxolane-5-yl group. A1 represents an integer of 0 to 6.

In the formula (A-2), $R^{L31}$ and $R^{L32}$ represent a hydrogen atom, or a linear, a branched, or a cyclic alkyl group having 1 to 18, preferably 1 to 10 carbon atoms, wherein specific example thereof includes a methyl group, an ethyl group, a propyl group, an isopropyl group, a n-butyl group, a sec-butyl group, a tert-butyl group, a cyclopentyl group, a cyclohexyl group, a 2-ethylhexyl group, and a n-octyl group. $R^{L33}$ represents a monovalent hydrocarbon group having 1 to 18, preferably 1 to 10, carbon atoms which may optionally contain a heteroatom such as an oxygen atom, wherein illustrative example thereof includes a linear, a branched, or a cyclic alkyl group including those having a part of the hydrogen atoms therein substituted with a hydroxy group, an alkoxy group, an oxo group, an amino group, an alkylamino group, or the like. Specific example thereof includes the following substituted alkyl groups.

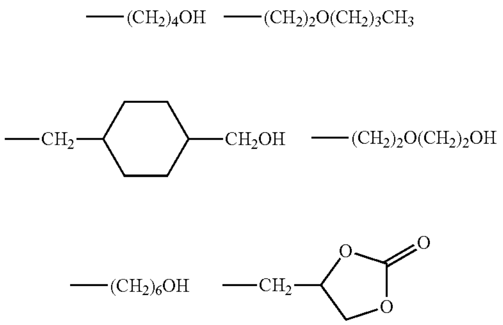

$R^{L31}$ and $R^{L32}$, $R^{L31}$ and $R^{L33}$ and $R^{L32}$ and $R^{L33}$ may be bonded to form a ring together with the carbon atoms to which these groups are bonded; and in the case of forming the ring, each of $R^{L31}$, $R^{L32}$ and $R^{L33}$ which involve in formation of the ring represents a linear or a branched alkylene group having 1 to 18, preferably 1 to 10 carbon atoms, wherein the carbon number in the ring is preferably in the range of 3 to 10, in particular in the range of 4 to 10.

Specific example of the acid-labile group in the general formula (A-1) includes a tert-butoxycarbonyl group, a tert-butoxycarbonylmethyl group, a tert-amyloxycarbonyl group, a tert-amyloxycarbonylmethyl group, a 1,1-diethylpropyloxycarbonyl group, a 1,1-diethylpropyloxycarbonylmethyl group, a 1-ethylcyclopentyloxycarbonyl group, a 1-ethylcyclopentyloxycarbonylmethyl group, a 1-ethyl-2-cyclopentenyloxycarbonyl group, a 1-ethyl-2-cyclopentenyloxycarbonylmethyl group, a 1-ethoxyethoxycarbonylmethyl group, a 2-tetrahydropyranyloxycarbonylmethyl group, and a 2-tetrahydrofuranyloxycarbonylmethyl group.

In addition, substituent groups shown by the following formulae (A-1)-1 to (A-1)-10 may be mentioned.

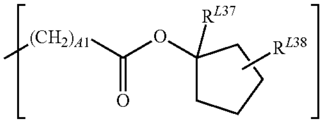

(A-1)-1

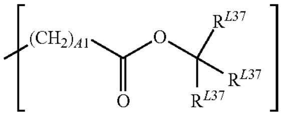

(A-1)-2

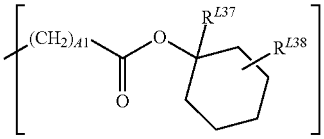

(A-1)-3

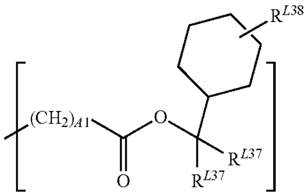

(A-1)-4

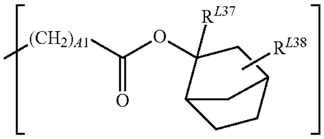

(A-1)-5

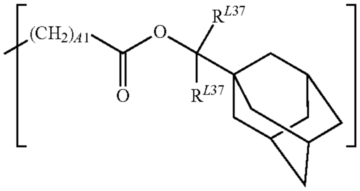

(A-1)-6

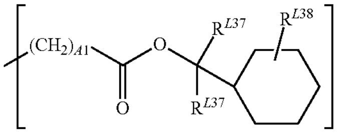

(A-1)-7

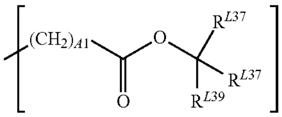

(A-1)-8

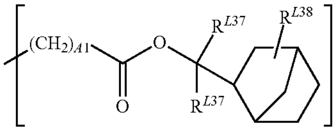

(A-1)-9

-continued

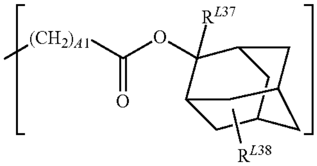

(A-1)-10

Here, $R^{L37}$ are the same or different with each other, representing a linear, a branched, or a cyclic alkyl group having 1 to 10 carbon atoms, or an aryl group having 6 to 20 carbon atoms; and $R^{L38}$ represents a hydrogen atom, or a liner, a branched, or a cyclic alkyl group having 1 to 10 carbon atoms.

$R^{L39}$ are the same or different with each other, representing a linear, a branched, or a cyclic alkyl group having 2 to 10 carbon atoms, or an aryl group having 6 to 20 carbon atoms.

A1 represents the same meaning as before.

Illustrative example of the linear or the branched acid-labile group among those shown by the formula (A-2) includes the following (A-2)-1 to (A-2)-69.

$$-CH_2-O-CH_3$$ (A-2)-1

$$-CH_2-O-CH_2-CH_3$$ (A-2)-2

$$-CH_2-O-(CH_2)_2-CH_3$$ (A-2)-3

$$-CH_2-O-(CH_2)_3-CH_3$$ (A-2)-4

$$-CH_2-O-\overset{CH_3}{\overset{|}{CH}}-CH_3$$ (A-2)-5

$$-CH_2-O-\underset{CH_3}{\underset{|}{\overset{CH_3}{\overset{|}{C}}}}-CH_3$$ (A-2)-6

$$-\overset{CH_3}{\overset{|}{CH}}-O-CH_3$$ (A-2)-7

$$-\overset{CH_3}{\overset{|}{\overset{CH_2}{\overset{|}{CH}}}}-O-CH_3$$ (A-2)-8

$$-\overset{CH_3}{\overset{|}{\overset{(CH_2)_2}{\overset{|}{CH}}}}-O-CH_3$$ (A-2)-9

$$-\overset{CH_3}{\overset{|}{CH}}-O-CH_2-CH_3$$ (A-2)-10

$$-\overset{CH_3}{\overset{|}{\overset{CH_2}{\overset{|}{CH}}}}-O-CH_2-CH_3$$ (A-2)-11

$$-\overset{CH_3}{\overset{|}{\overset{(CH_2)_2}{\overset{|}{CH}}}}-O-CH_2-CH_3$$ (A-2)12

-continued
(A-2)-13
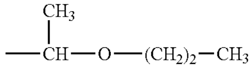
(A-2)-14
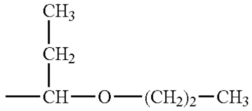
(A-2)-15
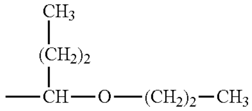
(A-2)-16
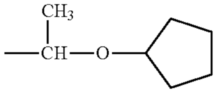
(A-2)-17
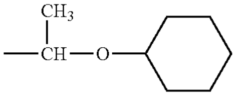
(A-2)-18
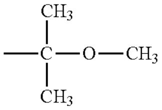
(A-2)-19
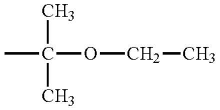
(A-2)-20
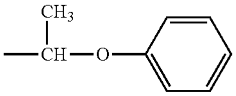
(A-2)-21
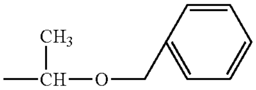
(A-2)-22
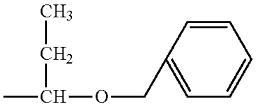
(A-2)-23
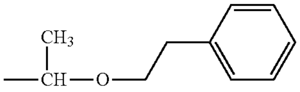
(A-2)-24
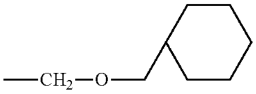
(A-2)-25
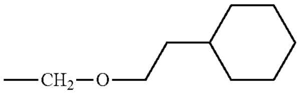
(A-2)-26
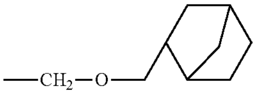
-continued
(A-2)-27
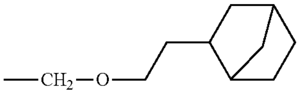
(A-2)-28
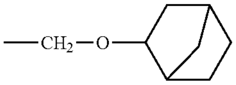
(A-2)-29
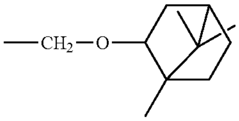
(A-2)-30
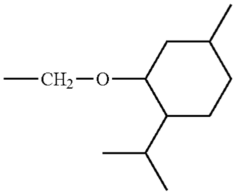
(A-2)-31
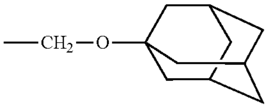
(A-2)-32
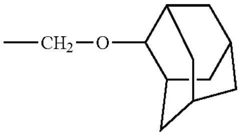
(A-2)-33
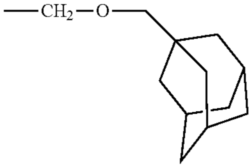
(A-2)-34
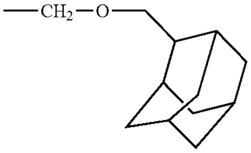
(A-2)-35
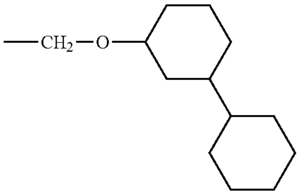
(A-2)-36
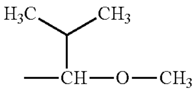
(A-2)-37
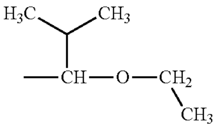

-continued
(A-2)-38
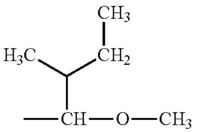
(A-2)-39
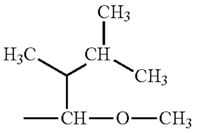
(A-2)-40
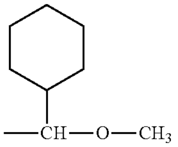
(A-2)-41
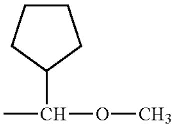
(A-2)-42
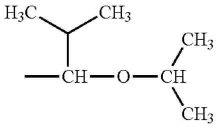
(A-2)-43
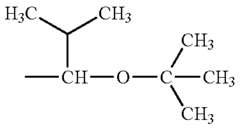
(A-2)-44
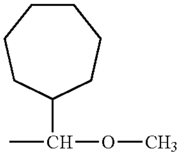
(A-2)-45
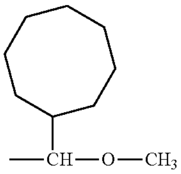
(A-2)-46
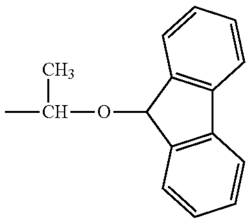
-continued
(A-2)-47
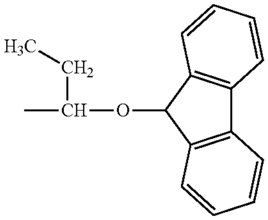
(A-2)-48
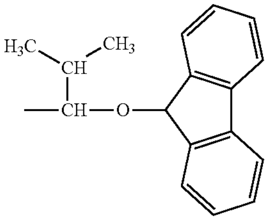
(A-2)-49
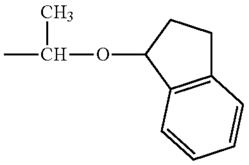
(A-2)-50
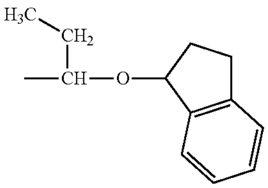
(A-2)-51
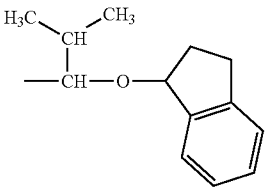
(A-2)-52
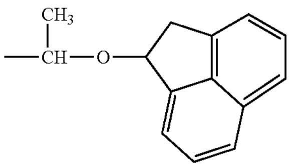
(A-2)-53
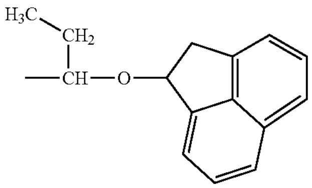
(A-2)-54
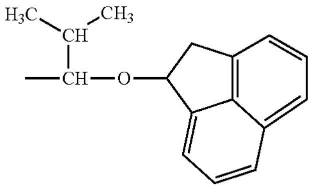

-continued (A-2)-55

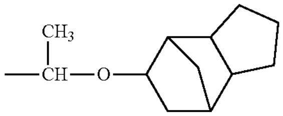

(A-2)-56

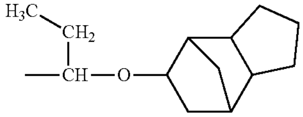

(A-2)-57

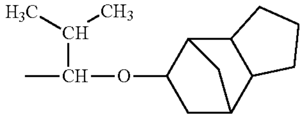

(A-2)-58

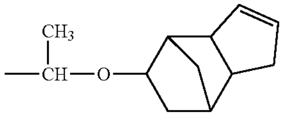

(A-2)-59

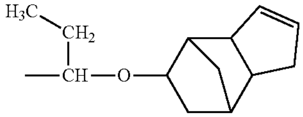

(A-2)-60

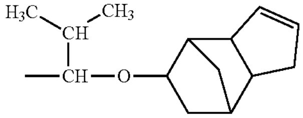

(A-2)-61

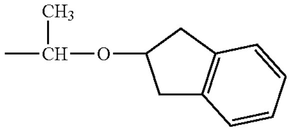

(A-2)-62

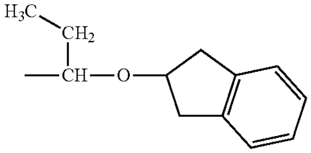

(A-2)-63

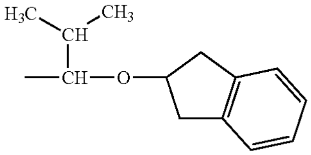

(A-2)-64

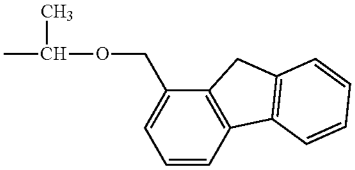

(A-2)-65

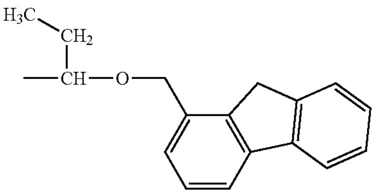

-continued (A-2)-66

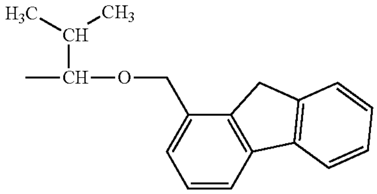

(A-2)-67

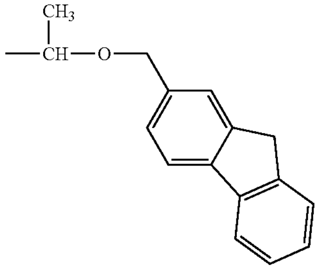

(A-2)-68

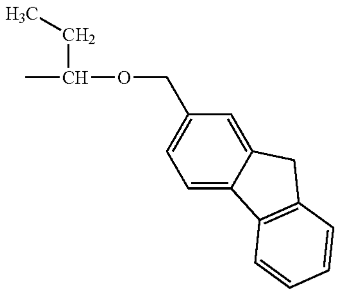

(A-2)-69

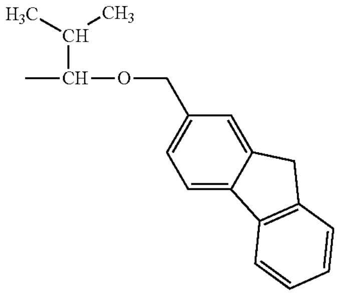

Illustrative example of the cyclic acid-labile group among those shown by the formula (A-2) includes a tetrahydrofuran-2-yl group, a 2-methyltetrahydrofuran-2-yl group, a tetrahydropyran-2-yl group, and a 2-methyltetrahydropyran-2-yl group.

Further, the base resin may be crosslinked intermolecularly or intramolecularly by the acid-labile group shown by the following general formula (A-2a) or (A-2b).

(A-2a)

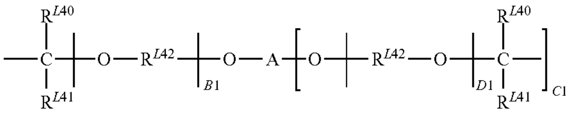

(A-2b)

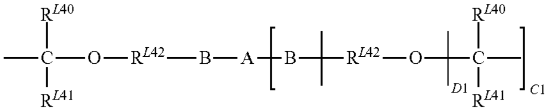

In these formulae, $R^{L40}$ and $R^{L41}$ represent a hydrogen atom, or a linear, a branched, or a cyclic alkyl group having 1 to 8 carbon atoms. Alternatively, $R^{L40}$ and $R^{L41}$ may be bonded to form a ring together with the carbon atoms to which these groups are bonded; and in the case of forming the ring, $R^{L40}$ and $R^{L41}$ represent a linear or a branched alkylene group having 1 to 8 carbon atoms. $R^{L42}$ represents a linear, a branched, or a cyclic alkylene group having 1 to 10 carbon atoms; B1 and D1 represent 0 or an integer of 1 to 10, or preferably 0 or an integer of 1 to 5; and C1 represents an integer of 1 to 7. “A” represents an aliphatic or an alicyclic hydrocarbon group, an aromatic hydrocarbon group, or a heterocyclic group having 1 to 50 carbon atoms with the valency of (C1+1) wherein these groups may be intervened by a heteroatom, or a part of the hydrogen atoms bonded to the carbon atom thereof may be substituted by a hydroxy group, a carboxyl group, a carbonyl group, or a fluorine atom. “B” represents —CO—O—, —NHCO—O—, or —NH-CONH—.

In this case, “A” is preferably a linear, a branched, or a cyclic alkylene group, an alkyltriyl group, an alkyltetrayl group having 2 to 4 valency and 1 to 20 carbon atoms, or an arylene group having 6 to 30 carbon atoms, wherein these groups may be intervened by a heteroatom, and a part of the hydrogen atoms bonded to the carbon atom thereof may be substituted by a hydroxy group, a carboxyl group, an acyl group, or a halogen atom. C1 represents preferably an integer of 1 to 3.

Specific example of the crosslinking acetal group shown by the general formulae (A-2a) and (A-2b) includes the following formulae (A-2)-70 to (A-2)-77.

(A-2)-70

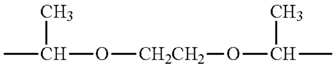

(A-2)-71

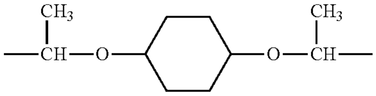

(A-2)-72

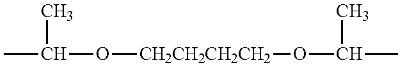

(A-2)-73

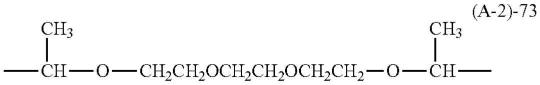

-continued (A-2)-74

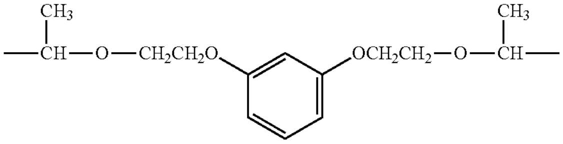

(A-2)-75

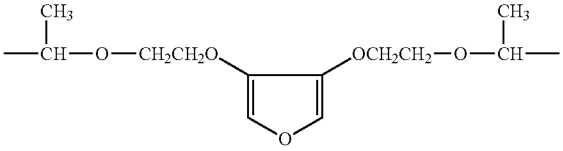

(A-2)-76

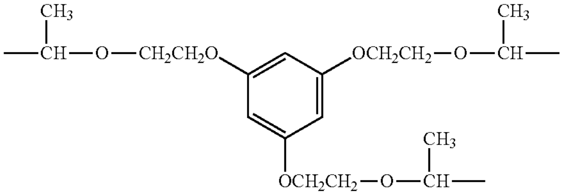

(A-2)-77

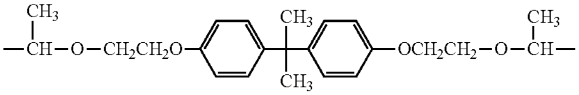

Next, in the formula (A-3), $R^{L34}$, $R^{L35}$, and $R^{L36}$ represent a monovalent hydrocarbon group such as a linear, a branched, or a cyclic alkyl group having 1 to 20 carbon atoms, or a linear, a branched, or a cyclic alkenyl group having 2 to 20 carbon atoms, wherein these may optionally contain heteroatoms such as an oxygen atom, a sulfur atom, a nitrogen atom, and a fluorine atom; and further $R^{L34}$ and $R^{L35}$, $R^{L34}$ and $R^{L36}$, and $R^{L35}$ and $R^{L36}$ may be bonded with each other to form an aliphatic ring having 3 to 20 carbon atoms together with the carbon atoms to which these groups are bonded.

Illustrative example of the tertiary alkyl group shown in the formula (A-3) includes a tert-butyl group, a triethylcarbyl group, a 1-ethylnorbornyl group, a 1-methylcyclohexyl group, a 1-ethylcyclopentyl group, a 2-(2-methyl)adamantly group, a 2-(2-ethyl)adamantly group, and a tert-amyl group.

Alternatively, specific example of the tertiary alkyl group includes the following formulae (A-3)-1 to (A-3)-18.
(A-3)-1
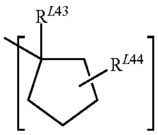
(A-3)-2
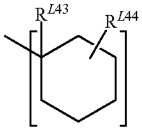
(A-3)-3
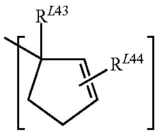
(A-3)-4
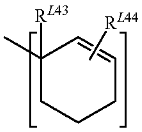
(A-3)-5
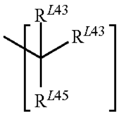
(A-3)-6
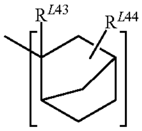
(A-3)-7
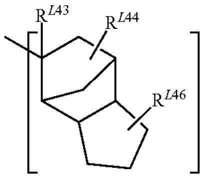
(A-3)-8
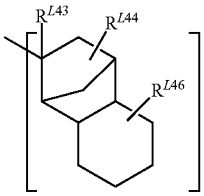
(A-3)-9
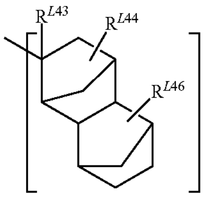
-continued
(A-3)-10
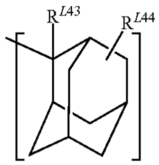
(A-3)-11
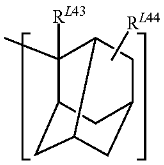
(A-3)-12
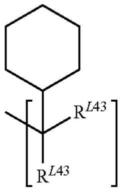
(A-3)-13
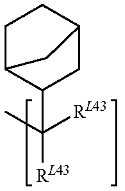
(A-3)-14
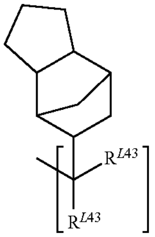
(A-3)-15
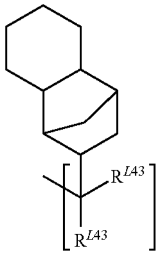
(A-3)-16
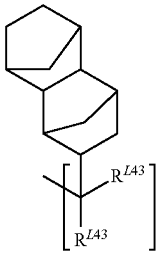

-continued (A-3)-17

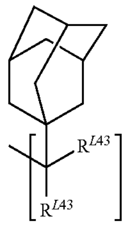

(A-3)-18

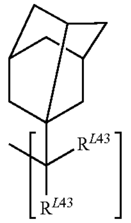

In the formulae (A-3)-1 to (A-3)-18, $R^{L43}$ are the same or different, representing a linear, a branched, or a cyclic alkyl group having 1 to 8 carbon atoms, or an aryl group having 6 to 20 carbon atoms such as a phenyl group. $R^{L44}$ and $R^{L46}$ represent a hydrogen atom, or a linear, a branched, or a cyclic alkyl group having 1 to 20 carbon atoms. $R^{L45}$ represents an aryl group having 6 to 20 carbon atoms such as a phenyl group.

In addition, as shown in the following formulae (A-3)-19 and (A-3)-20, the polymer may be crosslinked intramoelcularly or intermolecularly by including $R^{L47}$, which is an alkylene group or an arylene group having two or higher valency.

(A-3)-19

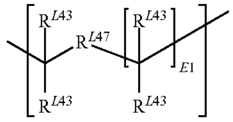

(A-3)-20

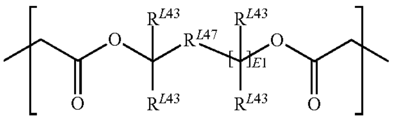

In the formulae (A-3)-19 and (A-3)-20, $R^{L43}$ represents the same meaning as before, and $R^{L47}$ represents a linear, a branched, or a cyclic alkylene group or an arylene group having 1 to 20 carbon atoms, such as a phenyl group, wherein these group may optionally contain heteroatoms such as an oxygen atom, a sulfur atom, and a nitrogen atom. E1 represents an integer of 1 to 3.

Especially as to the acid-labile group shown by the formula (A-3), a repeating unit of the (meth)acrylate ester having the exo structure shown by the following formula (A-3)-21 may be mentioned as the preferable example thereof.

(A-3)-21

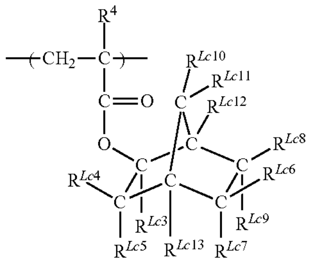

In this formula, $R^4$ represents a hydrogen atom or a methyl group; and $R^{Lc3}$ represents a linear, a branched, or a cyclic alkyl group having 1 to 8 carbon atoms, or an optionally substituted aryl group having 6 to 20 carbon atoms. Each of $R^{Lc4}$ to $R^{Lc9}$, $R^{Lc12}$, and $R^{Lc13}$ represents independently a hydrogen atom or a monovalent hydrocarbon group having 1 to 15 carbon atoms which may optionally contain a heteroatom; and $R^{Lc10}$ and $R^{Lc11}$ represent a hydrogen atom or a monovalent hydrocarbon group having 1 to 15 carbon atoms which may optionally contain a heteroatom. $R^{Lc4}$ and $R^{Lc5}$, $R^{Lc6}$ and $R^{Lc8}$, $R^{Lc6}$ and $R^{Lc9}$, $R^{Lc7}$ and $R^{Lc9}$, $R^{Lc7}$ and $R^{Lc13}$, $R^{Lc8}$ and $R^{Lc12}$, $R^{Lc10}$ and $R^{Lc11}$, or $R^{Lc11}$ and $R^{Lc12}$ may be bonded with each other to form a ring; and in this case, these groups represent a divalent hydrocarbon group having 1 to 15 carbon atoms which may optionally contain a heteroatom. Furthermore, $R^{Lc4}$ and $R^{Lc13}$, $R^{Lc10}$ and $R^{Lc13}$, or $R^{Lc6}$ and $R^{Lc8}$ may be bonded to form a double bond between the groups bonded to the nearby carbons without intervention. Note that, this formula also represents an enantiomer thereof.

Note that, an ester monomer to obtain the repeating unit having the exo structure shown by the general formula (A-3)-21 is described in the Japanese Patent Laid-Open Publication No. 2000-327633. Specific examples thereof are shown below, though not limited to them.

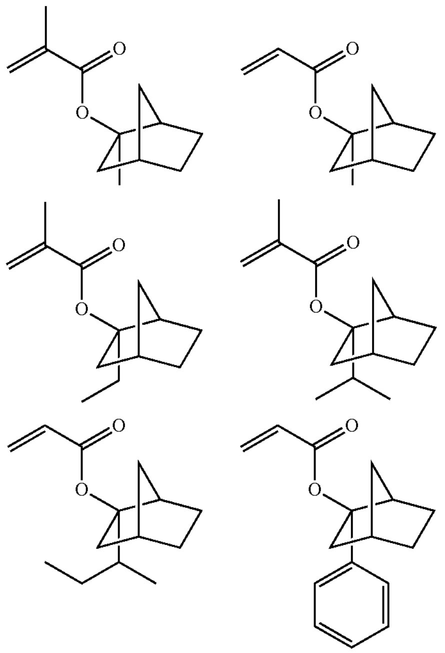

-continued

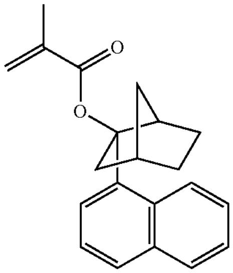
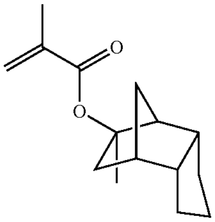
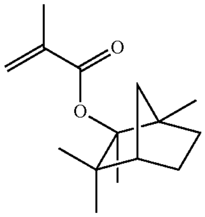
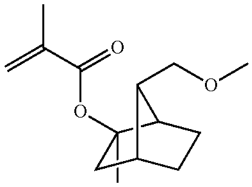
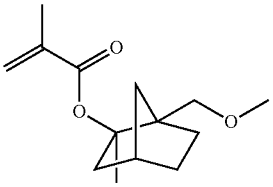
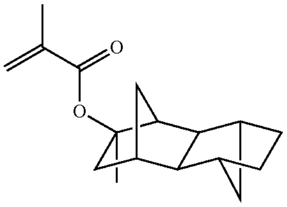
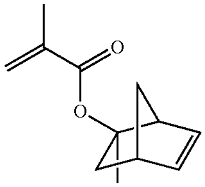
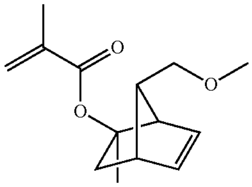
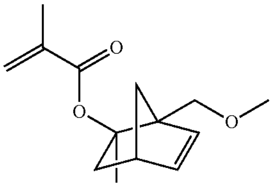
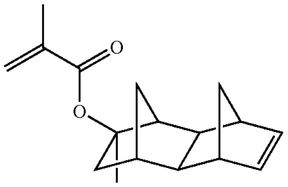
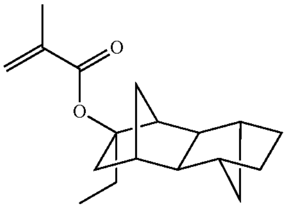
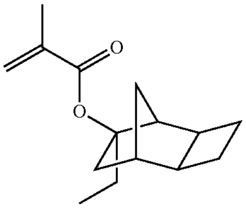
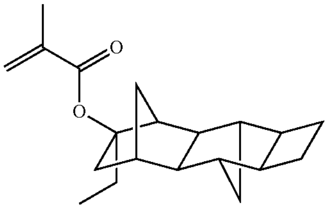

In addition, as to the acid-labile group shown by the formula (A-3), the acid-labile group of the (meth)acrylate ester having furandiyl, tetrahydrofurandiyl, or oxanorbornanediyl shown by the following formula (A-3)-22 may be mentioned.

(A-3)-22

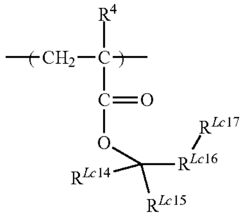

Wherein $R^4$ represents the same meaning as before. Each of $R^{Lc14}$ and $R^{Lc15}$ represents independently a linear, a branched, or a cyclic monovalent hydrocarbon group having 1 to 10 carbon atoms. $R^{Lc14}$ and $R^{Lc15}$ may be bonded with each other to form an alicyclic hydrocarbon ring together with the carbon atoms to which these groups are bonded. $R^{Lc16}$ represents a divalent group selected from furandiyl, tetrahydrofurandiyl, or oxanorbornanediyl. $R^{Lc17}$ represents a hydrogen atom, or a linear, a branched, or a cyclic monovalent hydrocarbon group having 1 to 10 carbon atoms which may optionally contain a heteroatom.

Illustrative example of the monomer to give the repeating unit substituted with the acid-labile group having furandiyl, tetrahydrofurandiyl, or oxanorbornanediyl includes the following compounds. Note that, Ac means an acetyl group, and Me means a methyl group.

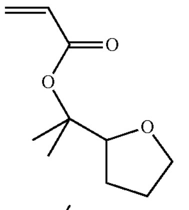
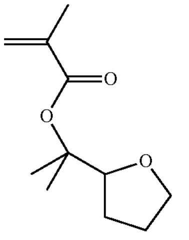
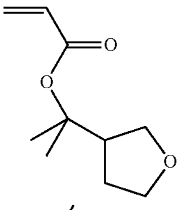
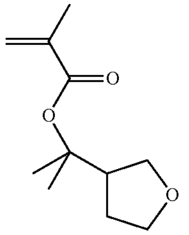
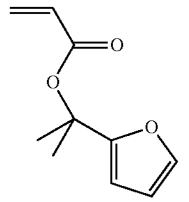
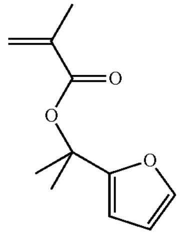
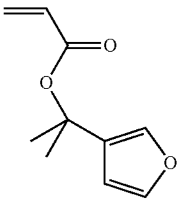
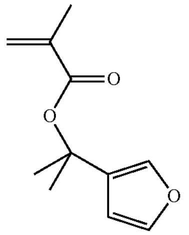
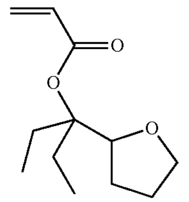
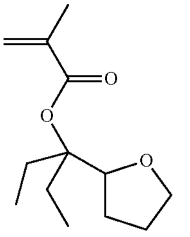
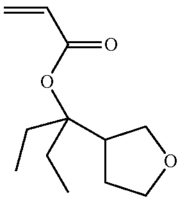
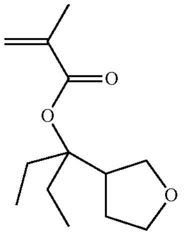

-continued
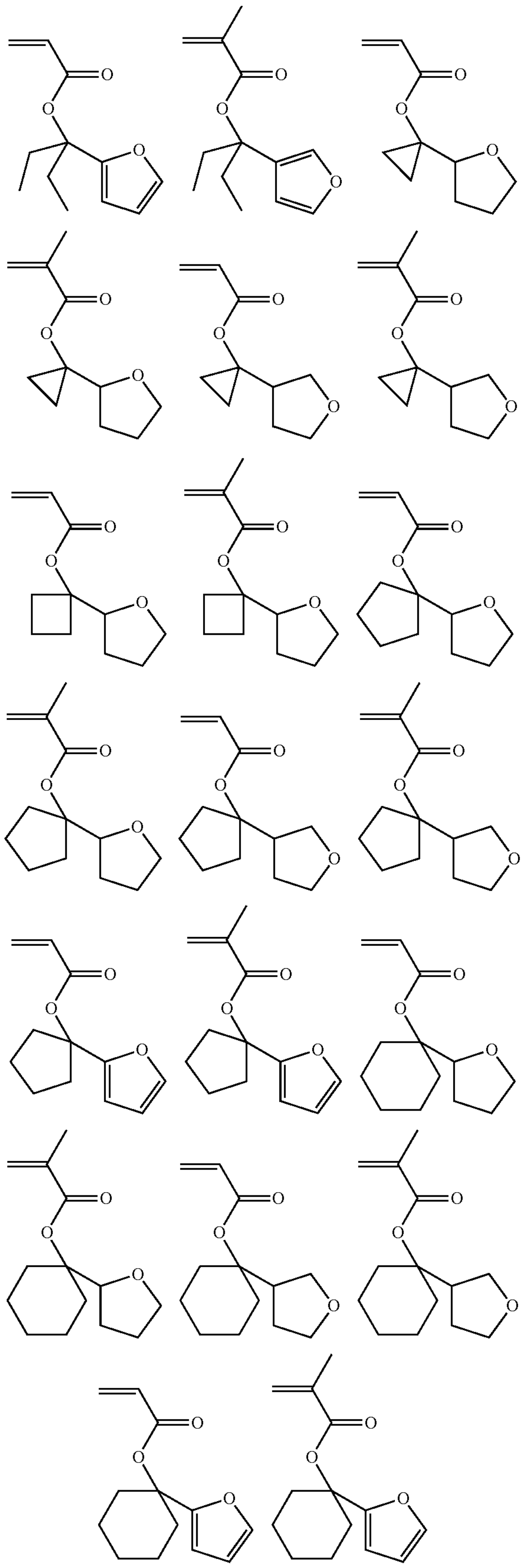
-continued
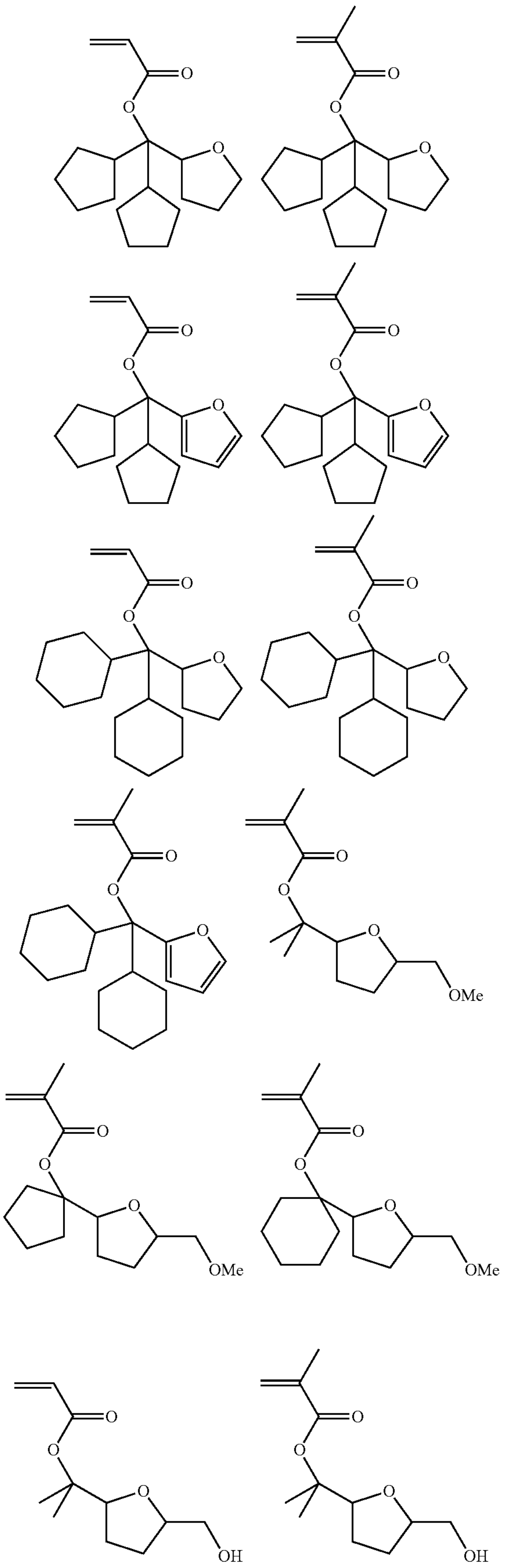

-continued
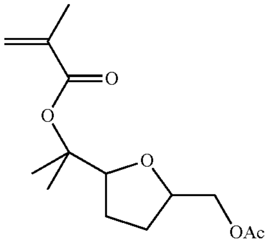
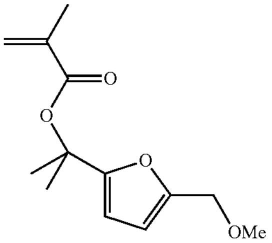
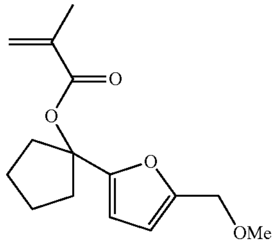
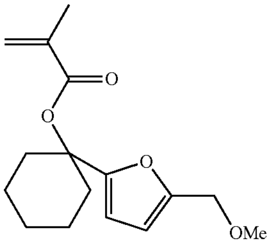
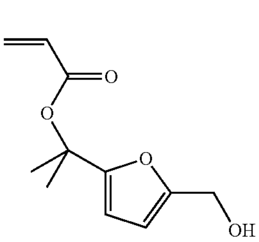
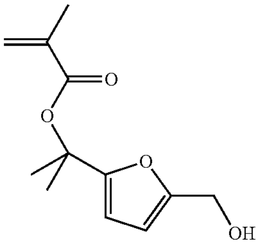
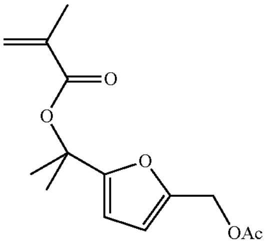
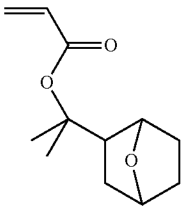
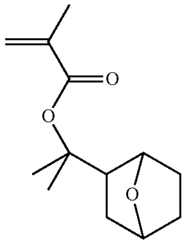
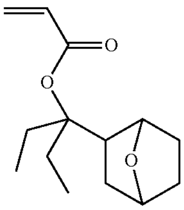
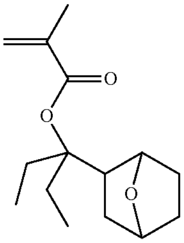
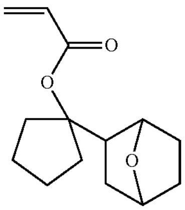
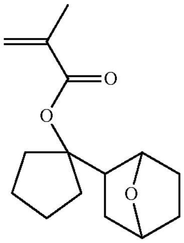
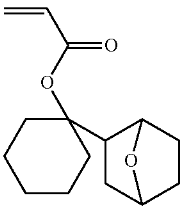
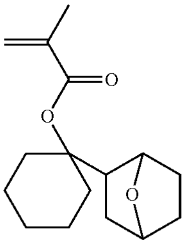
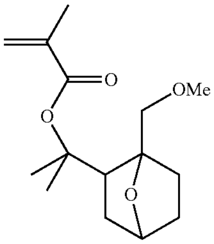
-continued
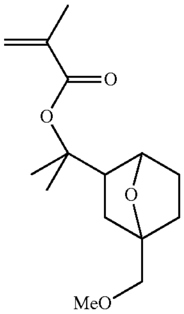
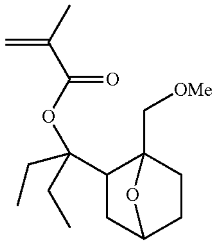
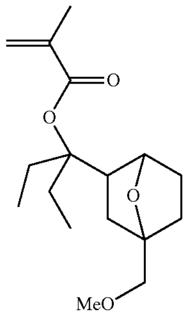
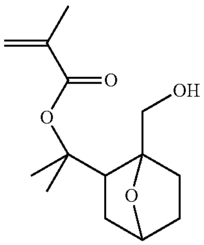
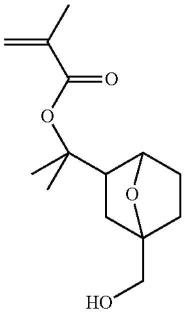
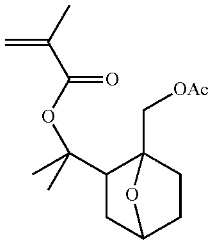
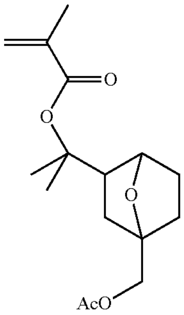
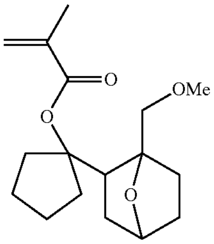
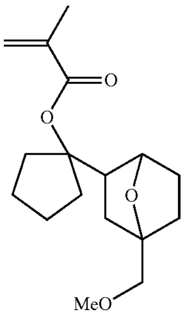
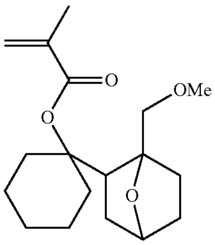

-continued

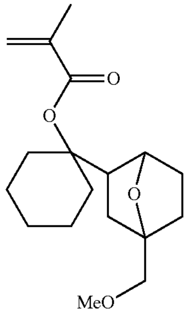

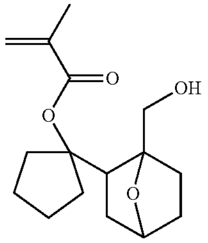

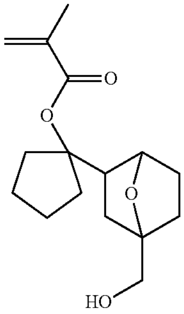

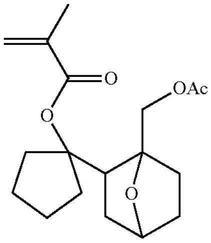

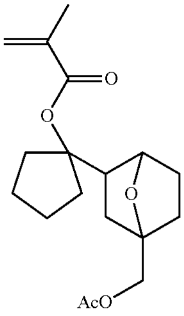

Alternatively, $R^5$ in the repeating unit shown by the general formula (b1) may be the acid-labile group shown by the following general formula (A-3)-23, (A-3)-23

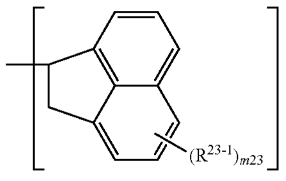

wherein $R^{23-1}$ represents a hydrogen atom, an alkyl group, an alkoxy group, an alkanoyl group, an alkoxycarbonyl group having 1 to 4 carbon atoms, an aryl group having 6 to 10 carbon atoms, a halogen atom, or a cyano group; and m23 represents an integer of 1 to 4.

Specific example of the monomer to obtain the repeating unit (b1) in which $R^5$ in the general formula (b1) is the acid-labile group shown by the general formula (A-3)-23 includes the following compounds.

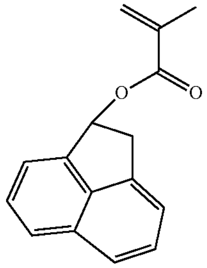

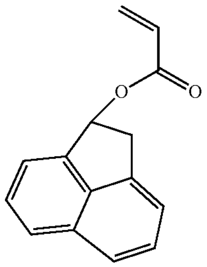

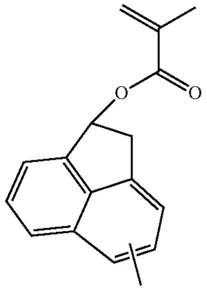

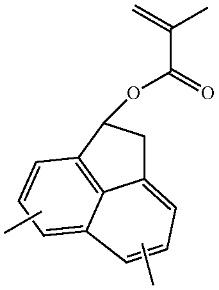

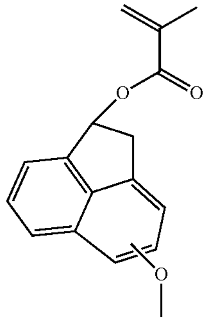

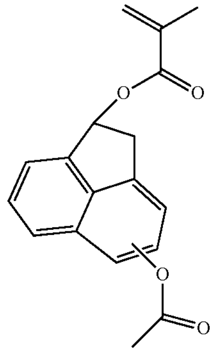

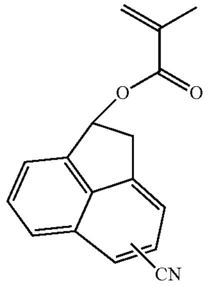

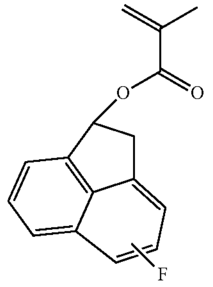

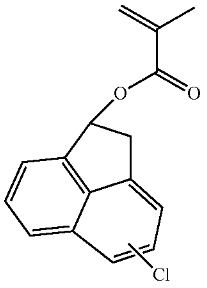

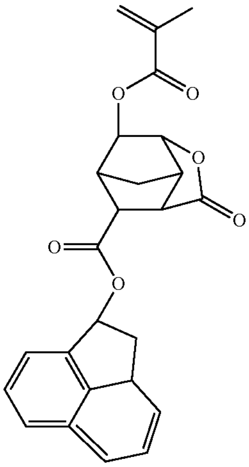

-continued

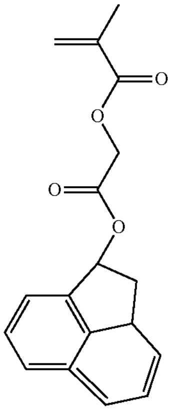

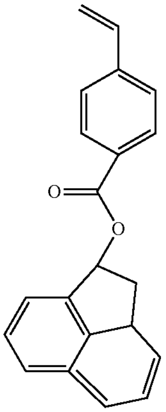

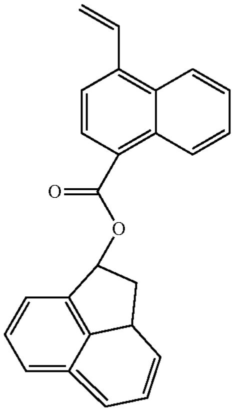

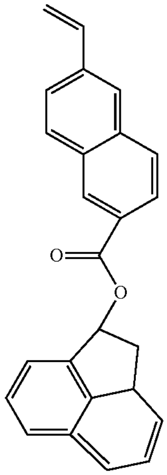

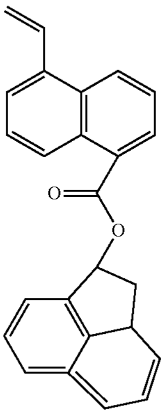

Alternatively, $R^5$ in the repeating unit shown by the general formula (b1) may be the acid-labile group shown by the following general formula (A-3)-24, (A-3)-24

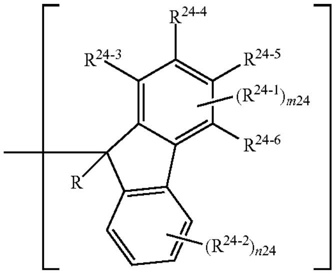

wherein $R^{24-1}$ and $R^{24-2}$ represent a hydrogen atom, an alkyl group, an alkoxy group, an alkanoyl group, an alkoxycarbonyl group having 1 to 4 carbon atoms, a hydroxy group, an aryl group having 6 to 10 carbon atoms, a halogen atom, or a cyano group. R represents a hydrogen atom, or a linear, a branched, or a cyclic alkyl group having 1 to 12 carbon atoms which may optionally contain an oxygen atom or a sulfur atom, an alkenyl group having 2 to 12 carbon atoms, an alkynyl group having 2 to 12 carbon atoms, or an aryl group having 6 to 10 carbon atoms. $R^{24-3}$, $R^{24-4}$, $R^{24-5}$, and $R^{24-6}$ represent a hydrogen atom; or $R^{24-3}$ and $R^{24-4}$, $R^{24-4}$ and $R^{24-5}$, and $R^{24-6}$ may be bonded to form a benzene ring; and m24 and n24 represents an integer of 1 to 4.

Specific example of the monomer to obtain the repeating unit (b1) in which $R^5$ in the general formula (b1) is the acid-labile group shown by the general formula (A-3)-24 includes the following compounds.

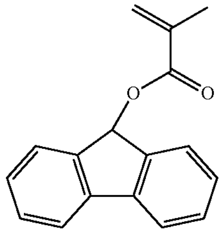

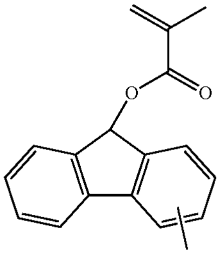

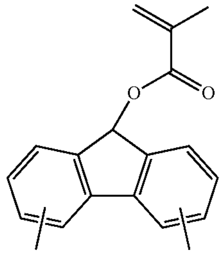

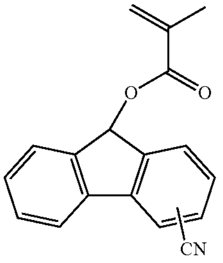

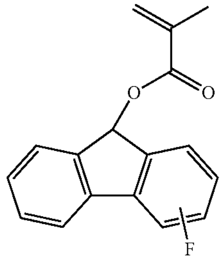

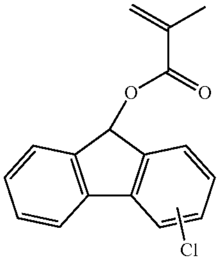

-continued
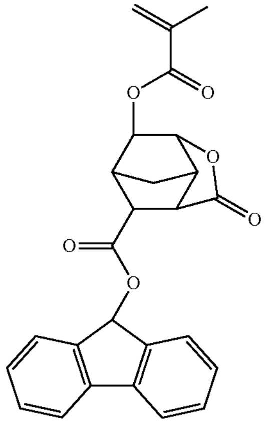
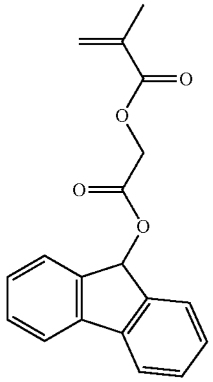
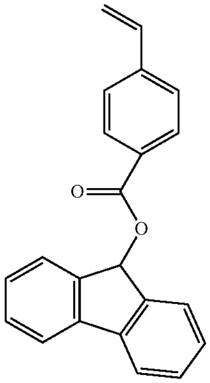
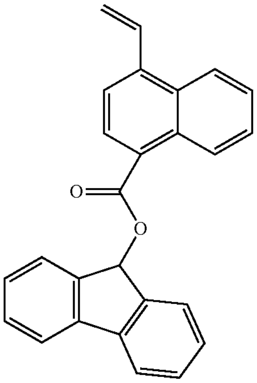
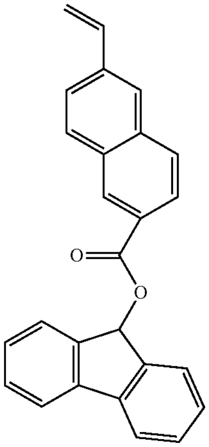
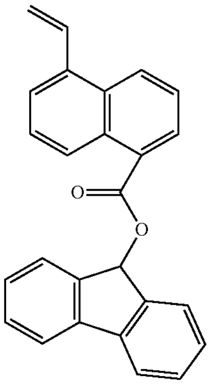
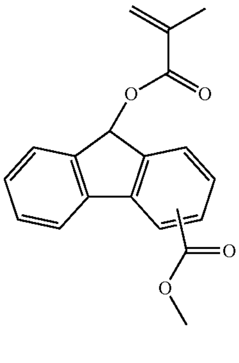
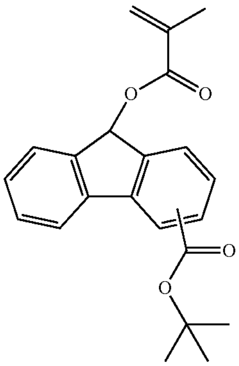
-continued
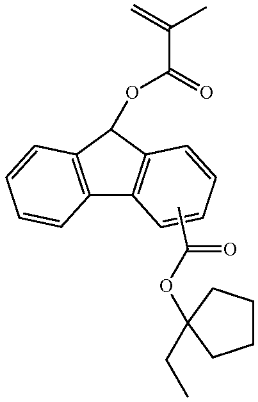
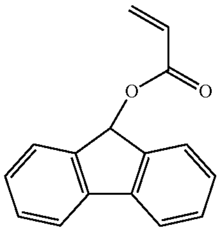
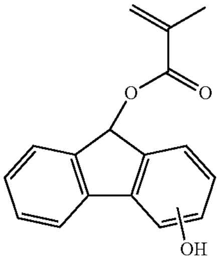
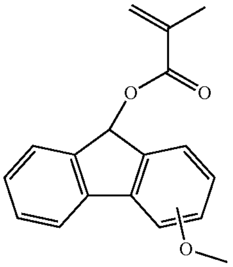
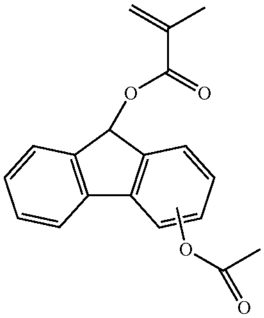
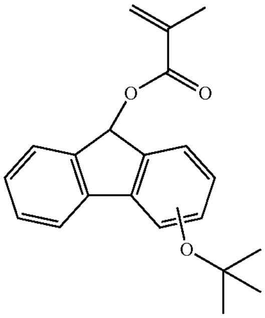
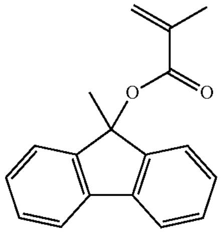
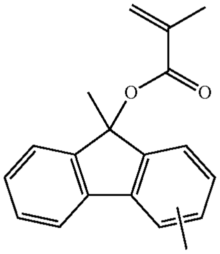
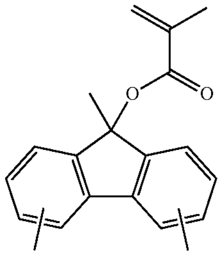
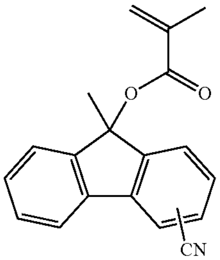

-continued
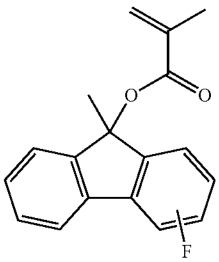
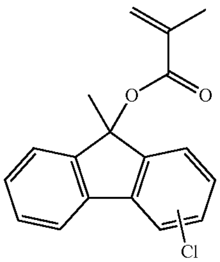
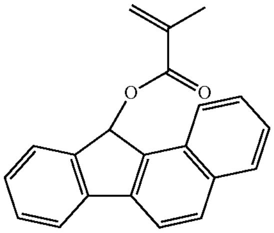
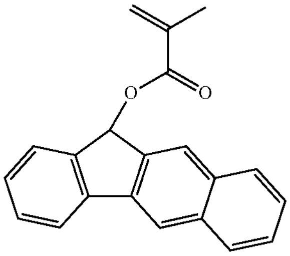
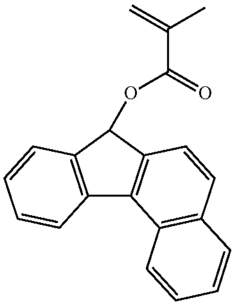
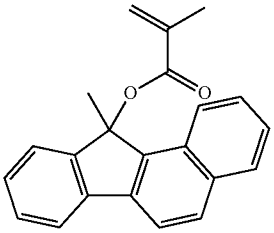
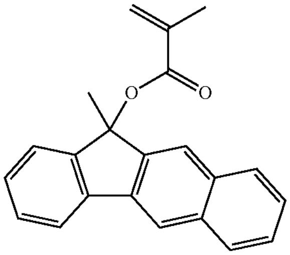
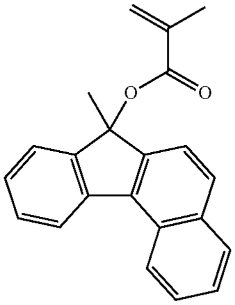
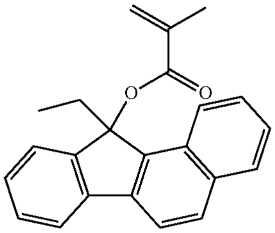
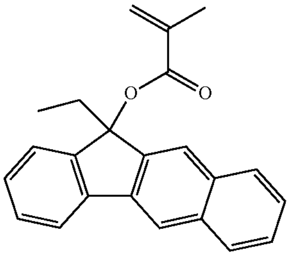
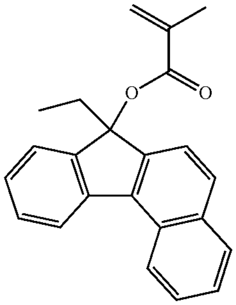
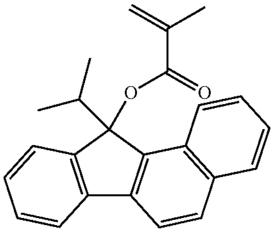
-continued
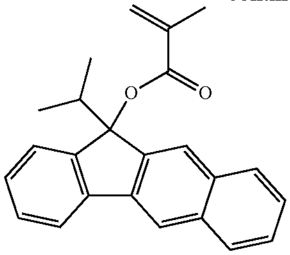
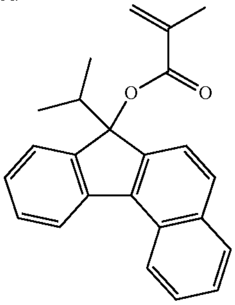
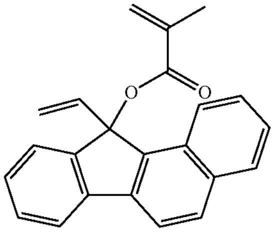
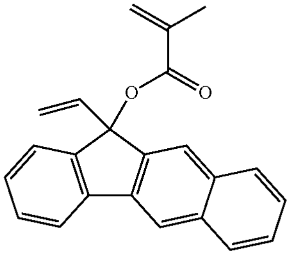
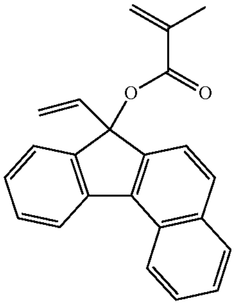
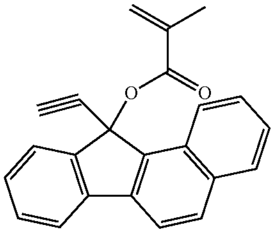
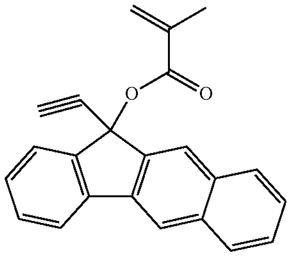
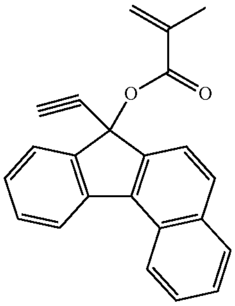
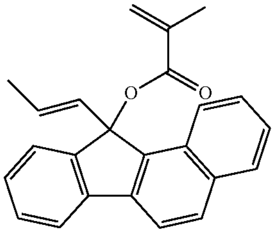
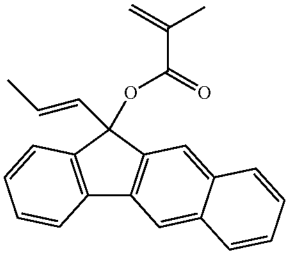
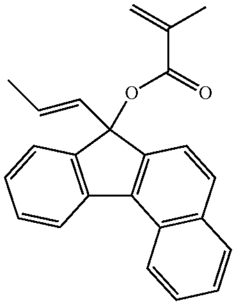
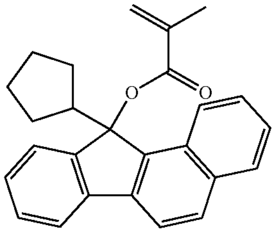

-continued
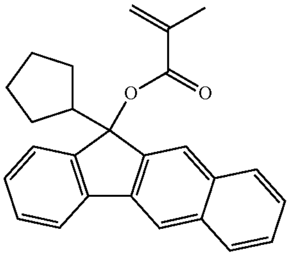
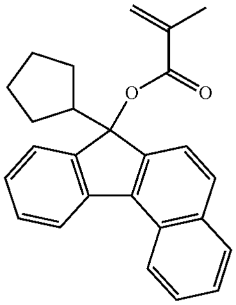
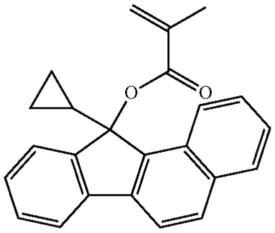
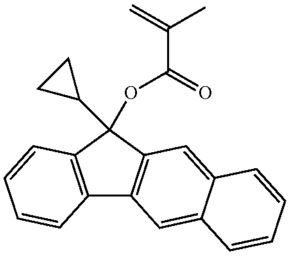
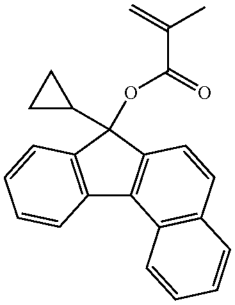
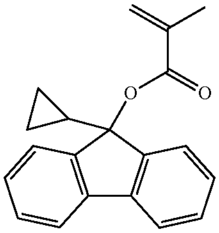
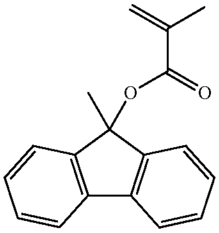
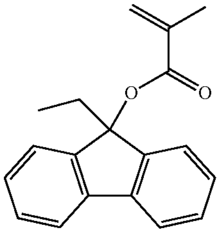
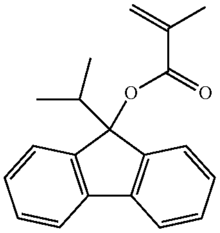
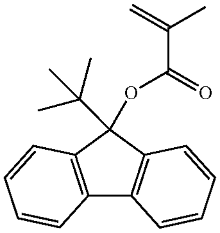
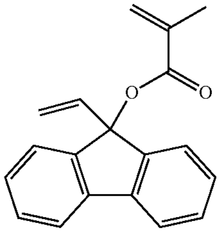
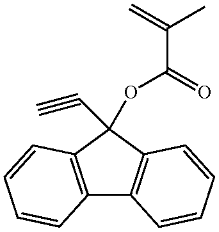
-continued
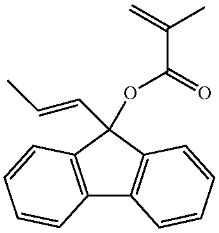
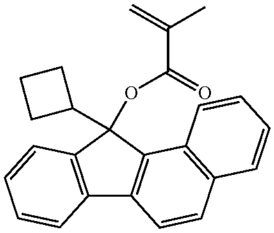
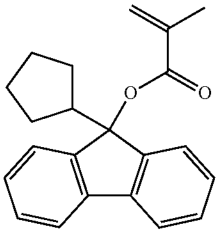
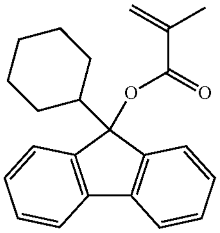
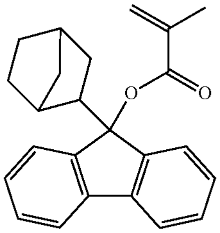
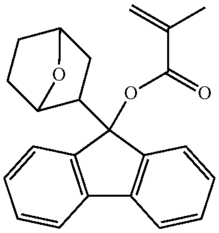
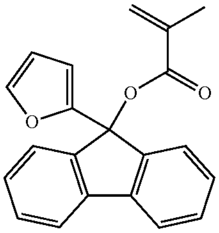
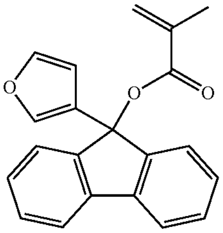
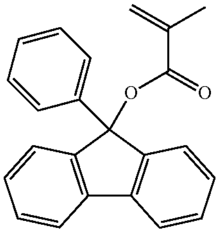
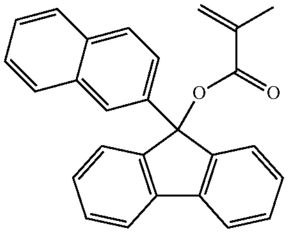
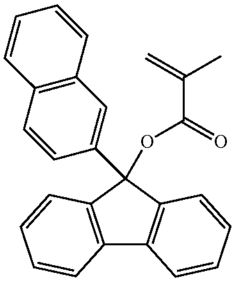
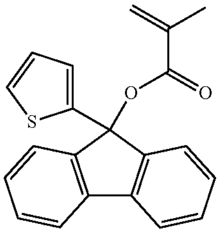
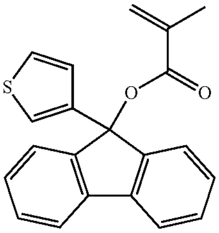
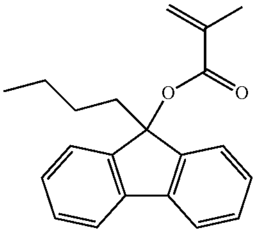

-continued

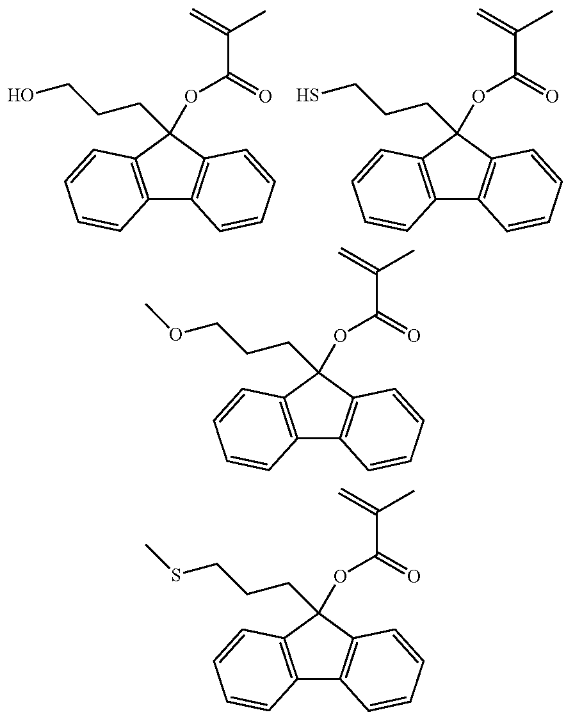

Alternatively, $R^5$ in the repeating unit shown by the general formula (b1) may be the acid-labile group shown by the following general formula (A-3)-25, (A-3)-25

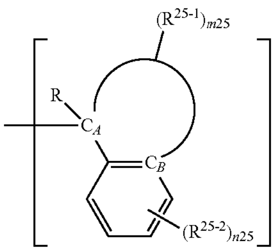

wherein $R^{25-1}$ are the same or different, representing a hydrogen atom, or a liner, a branched, or a cyclic alkyl group having 1 to 6 carbon atoms; and when, m25 is 2 or more, $R^{25-1}$ may be bonded with each other to form a non-aromatic ring having 2 to 8 carbon atoms, wherein the circle shows a bond between $C_A$ and $C_B$, selected from an ethylene group, a propylene group, a butylene group, and a pentalene group. $R^{25-2}$ represents a hydrogen atom, an alkyl group, an alkoxy group, an alkanoyl group, an alkoxycarbonyl group having 1 to 4 carbon atoms, a hydroxy group, a nitro group, an aryl group having 6 to 10 carbon atoms, a halogen atom, or a cyano group. R represents the same meaning as before. When the circle is an ethylene group or a propylene group, $R^{25-1}$ cannot be a hydrogen atom. Further, m25 and n25 represent an integer of 1 to 4.

Specific example of the monomer to obtain the repeating unit (b1) in which $R^5$ in the general formula (b1) is the acid-labile group shown by the general formula (A-3)-25 includes the following compounds.

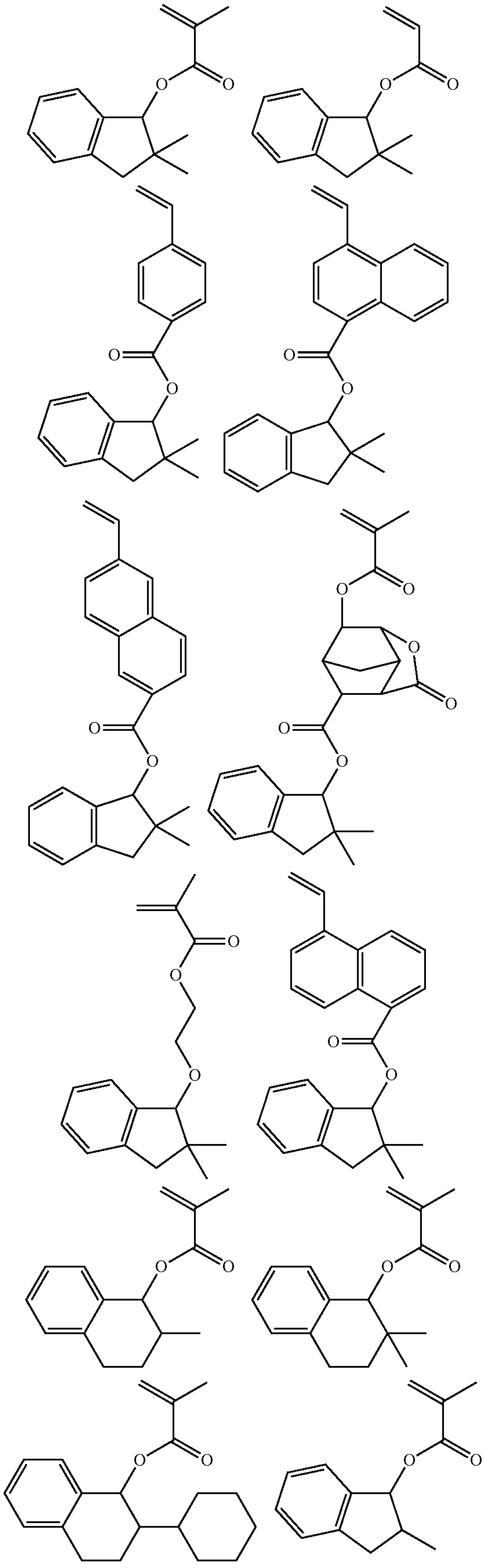

-continued
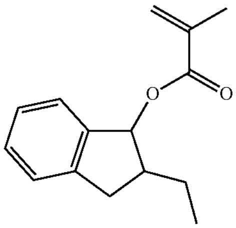
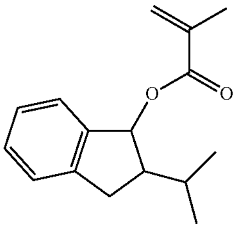
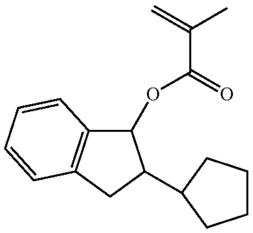
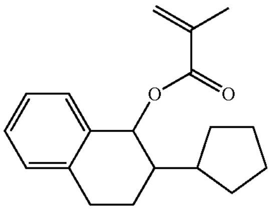
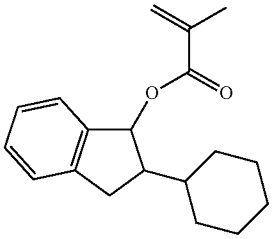
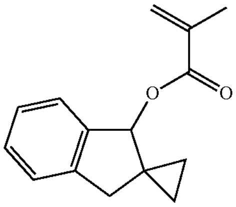
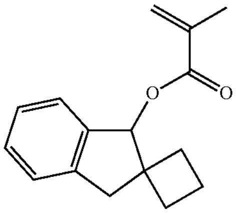
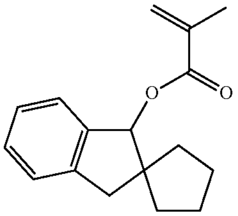
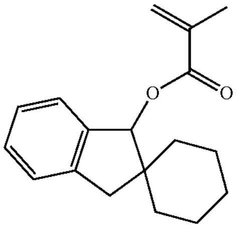
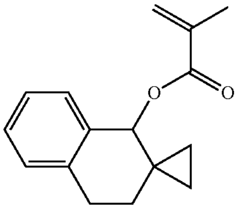
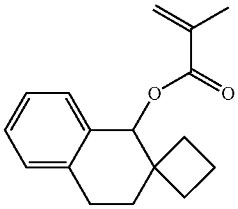
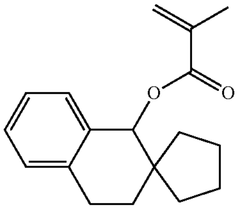
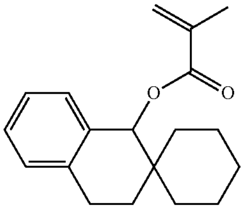
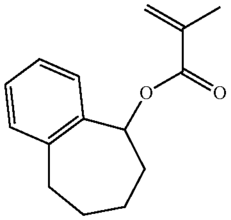
-continued
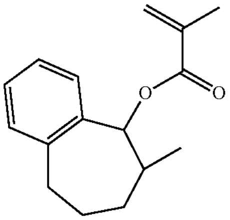
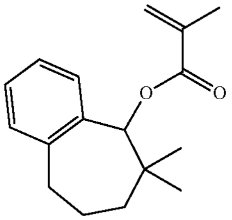
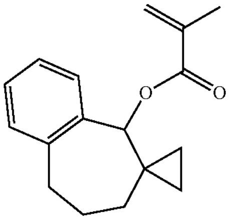
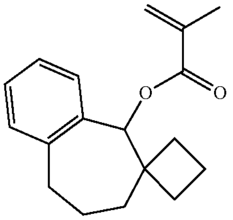
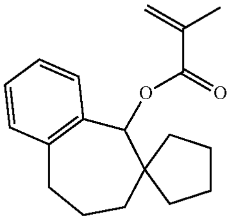
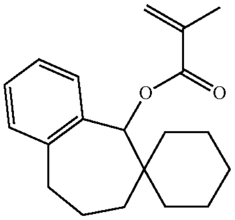
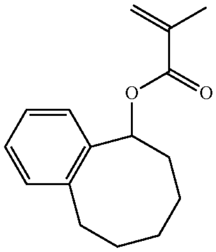
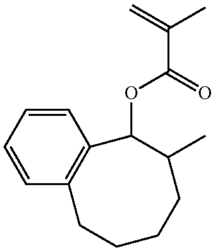
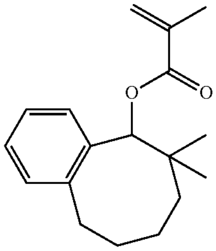
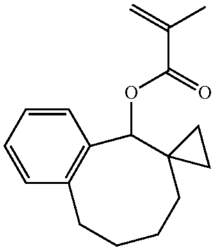
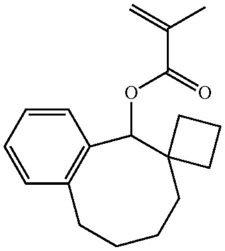
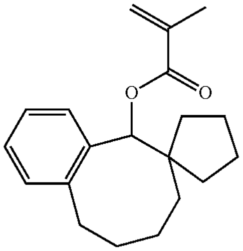
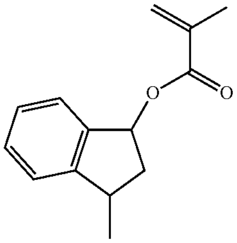
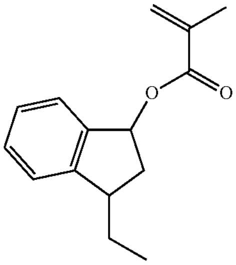

-continued
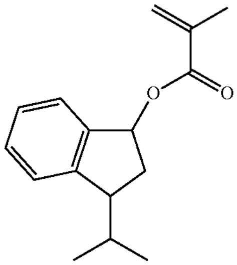
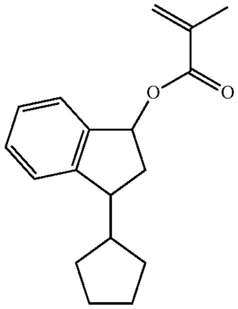
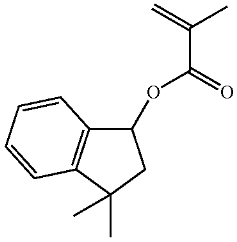
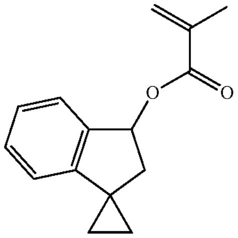
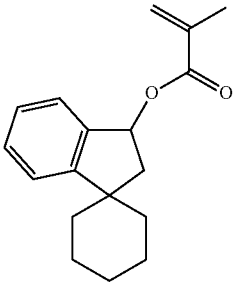
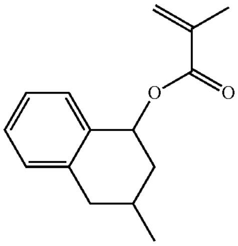
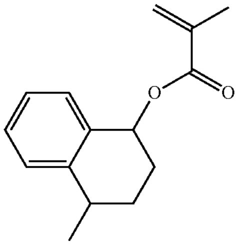
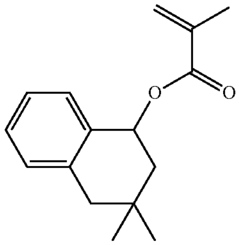
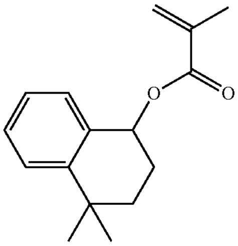
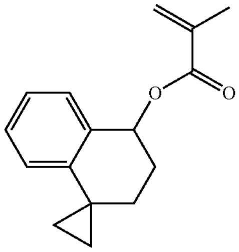
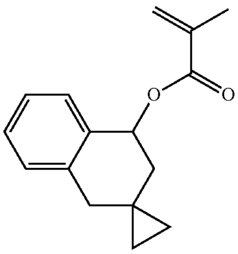
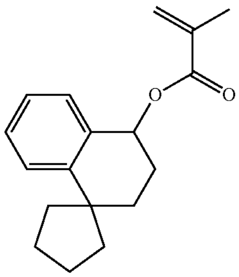
-continued
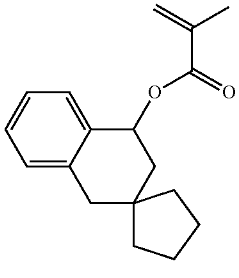
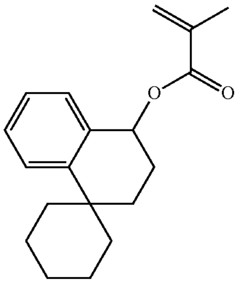
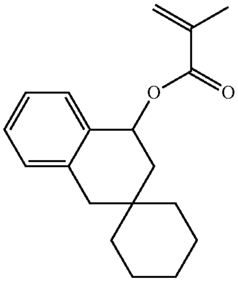
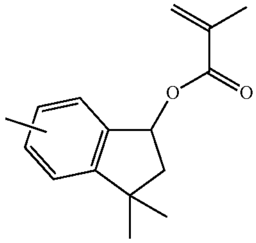
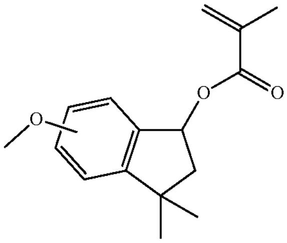
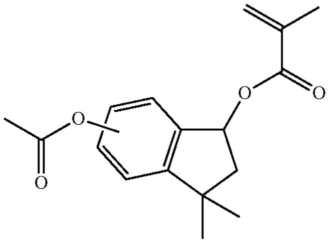
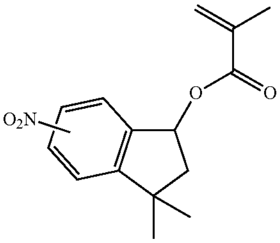
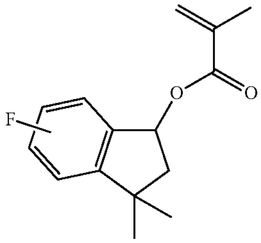
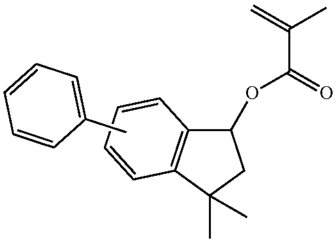

-continued
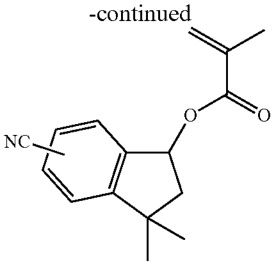
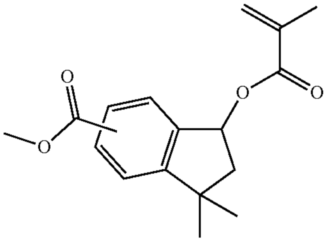
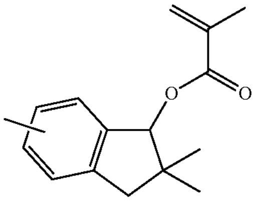
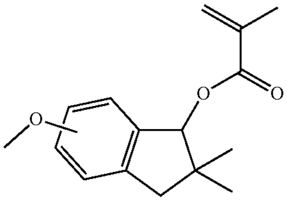
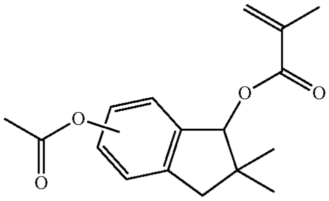
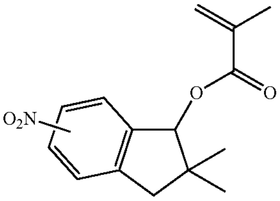
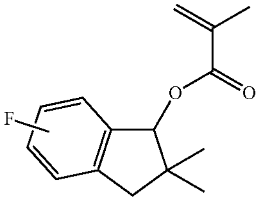
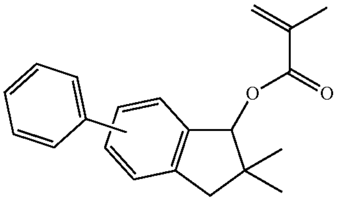
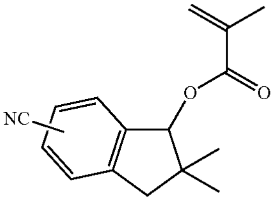
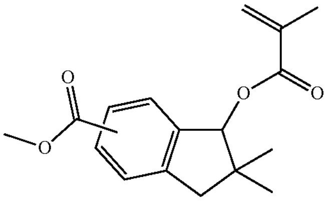
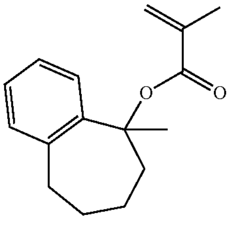
-continued
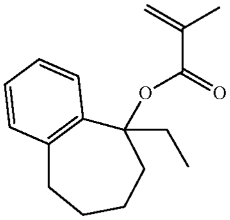
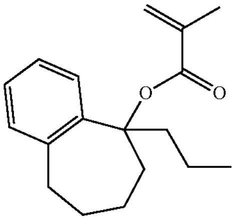
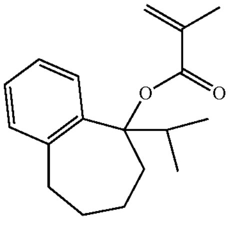
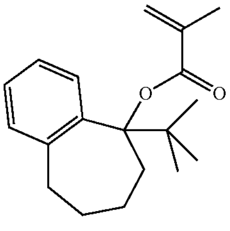
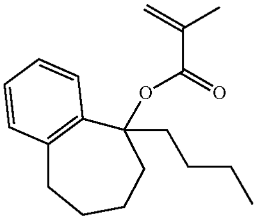
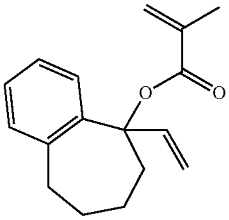
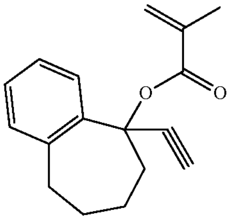
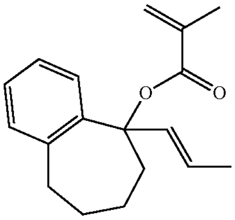
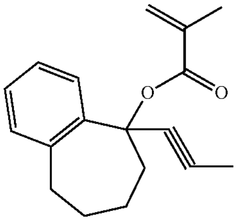
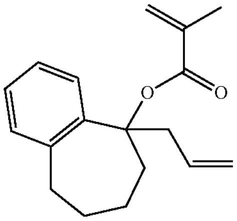
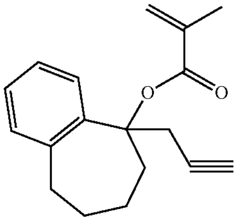
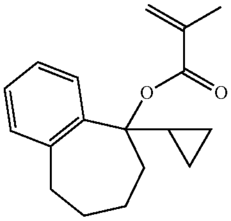
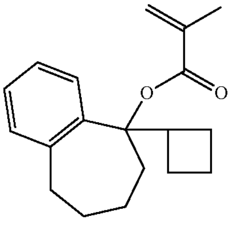
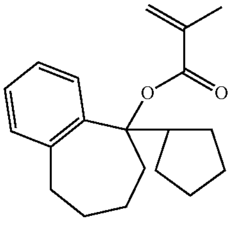

-continued
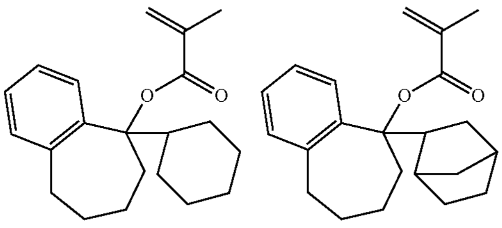
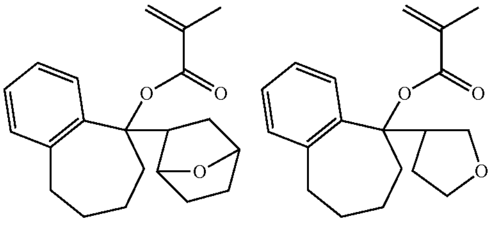
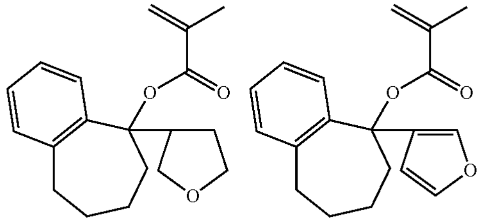
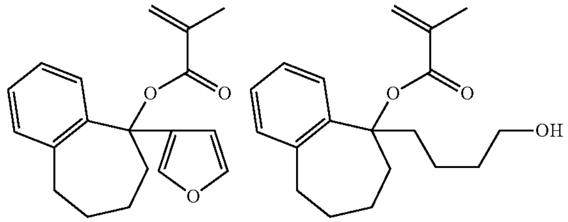
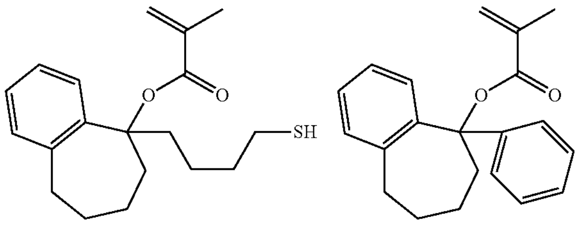
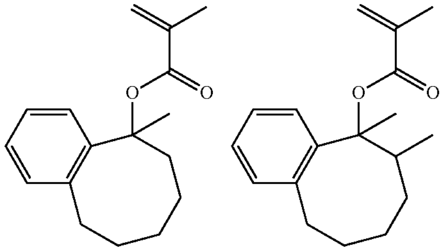
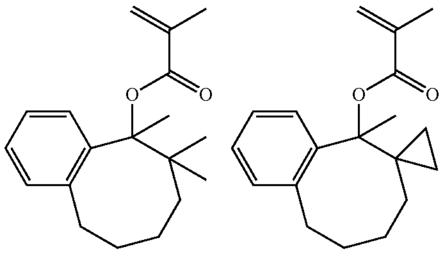
-continued
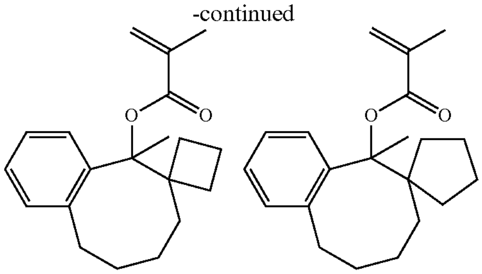
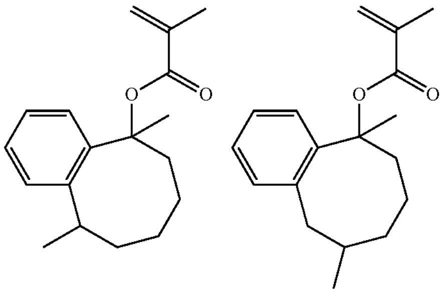
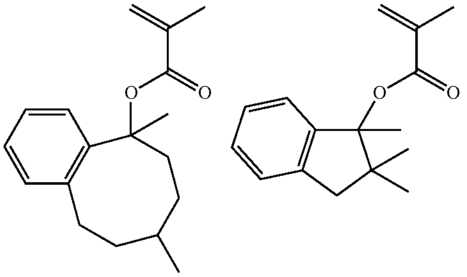
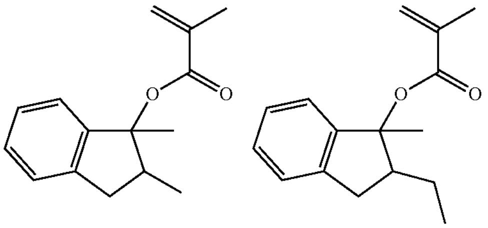
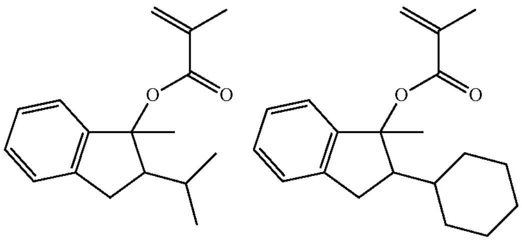
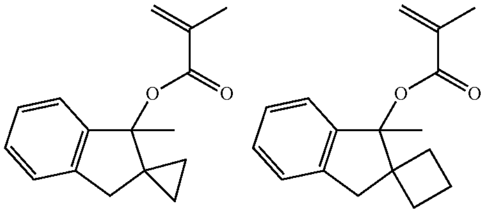
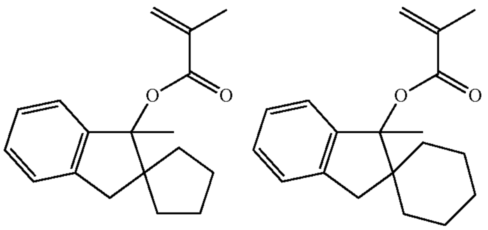

-continued
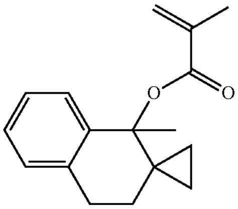
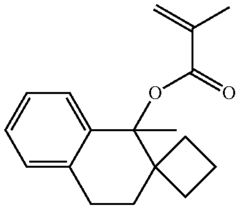
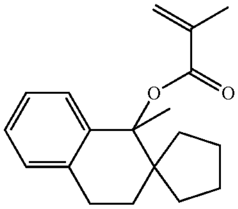
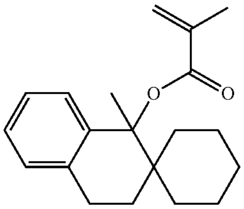
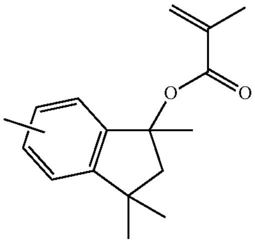
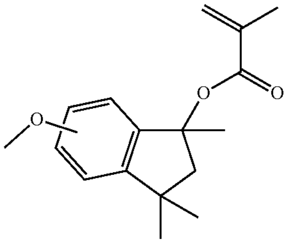
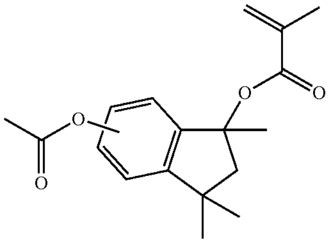
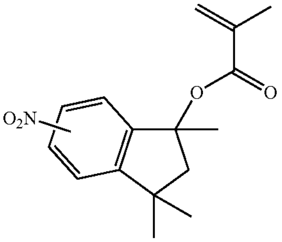
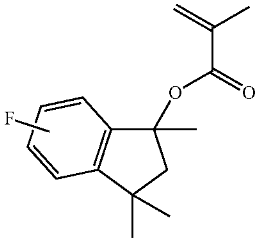
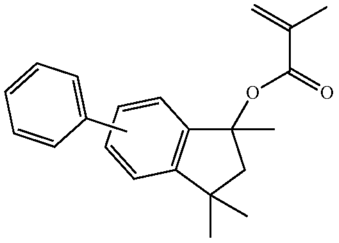
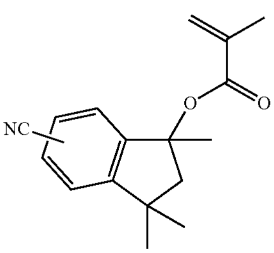
-continued
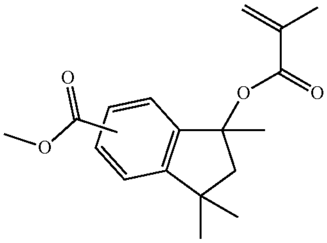
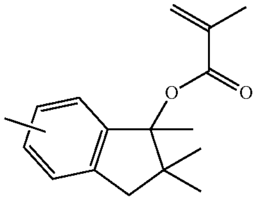
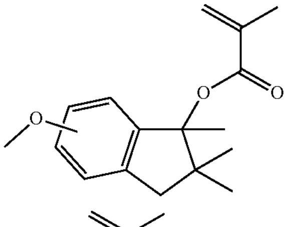
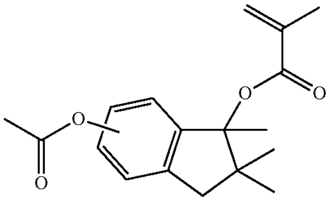
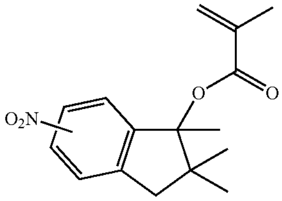
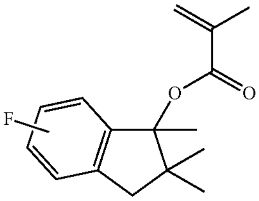
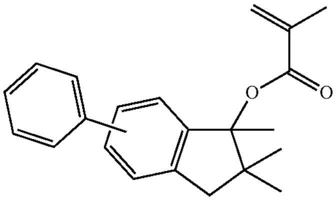
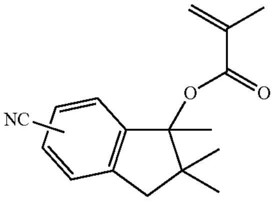
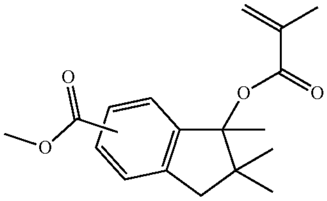
Alternatively, $R^5$ in the repeating unit shown by the general formula (b1) may be the acid-labile group shown by the following general formula (A-3)-26, (A-3)-26

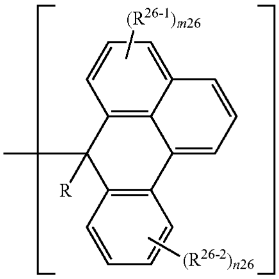

wherein each of $R^{26-1}$ and $R^{26-2}$ represents a hydrogen atom, an alkyl group, an alkoxy group, an alkanoyl group, an alkoxycarbonyl group having 1 to 4 carbon atoms, a hydroxy group, a nitro group, an aryl group having 6 to 10 carbon atoms, a halogen atom, or a cyano group. R represents the same meaning as before; and m26 and n26 represent an integer of 1 to 4.

Specific example of the monomer to obtain the repeating unit (b1) in which $R^5$ in the general formula (b1) is the acid-labile group shown by the general formula (A-3)-26 includes the following compounds.

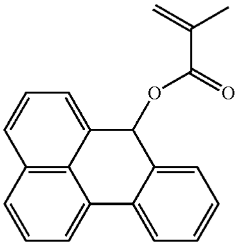

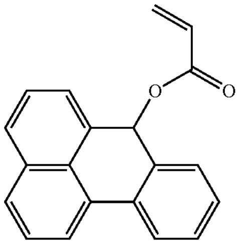

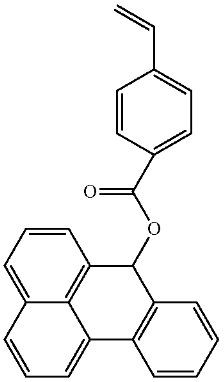

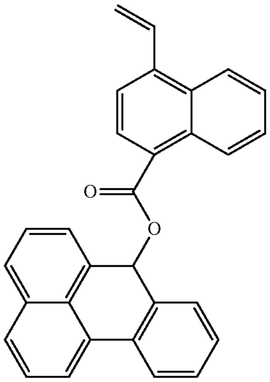

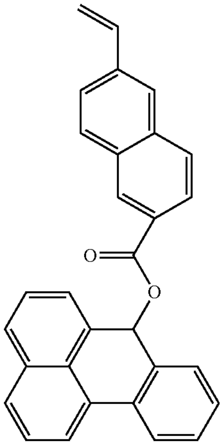

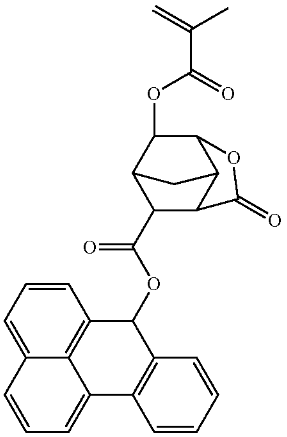

-continued

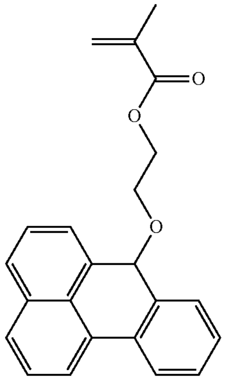

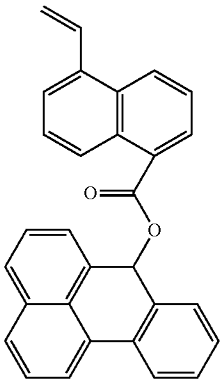

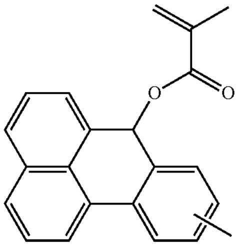

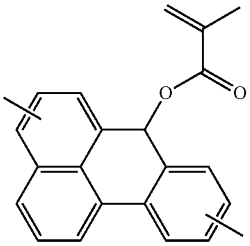

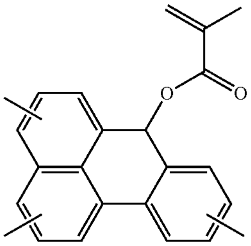

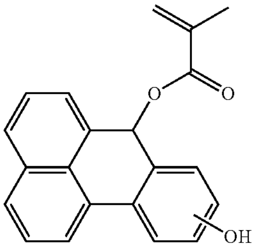

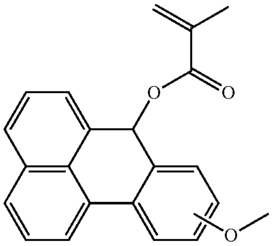

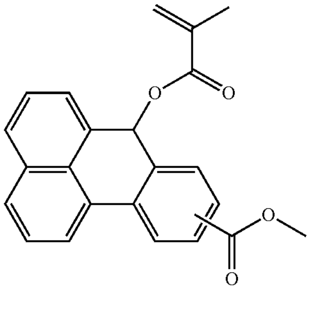

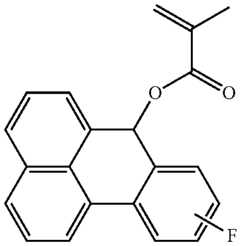

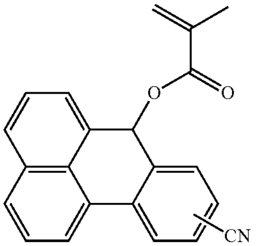

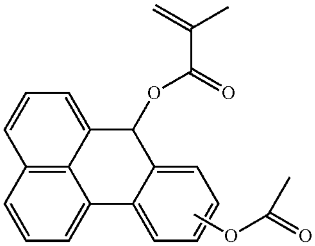

-continued
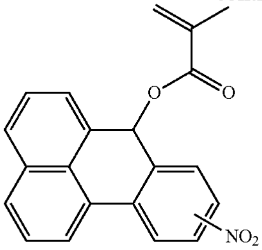
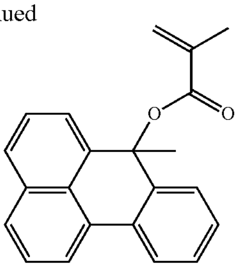
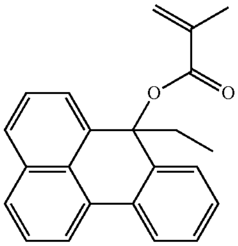
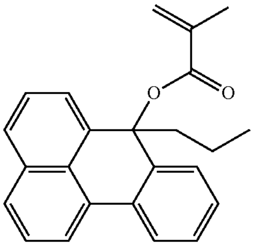
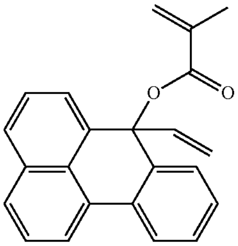
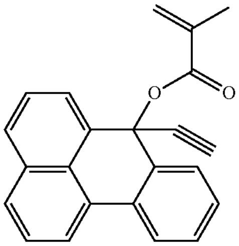
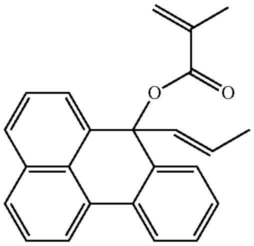
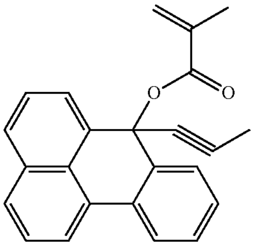
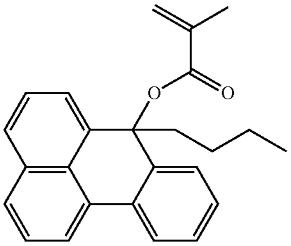
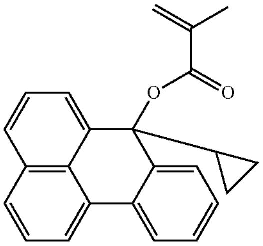
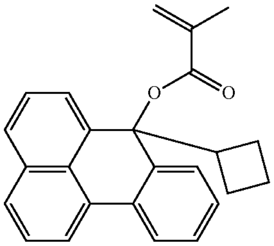
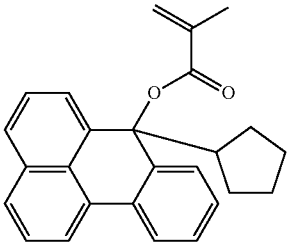
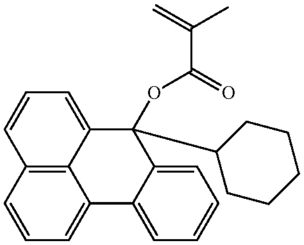
-continued
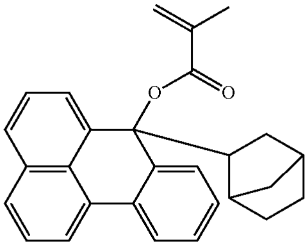
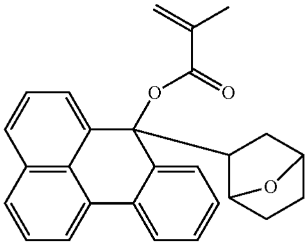
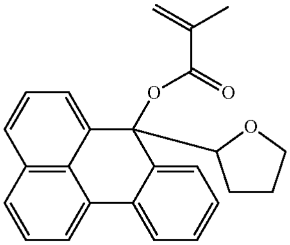
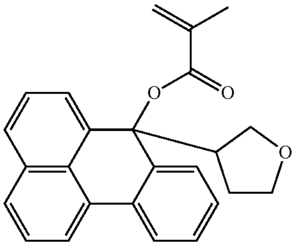
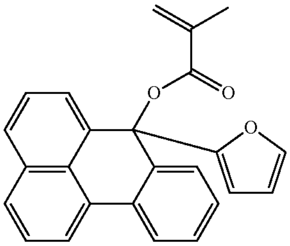
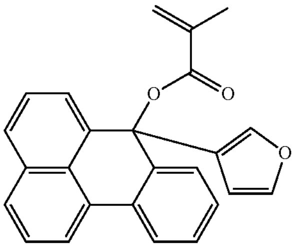
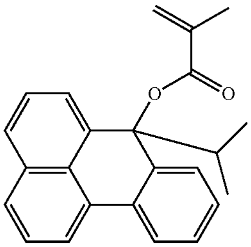
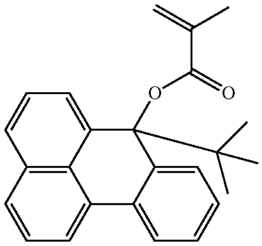

-continued

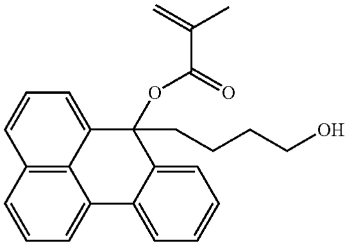

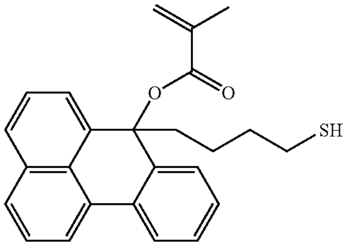

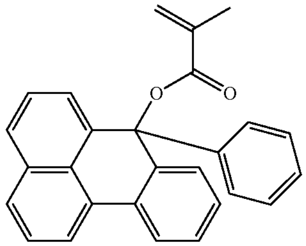

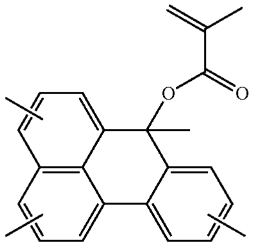

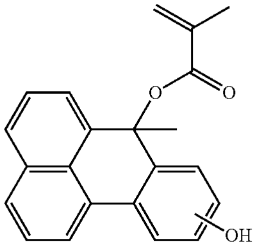

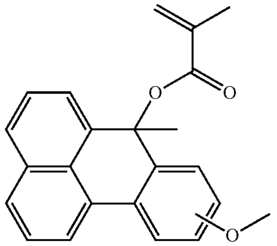

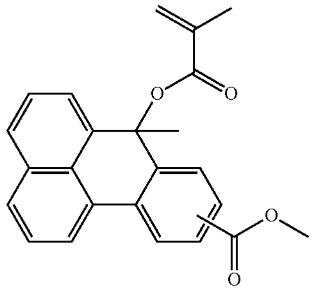

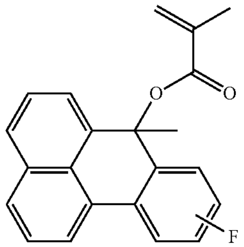

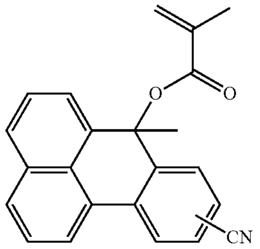

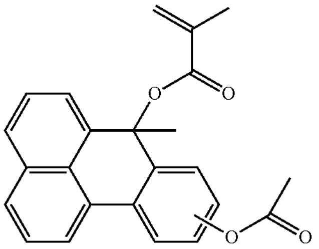

-continued

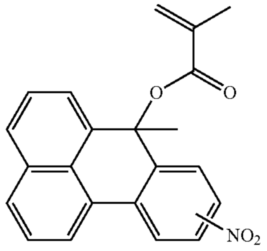

Alternatively, $R^5$ in the repeating unit shown by the general formula (b1) may be the acid-labile group shown by the following general formula (A-3)-27, (A-3)-27

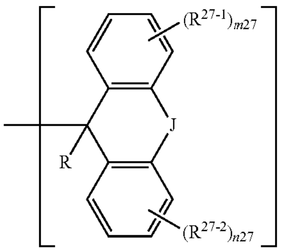

wherein $R^{27-1}$ and $R^{27-2}$ represent a hydrogen atom, an alkyl group, an alkoxy group, an alkanoyl group, an alkoxycarbonyl group having 1 to 4 carbon atoms, a hydroxy group, an aryl group having 6 to 10 carbon atoms, a halogen atom, or a cyano group. R represents the same meaning as before; m27 and n27 represent an integer of 1 to 4; and "J" represents a methylene group, an ethylene group, a vinylene group, or —$CH_2$—S—.

Specific example of the monomer to obtain the repeating unit (b1) in which $R^5$ in the general formula (b1) is the acid-labile group shown by the general formula (A-3)-27 includes the following compounds.

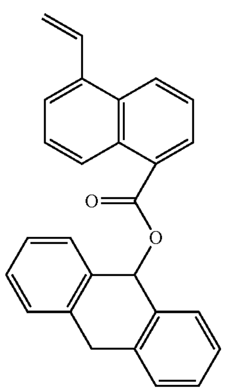

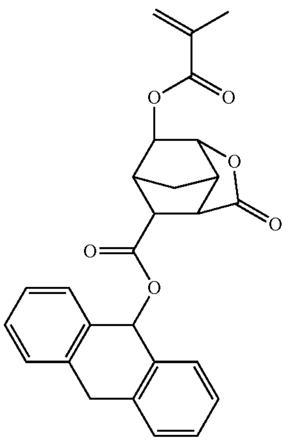

-continued
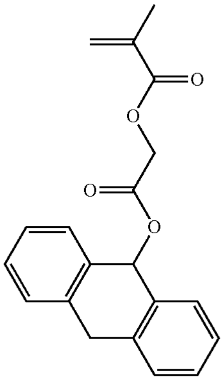
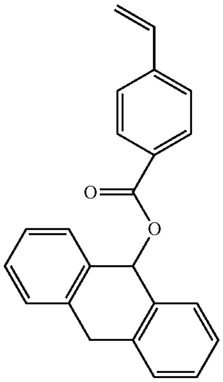
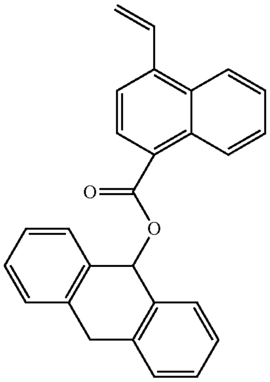
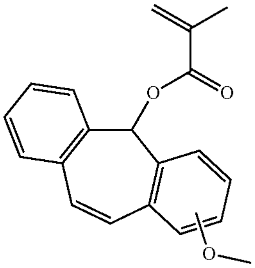
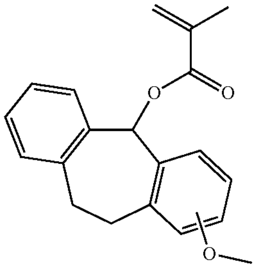
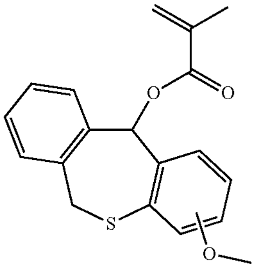
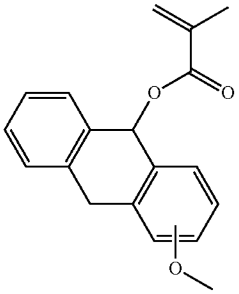
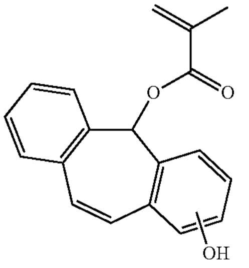
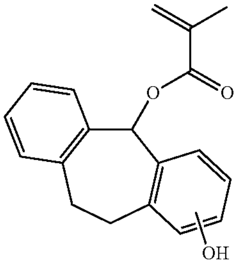
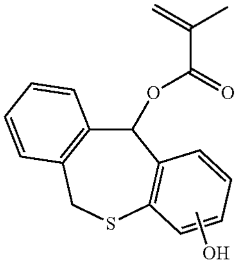
-continued
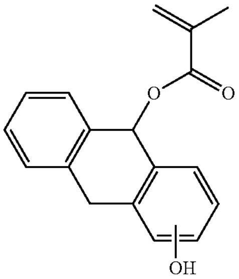
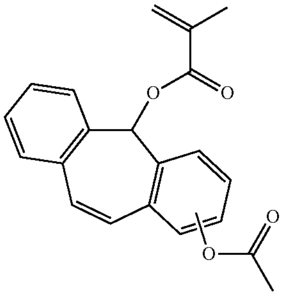
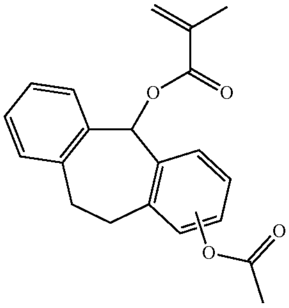
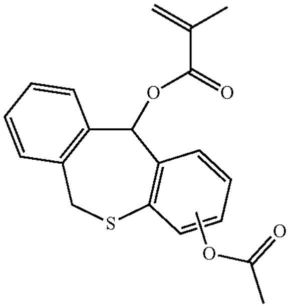
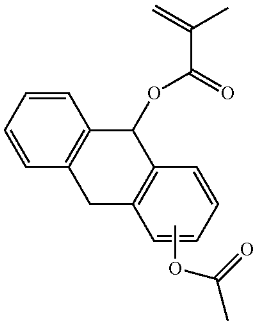
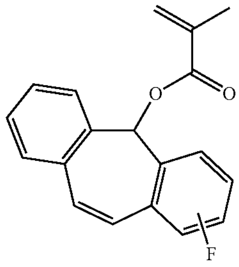
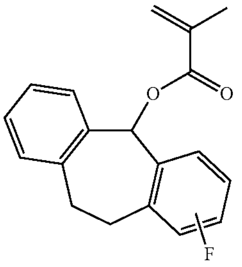
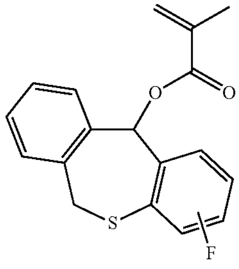
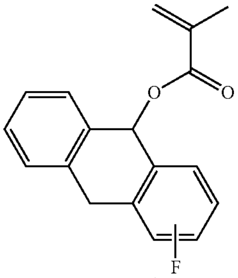
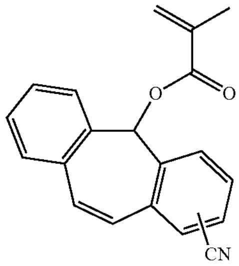
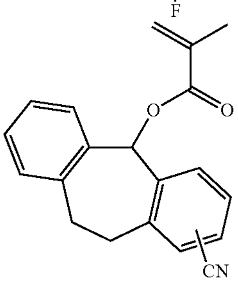

-continued
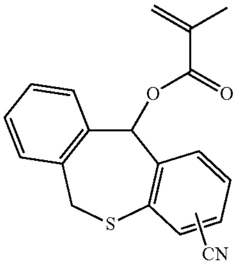
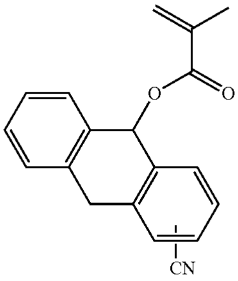
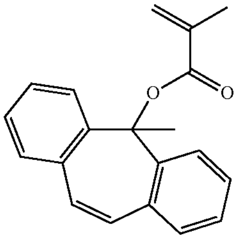
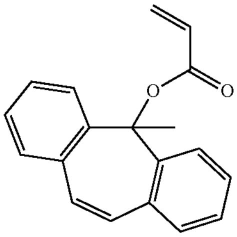
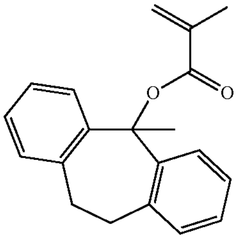
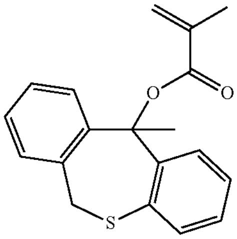
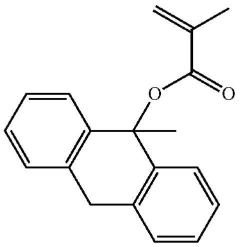
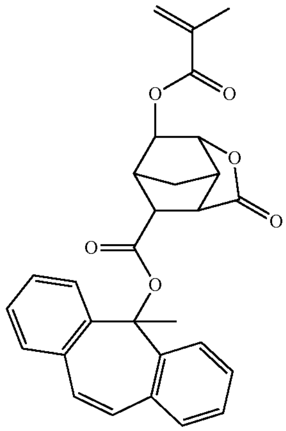
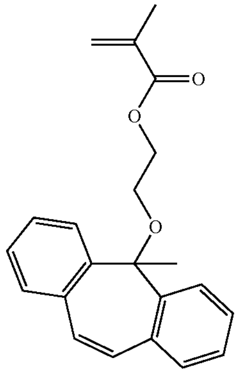
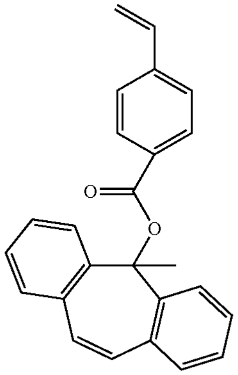
-continued
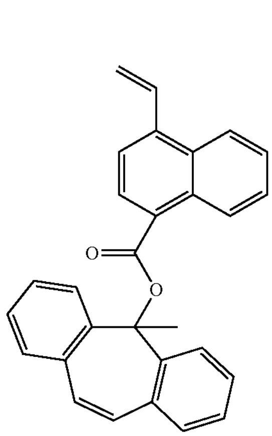
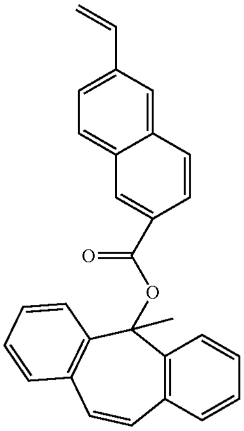
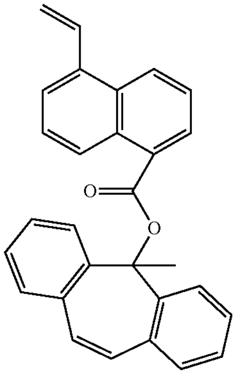
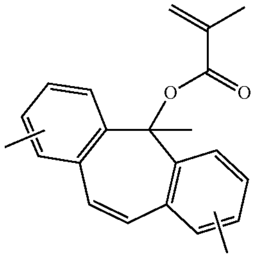
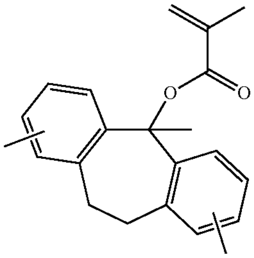
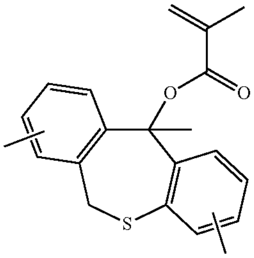
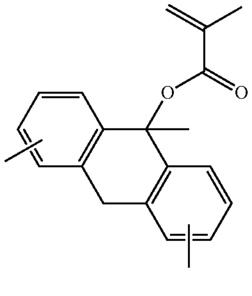
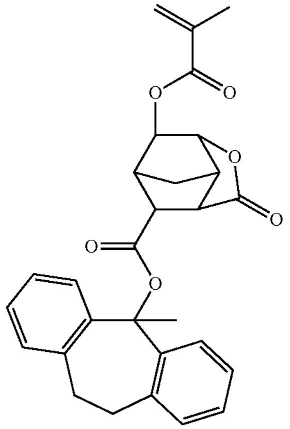

-continued
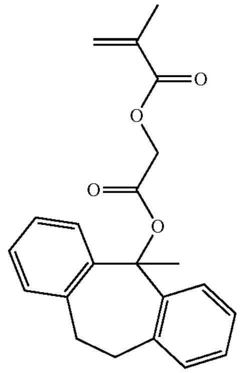
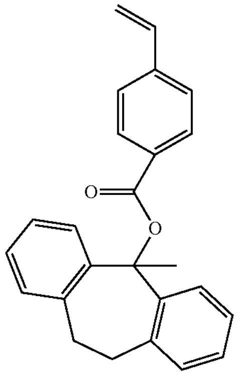
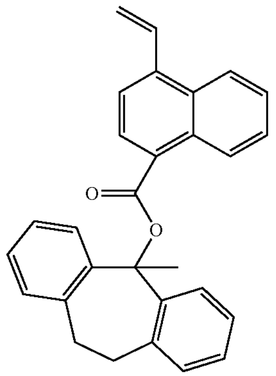
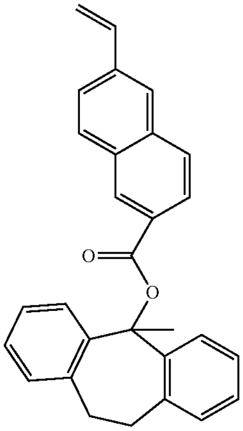
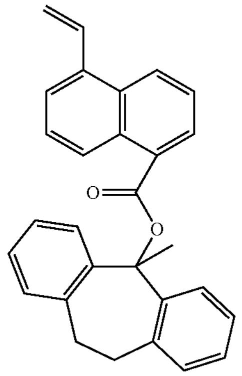
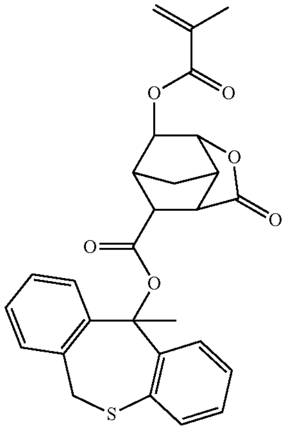
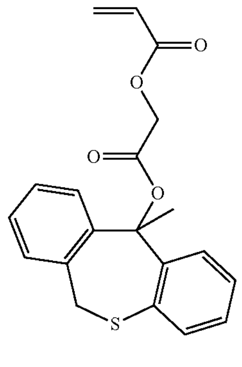
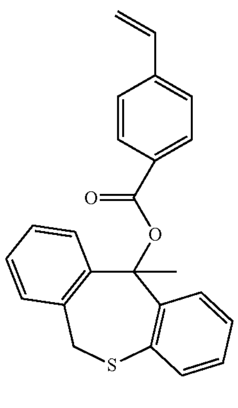
-continued
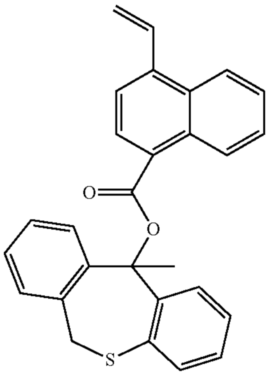
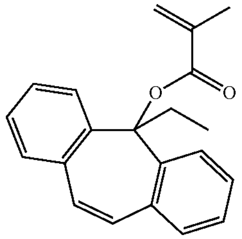
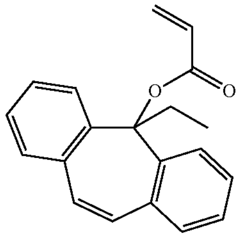
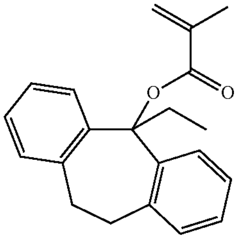
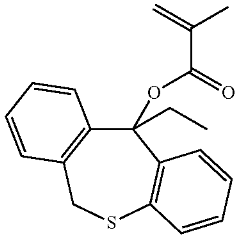
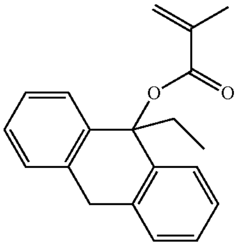
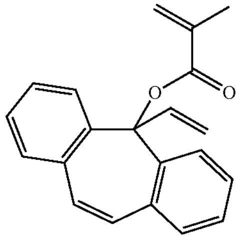
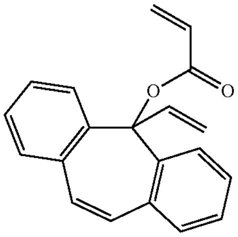
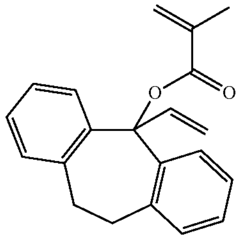
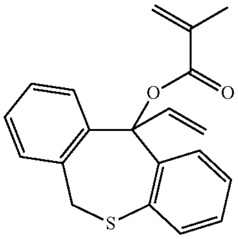
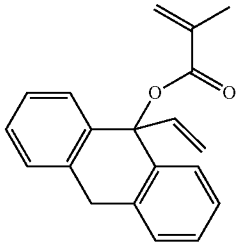
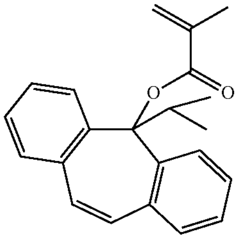

-continued

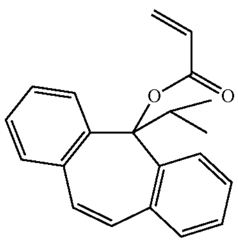

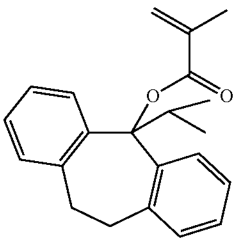

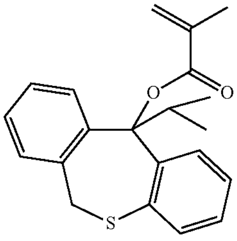

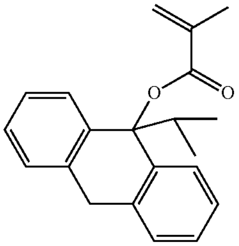

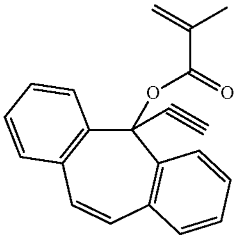

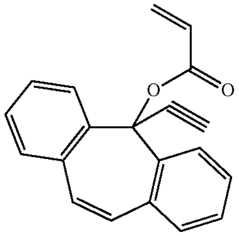

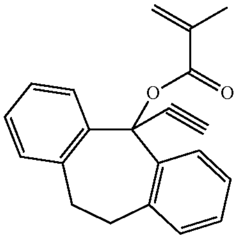

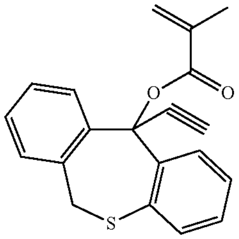

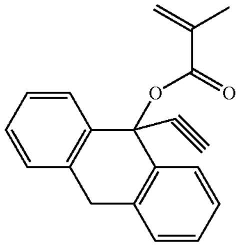

Alternatively, $R^5$ in the repeating unit shown by the general formula (b1) may be the acid-labile group shown by the following general formula (A-3)-28, (A-3)-28

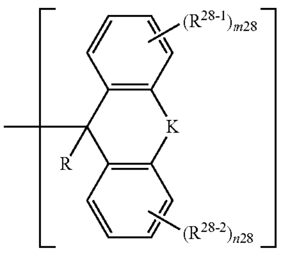

wherein $R^{28-1}$ and $R^{28-2}$ represent a hydrogen atom, an alkyl group, an alkoxy group, an alkanoyl group, an alkoxycarbonyl group having 1 to 4 carbon atoms, a hydroxy group, an aryl group having 6 to 10 carbon atoms, a halogen atom, a nitro group, or a cyano group. R represents the same meaning as before; m28 and n28 represent an integer of 1 to 4; and K represents a carbonyl group, an ether group, a sulfide group, —S(═O)—, or —S(═O)$_2$—.

Specific example of the monomer to obtain the repeating unit (b1) in which $R^5$ in the general formula (b1) is the acid-labile group shown by the general formula (A-3)-28 includes the following compounds.

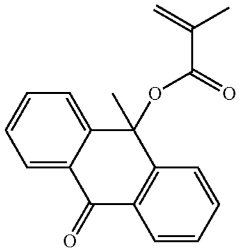

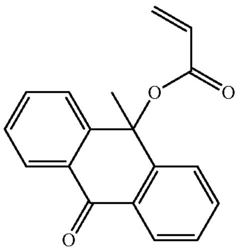

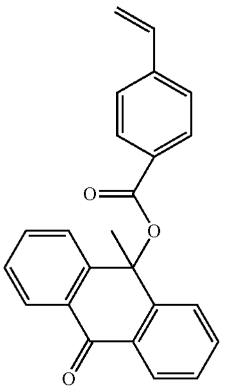

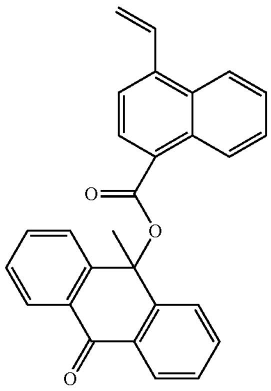

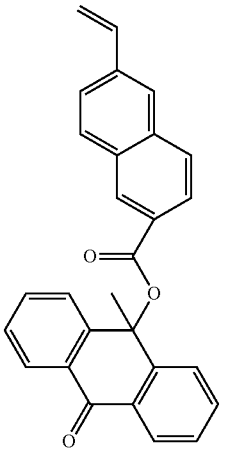

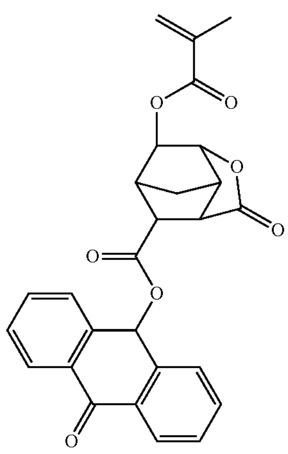

-continued
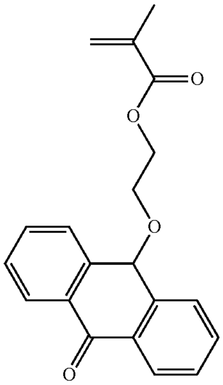
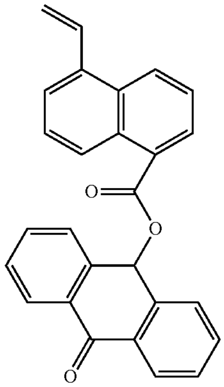
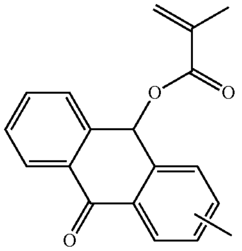
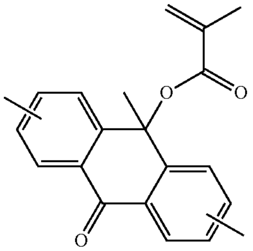
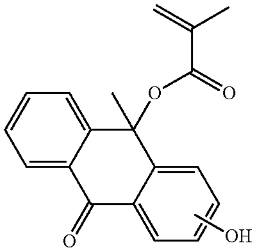
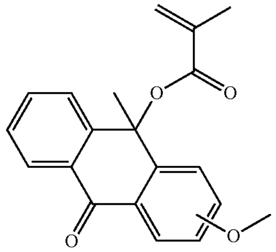
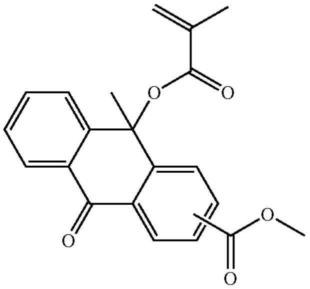
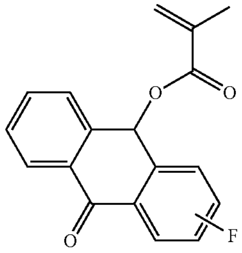
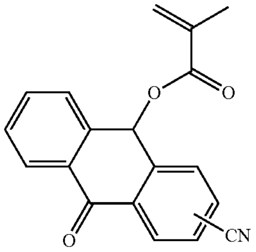
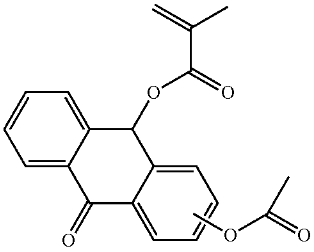
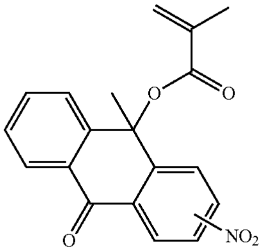
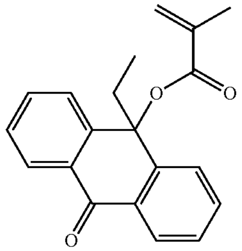
-continued
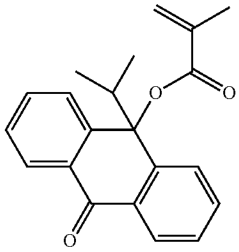
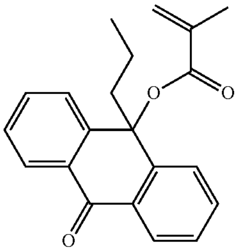
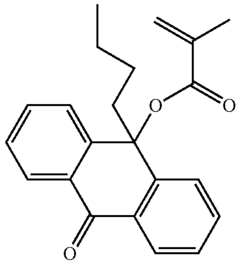
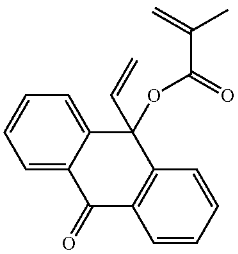
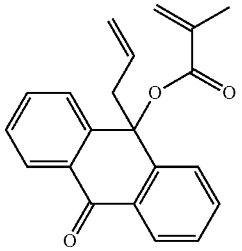
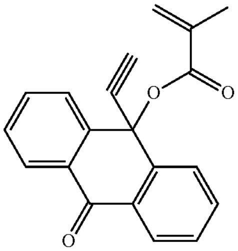
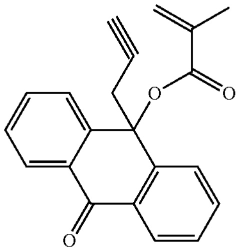
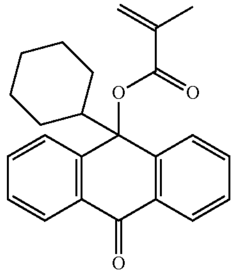
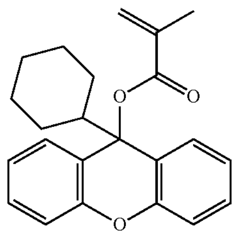
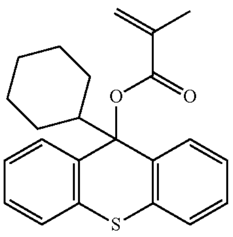
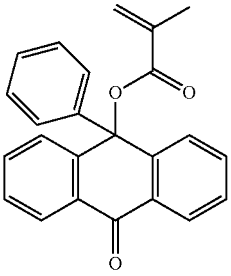
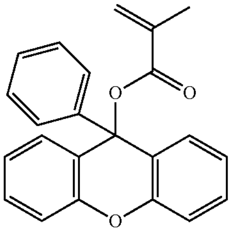

-continued
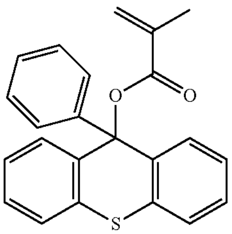
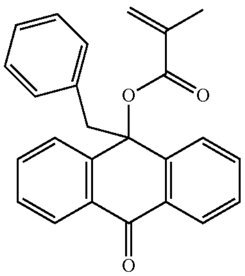
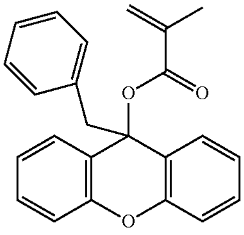
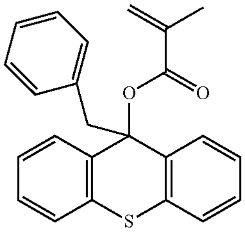
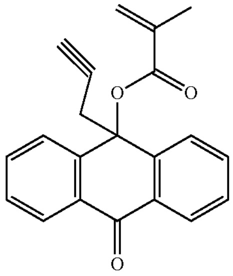
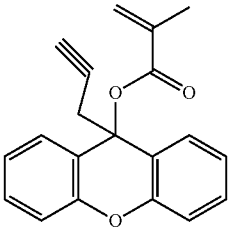
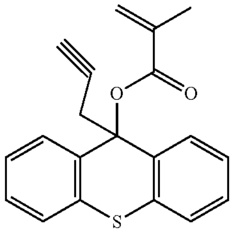
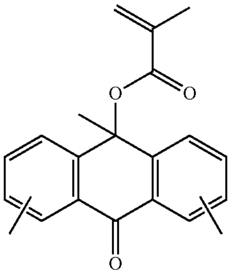
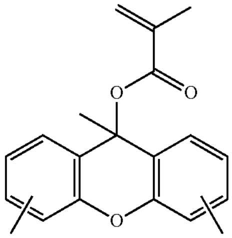
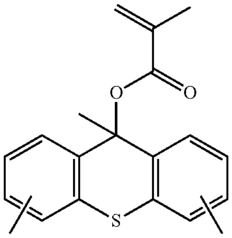
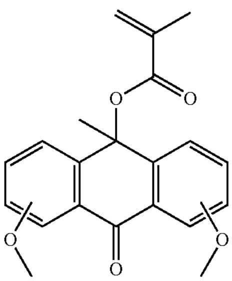
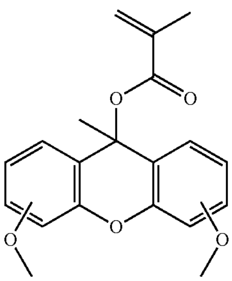
-continued
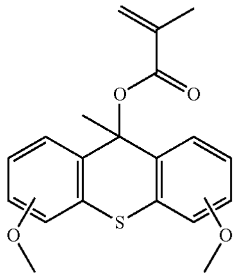
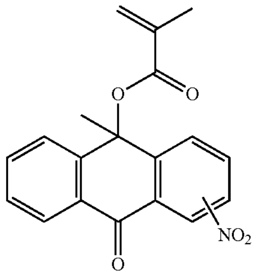
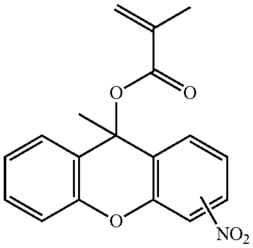
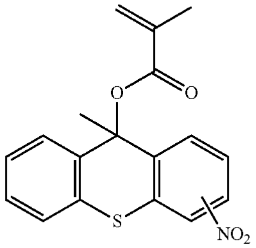
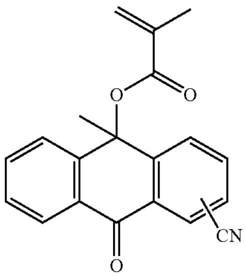
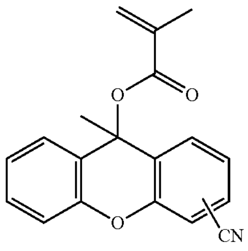
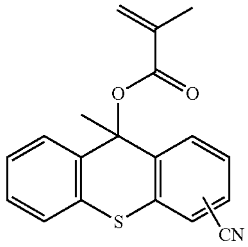
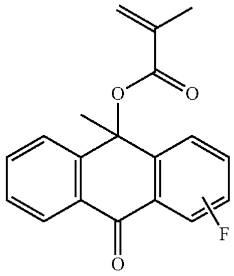
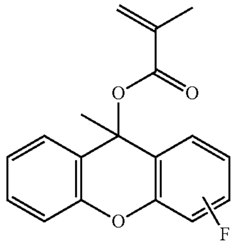
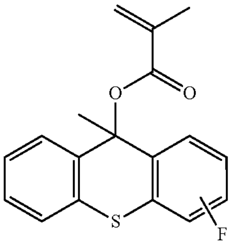
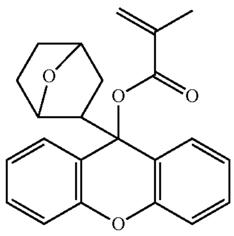
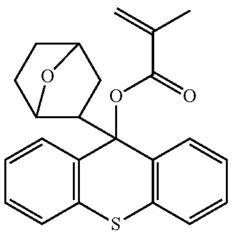

-continued
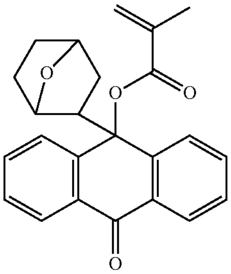
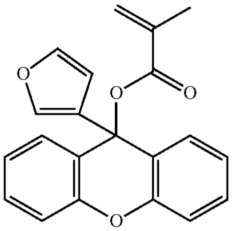
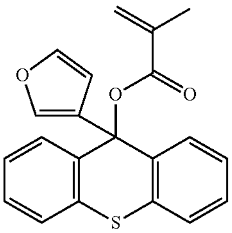
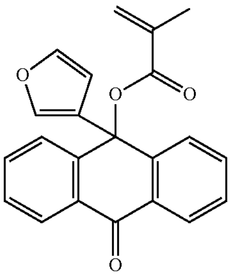
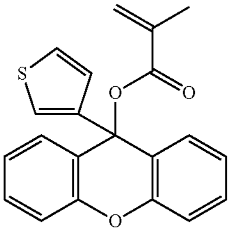
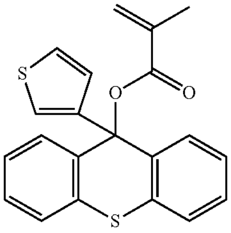
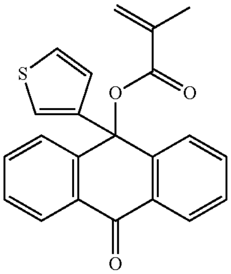
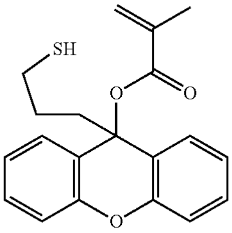
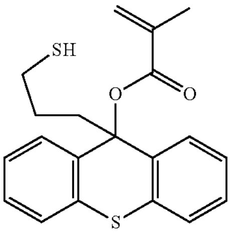
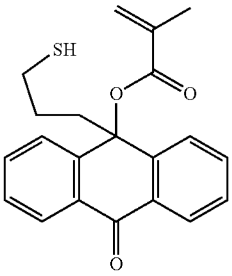
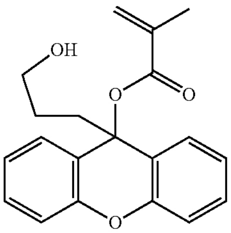
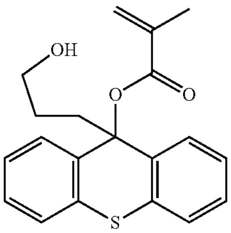
-continued
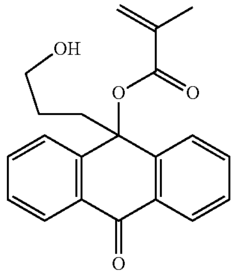
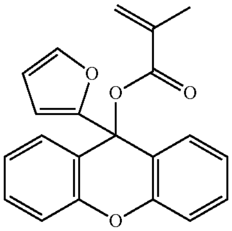
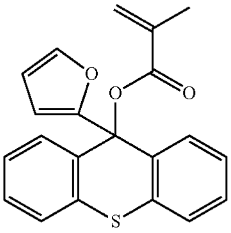
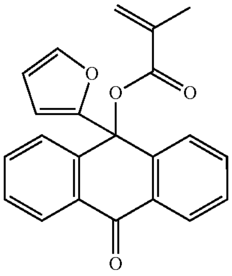
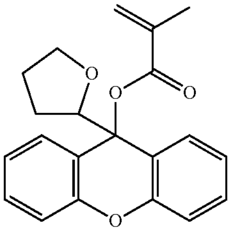
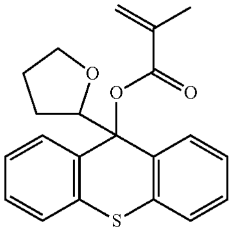
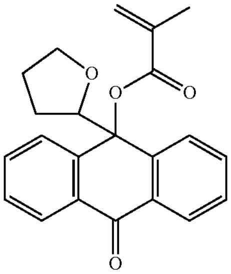
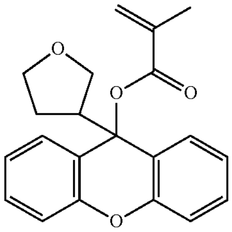
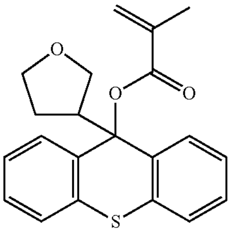
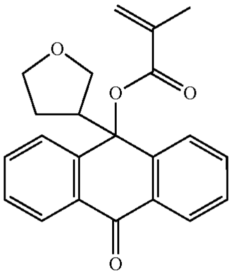
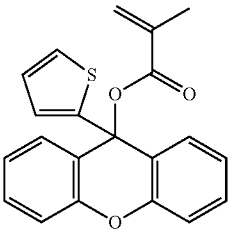
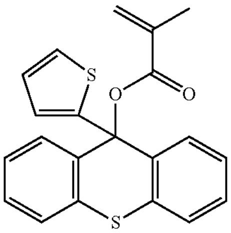

-continued
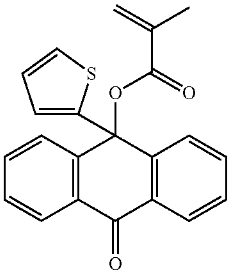
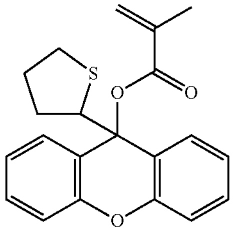
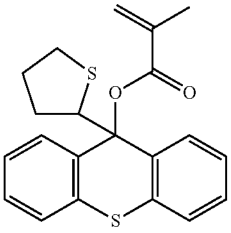
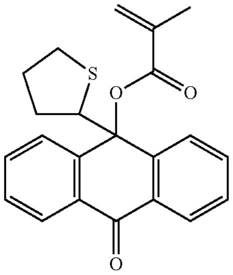
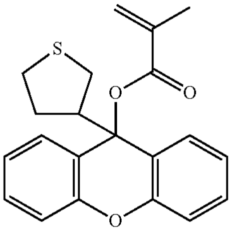
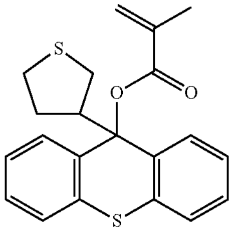
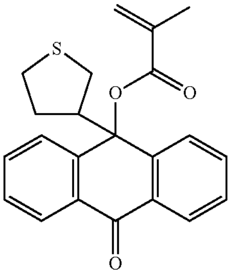
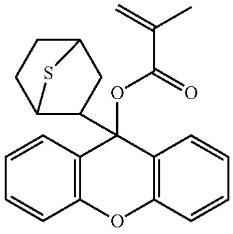
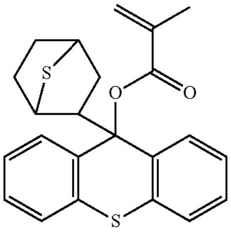
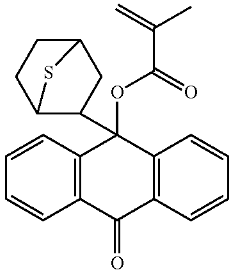
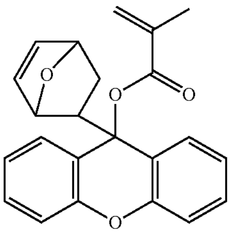
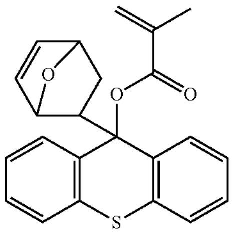
-continued
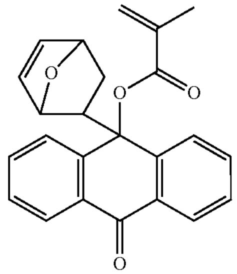
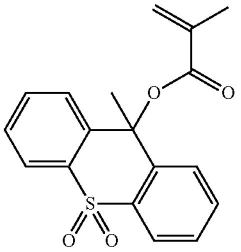
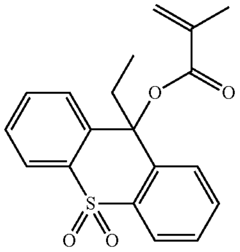
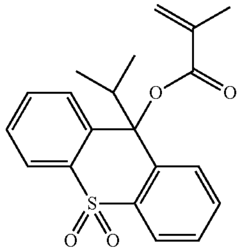
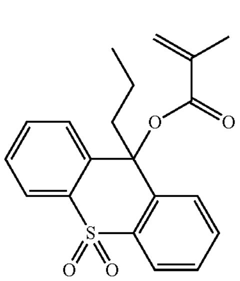
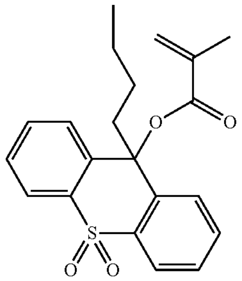
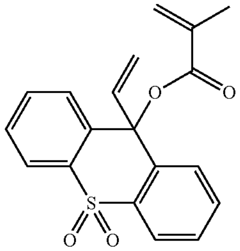
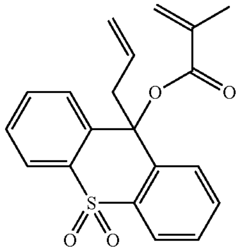
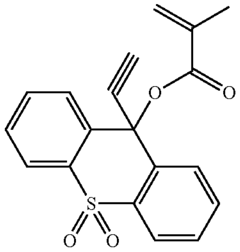
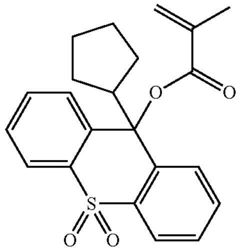
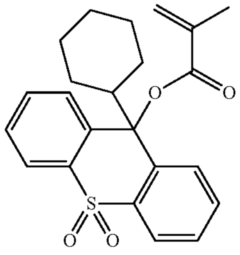
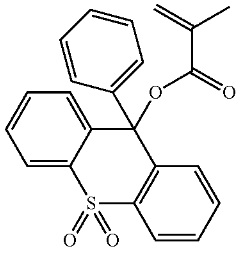

-continued

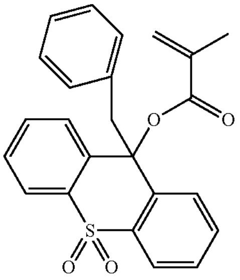
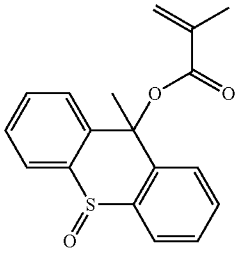
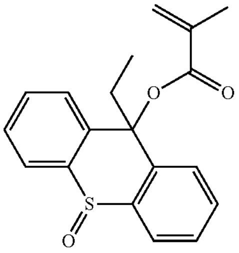
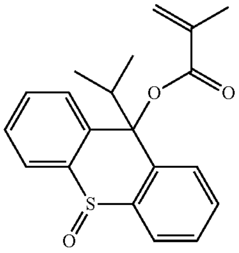
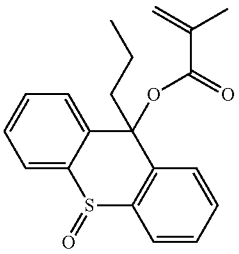
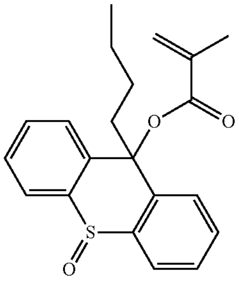
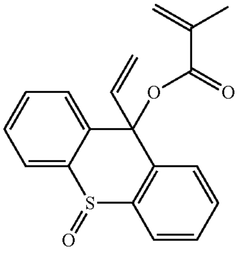
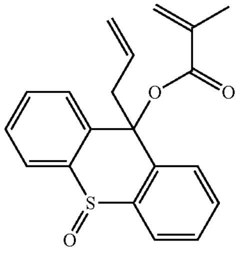
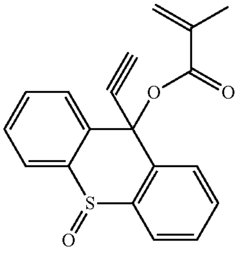
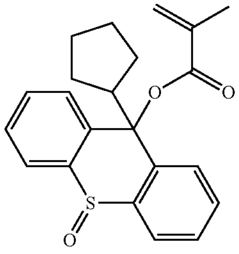
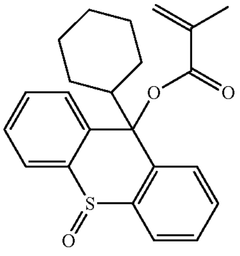
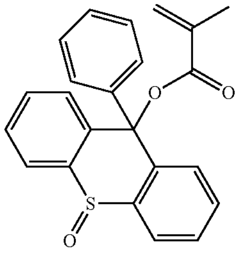

-continued

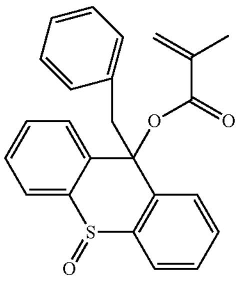

In the positive resist composition of the present invention, it is preferable that a polymer compound having, in addition to the repeating unit "a" and the repeating unit shown by (b1) and/or (b2) in the general formula (2), a repeating unit "c" which has an adhesive group selected from a hydroxy group, a carboxyl group, a lactone ring, a carbonate group, a thiocarbonate group, a carbonyl group, a cyclic acetal group, an ether group, an ester group, a sulfonate ester group, a cyano group, an amide group, and —O—C(═O)-G- (G represents a sulfur atom or NH), with the weight-average molecular weight thereof being 1,000 to 500,000 be used as a base resin (note here, $0<c\leq0.9$ and $0.2\leq a+b1+b2+c\leq1.0$).

Specific example of the monomer to obtain the repeating unit "c" which has an adhesive group selected from a hydroxy group, a carboxyl group, a lactone ring, a carbonate group, a thiocarbonate group, a carbonyl group, a cyclic acetal group, an ether group, an ester group, a sulfonate ester group, a cyano group, an amide group, and —O—C(═O)-G- (G represents a sulfur atom or NH) includes the following compounds.

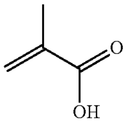
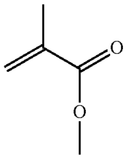
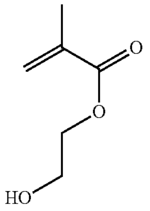
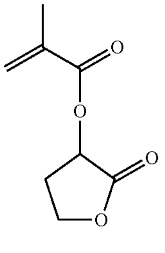
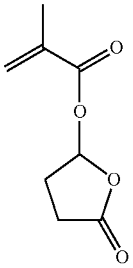
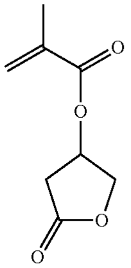
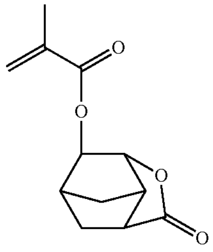
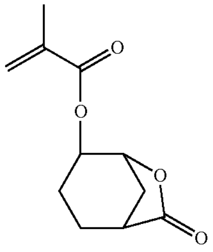

-continued
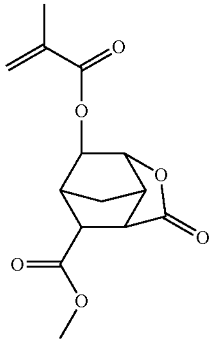
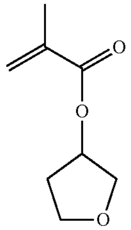
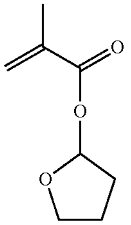
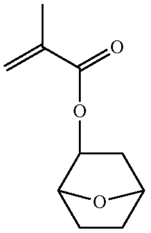
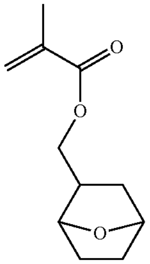
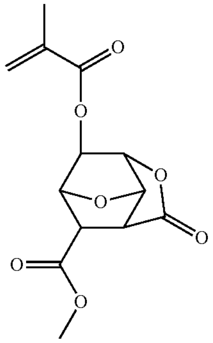
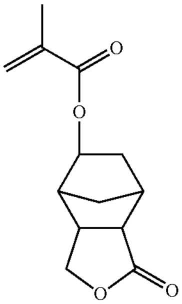
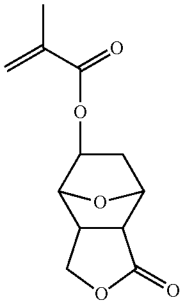
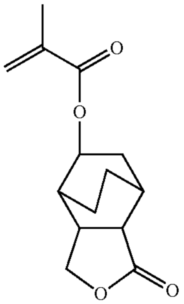
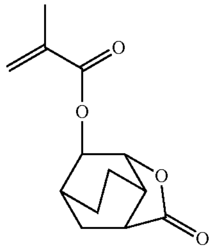
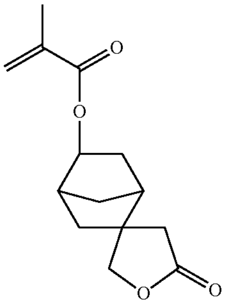
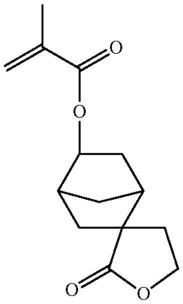
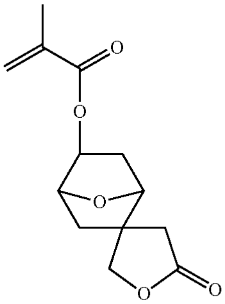
-continued
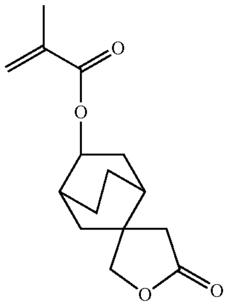
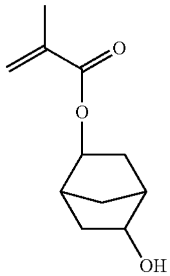
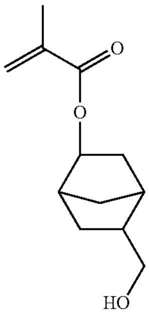
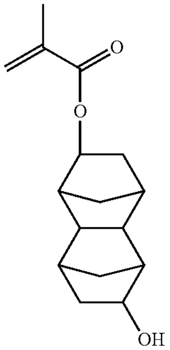
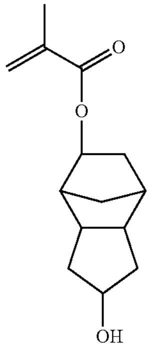
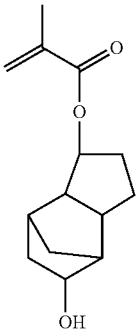
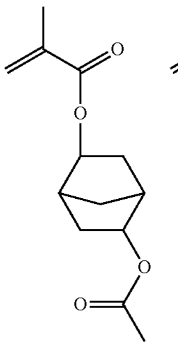
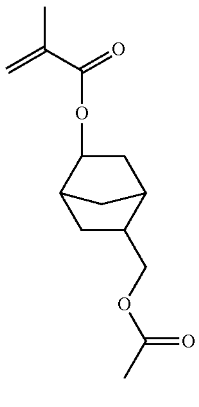
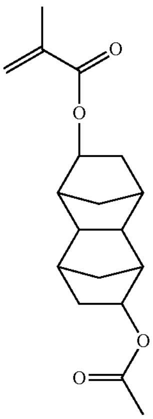
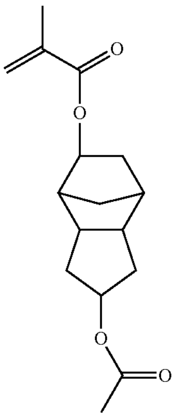
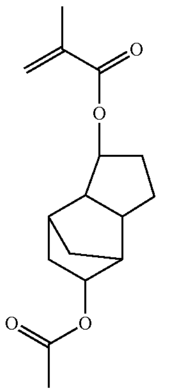
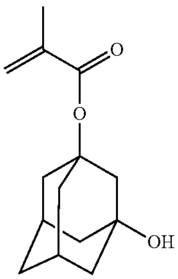

-continued
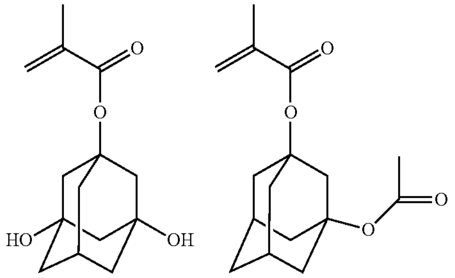
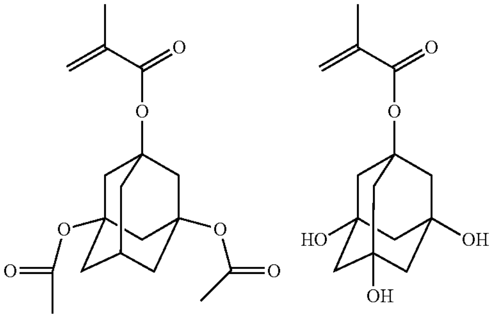
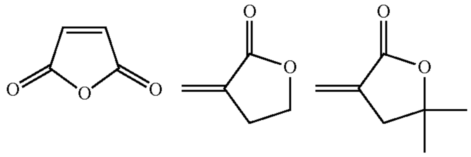
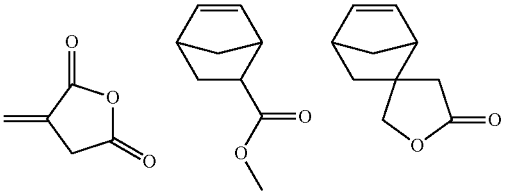
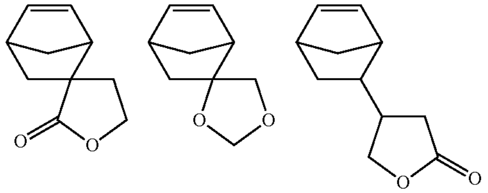
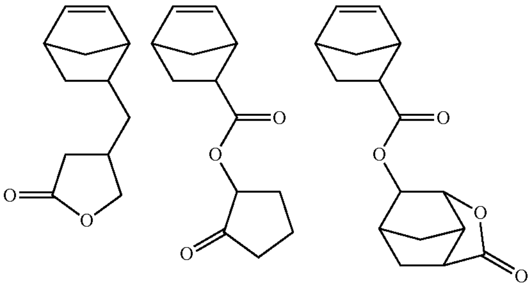
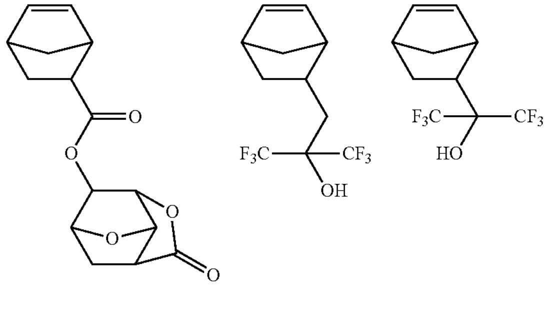
-continued
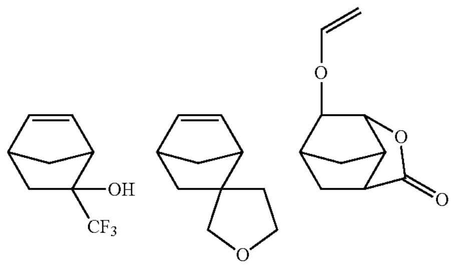
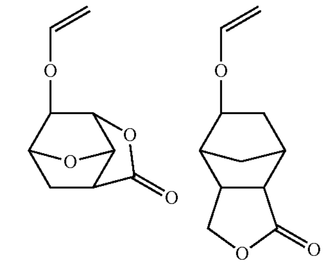
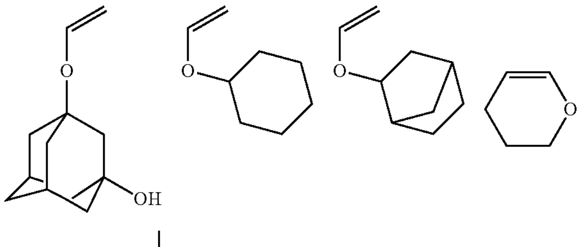
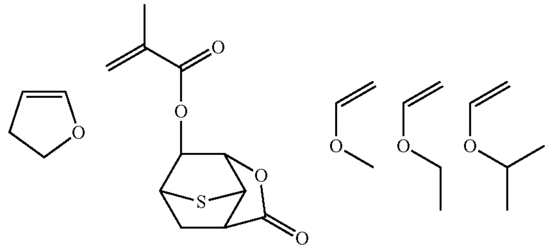
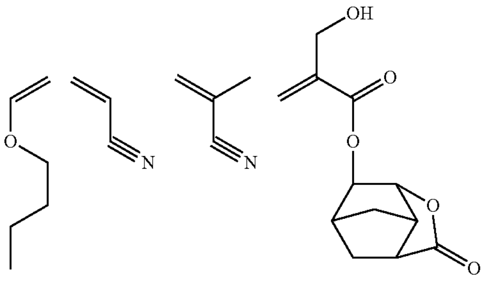
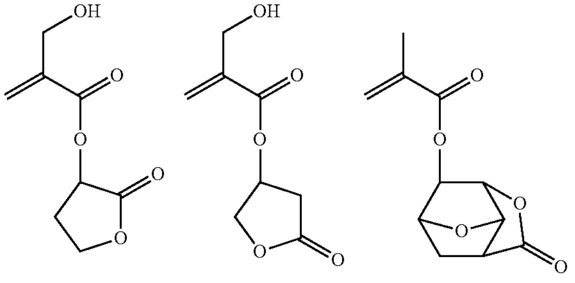

-continued
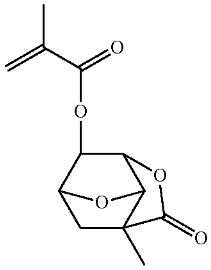
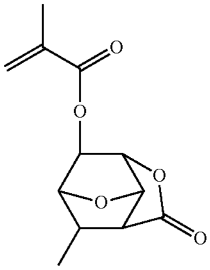
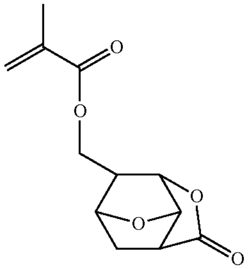
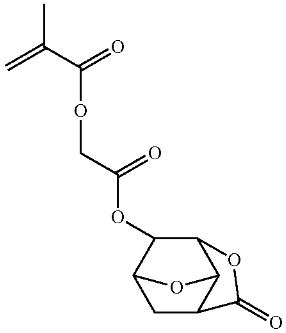
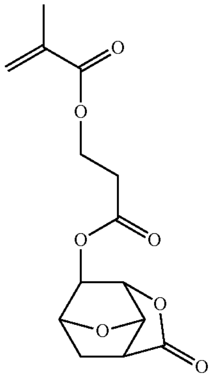
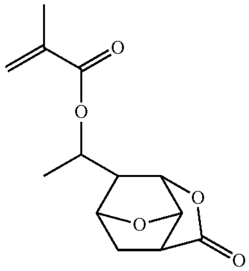
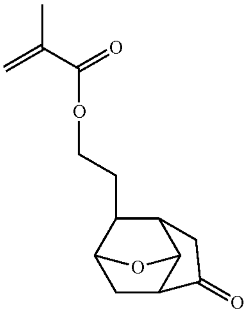
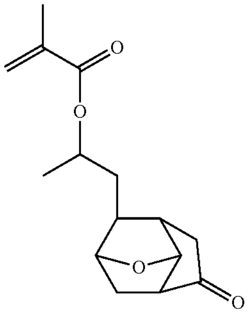
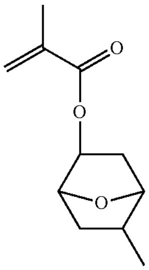
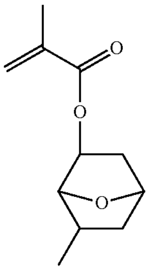
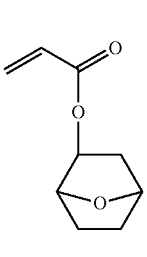
-continued
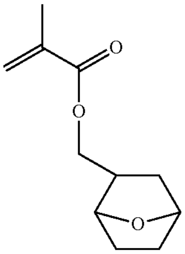
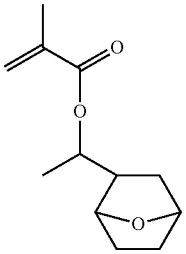
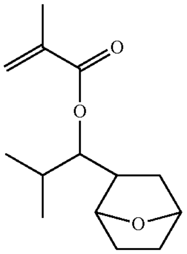
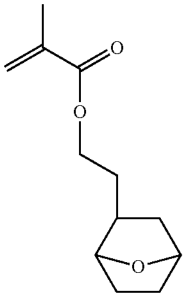
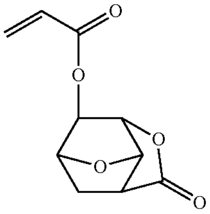
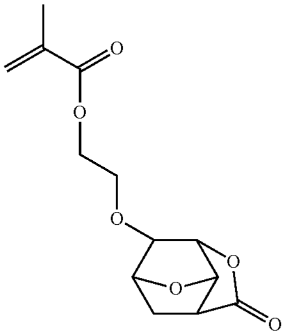
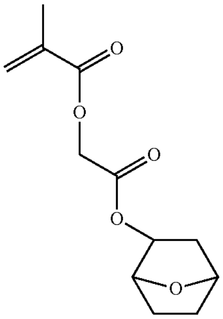
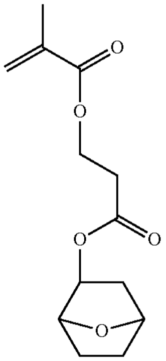
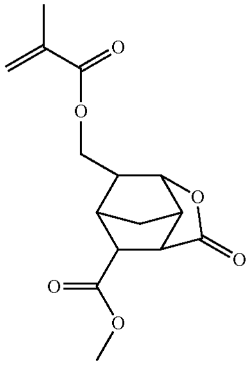
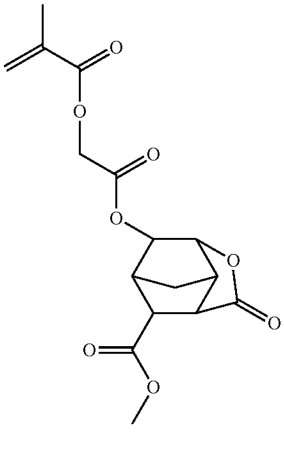
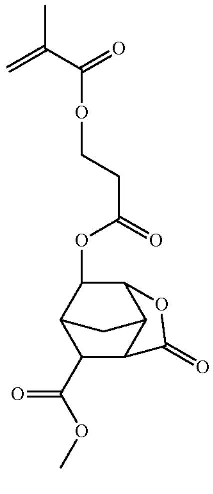

-continued
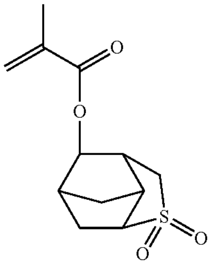
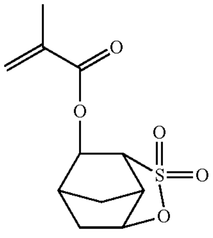
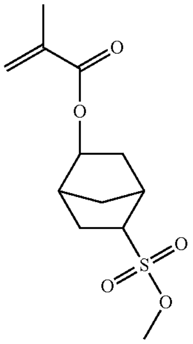
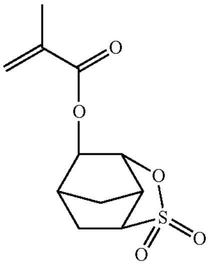
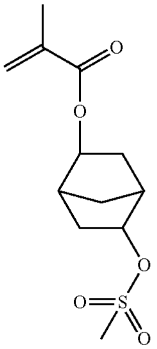
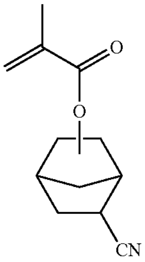
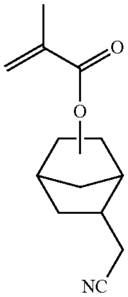
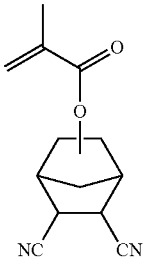
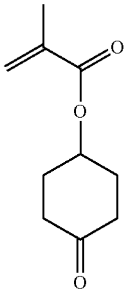
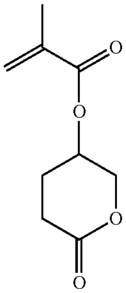
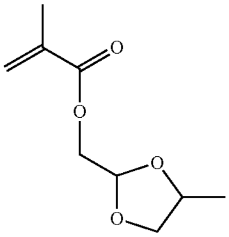
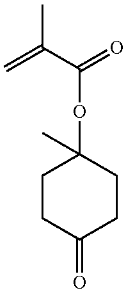
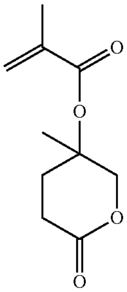
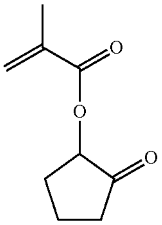
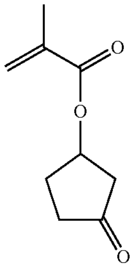
-continued
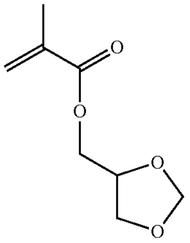
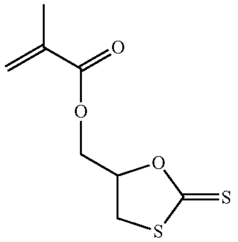
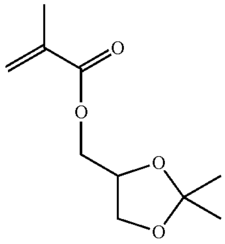
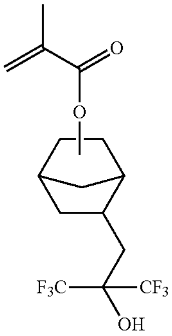
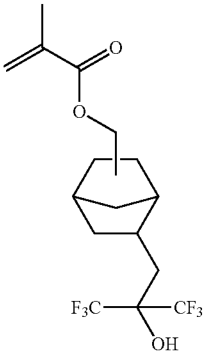
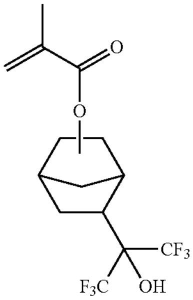
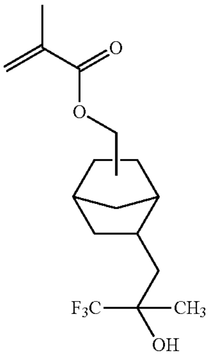
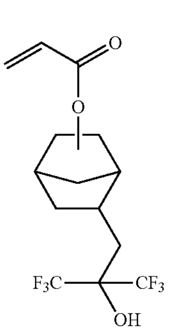
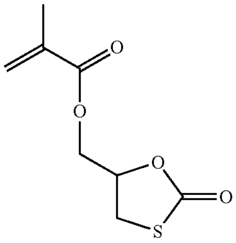
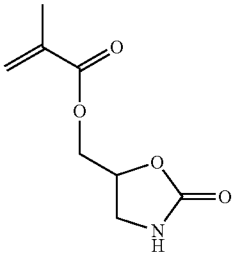

-continued
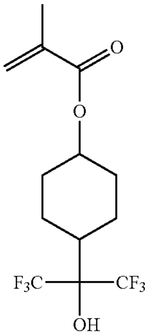
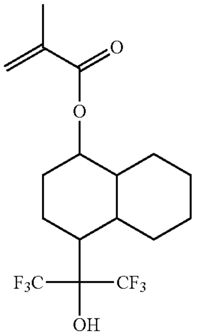
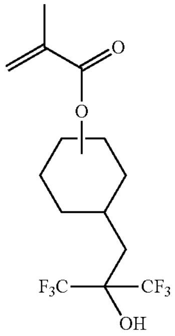
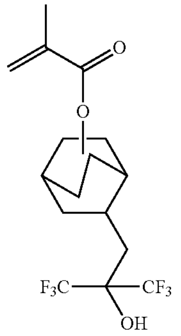
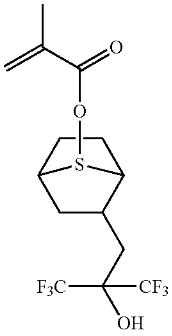
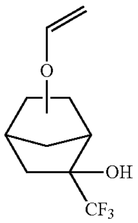
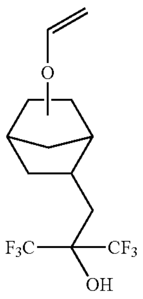
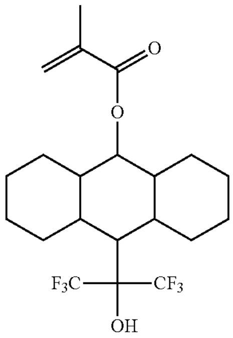
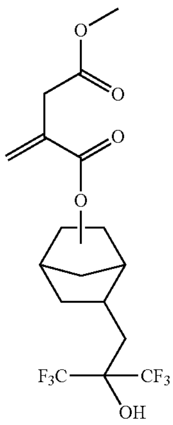
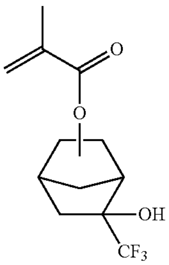
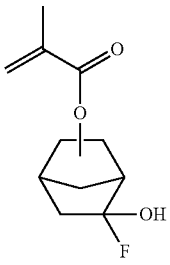
-continued
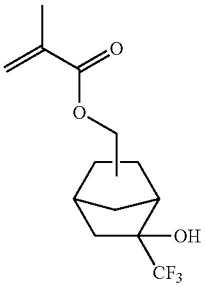
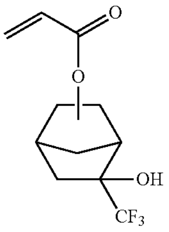
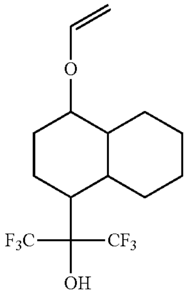
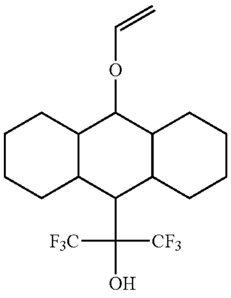
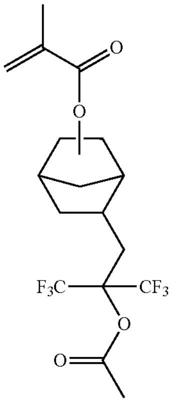
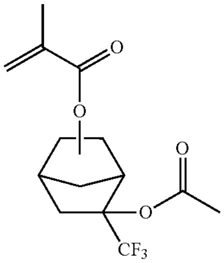
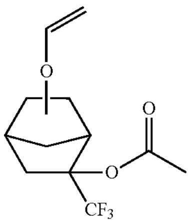
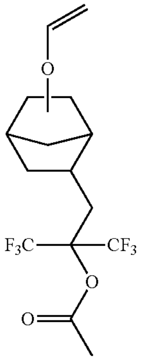
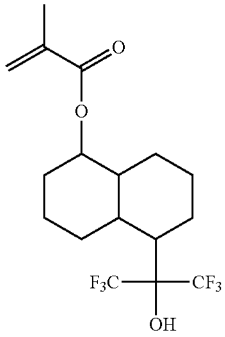
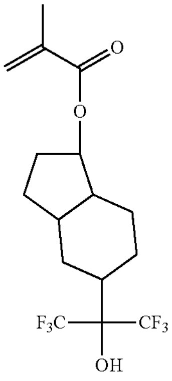
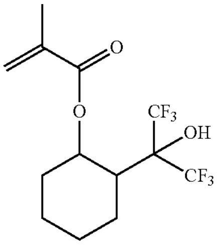
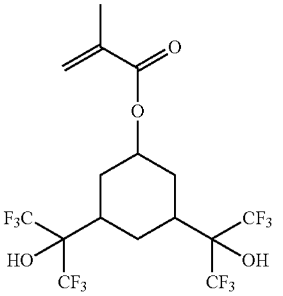

-continued
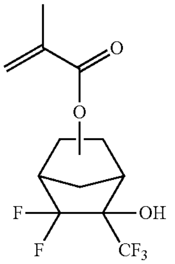
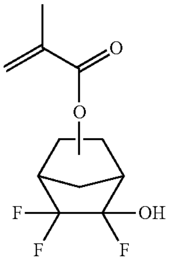
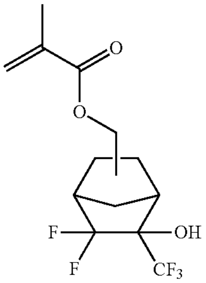
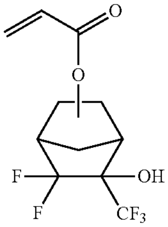
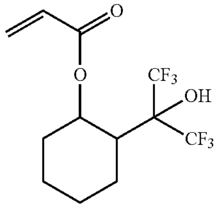
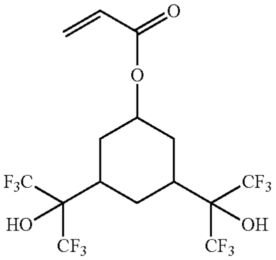
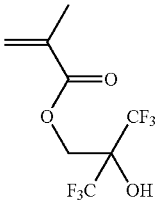
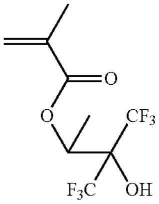
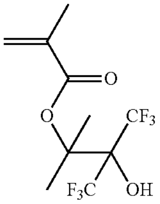
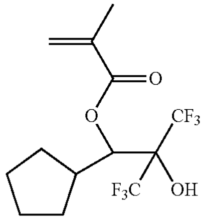
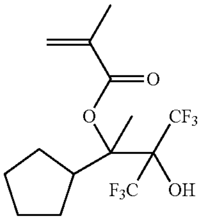
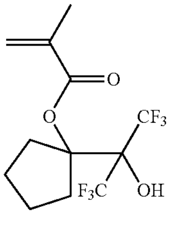
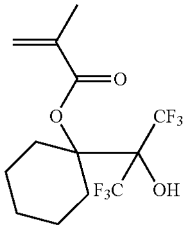
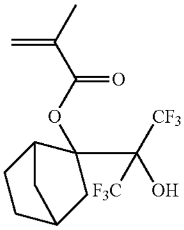
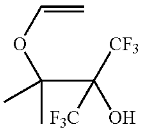
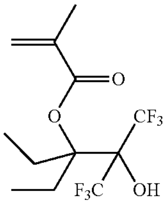
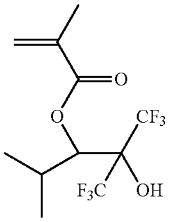
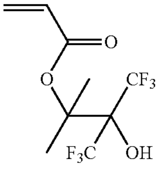
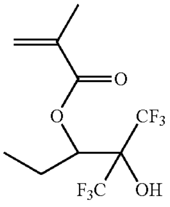
-continued
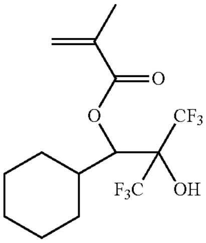
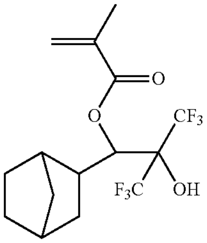
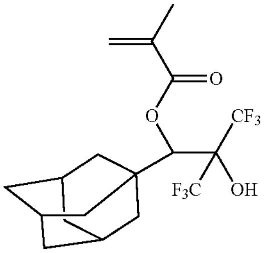
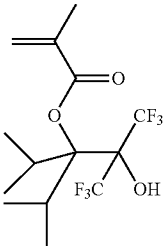
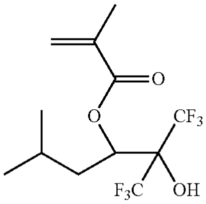
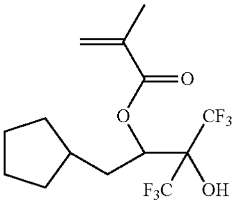
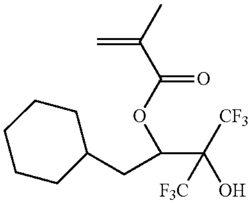
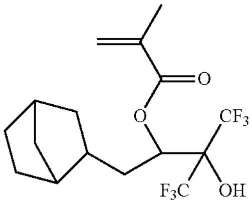
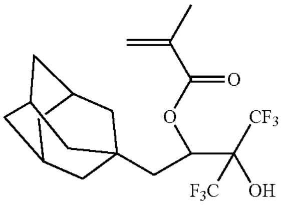
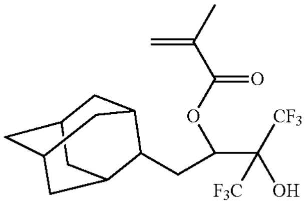
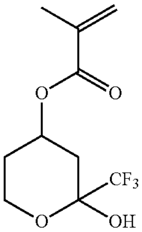
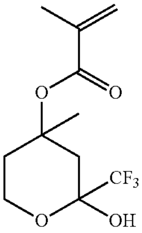
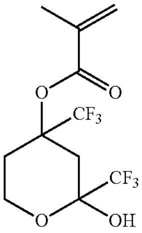
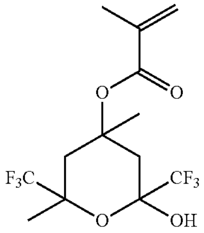

-continued
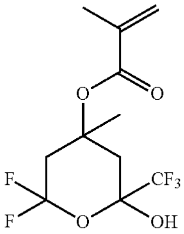
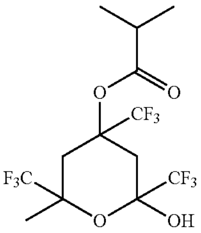
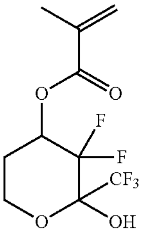
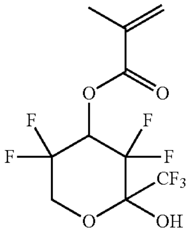
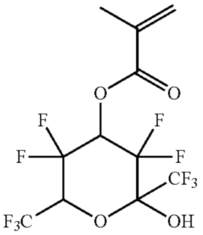
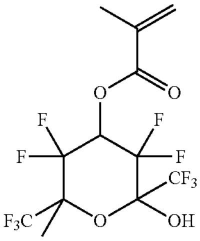
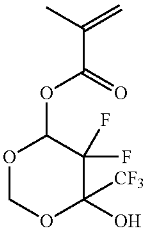
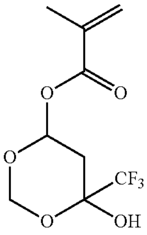
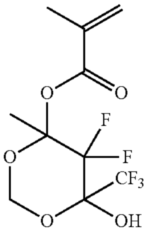
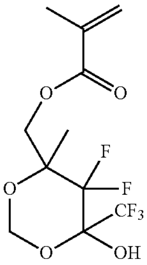
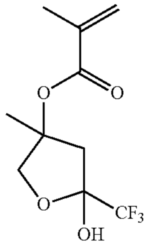
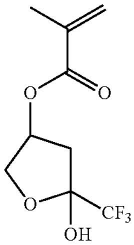
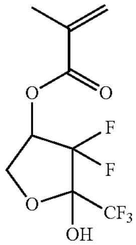
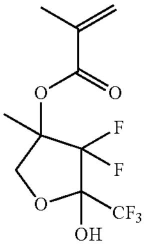
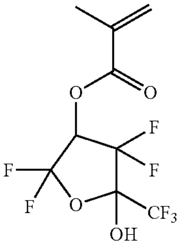
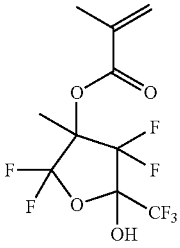
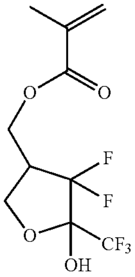
-continued
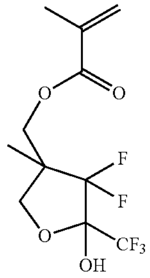
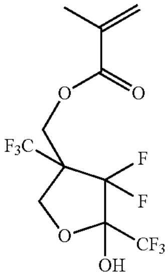
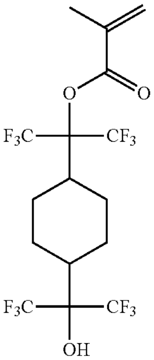
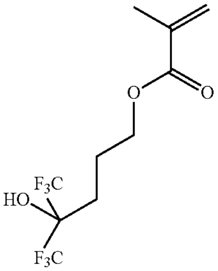
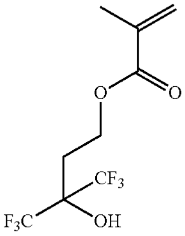
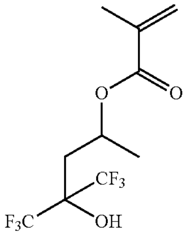
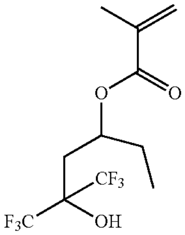
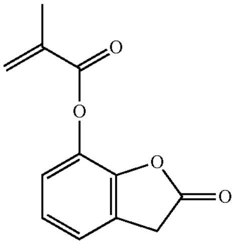
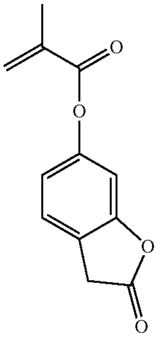
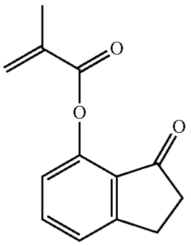
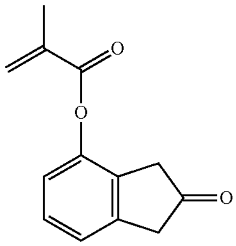

-continued
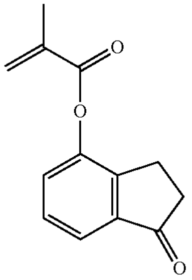
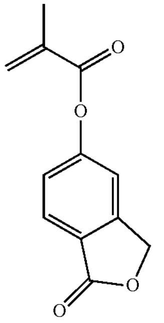
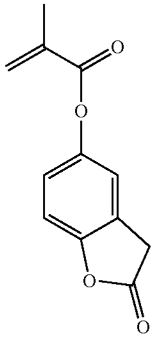
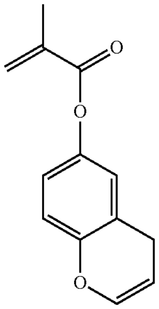
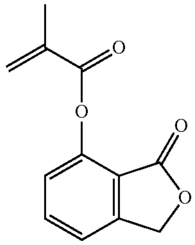
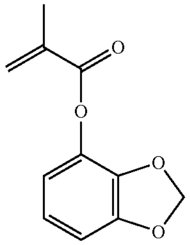
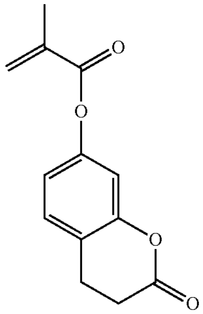
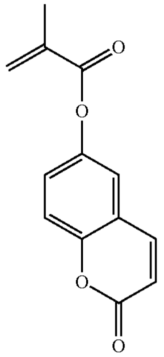
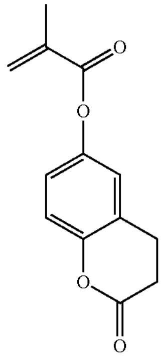
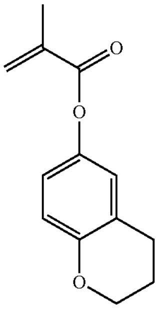
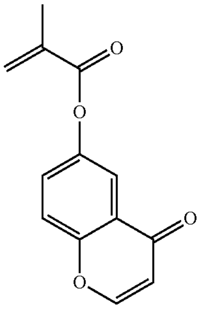
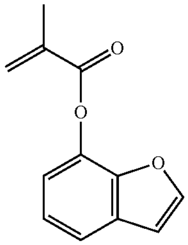
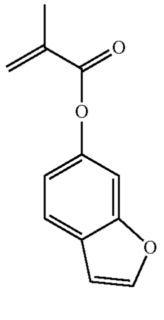
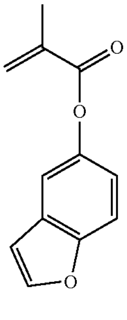
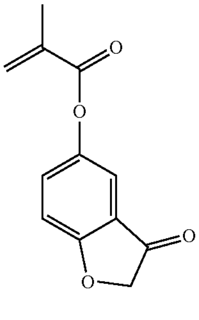
-continued
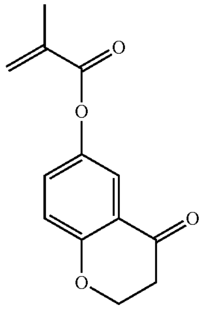
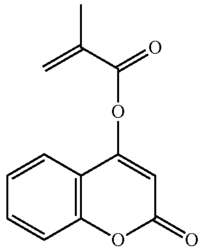
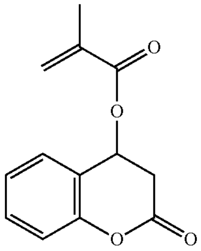
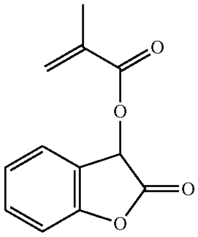
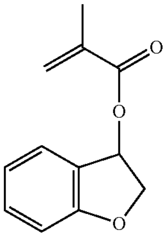
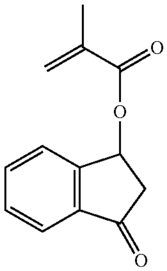
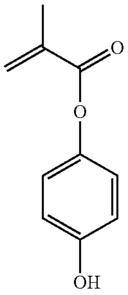
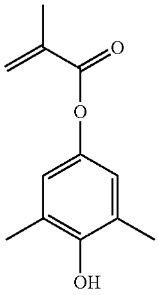
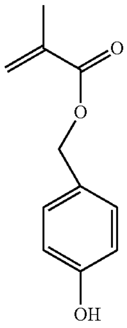
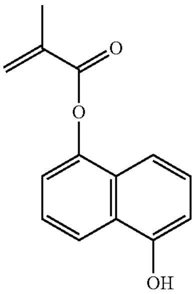
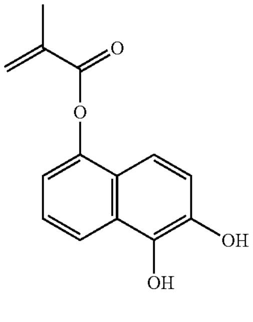
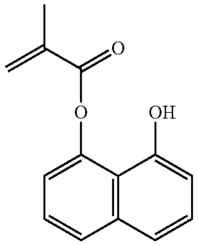

-continued
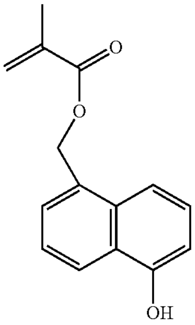
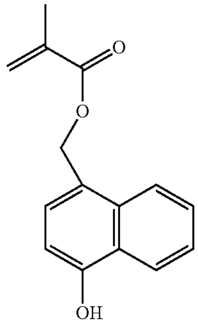
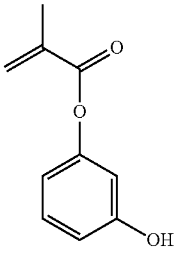
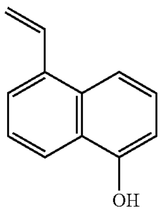
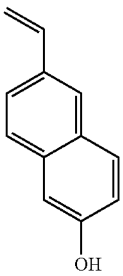
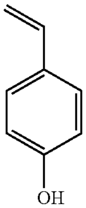
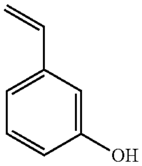
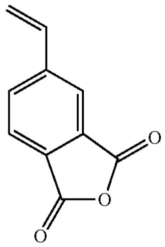
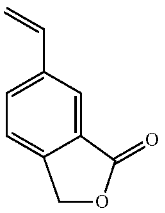
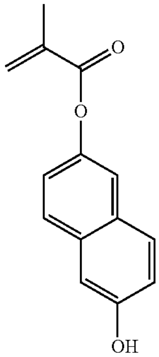
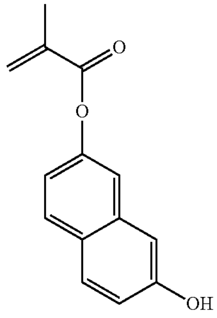
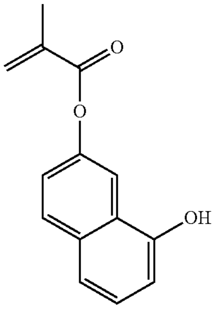
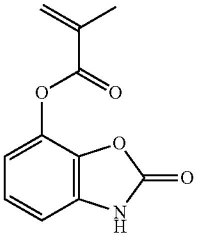
-continued
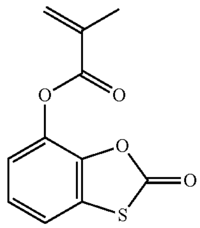
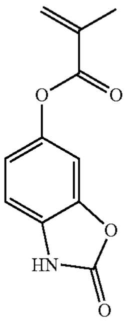
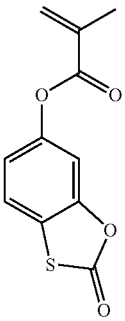
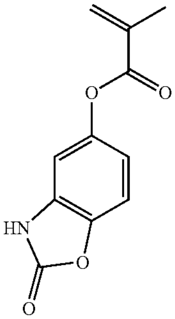
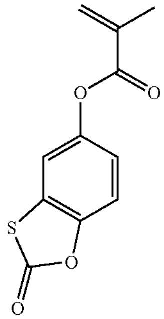
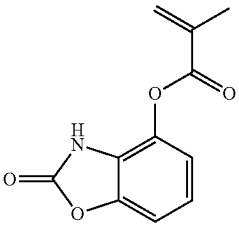
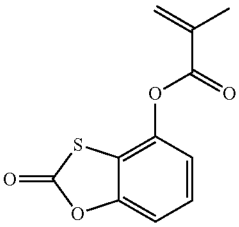
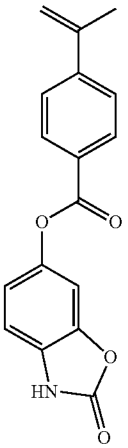
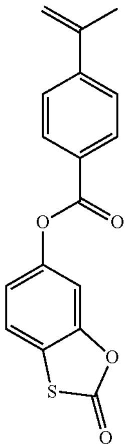
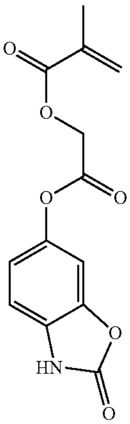
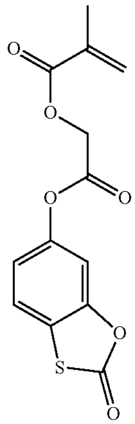

-continued

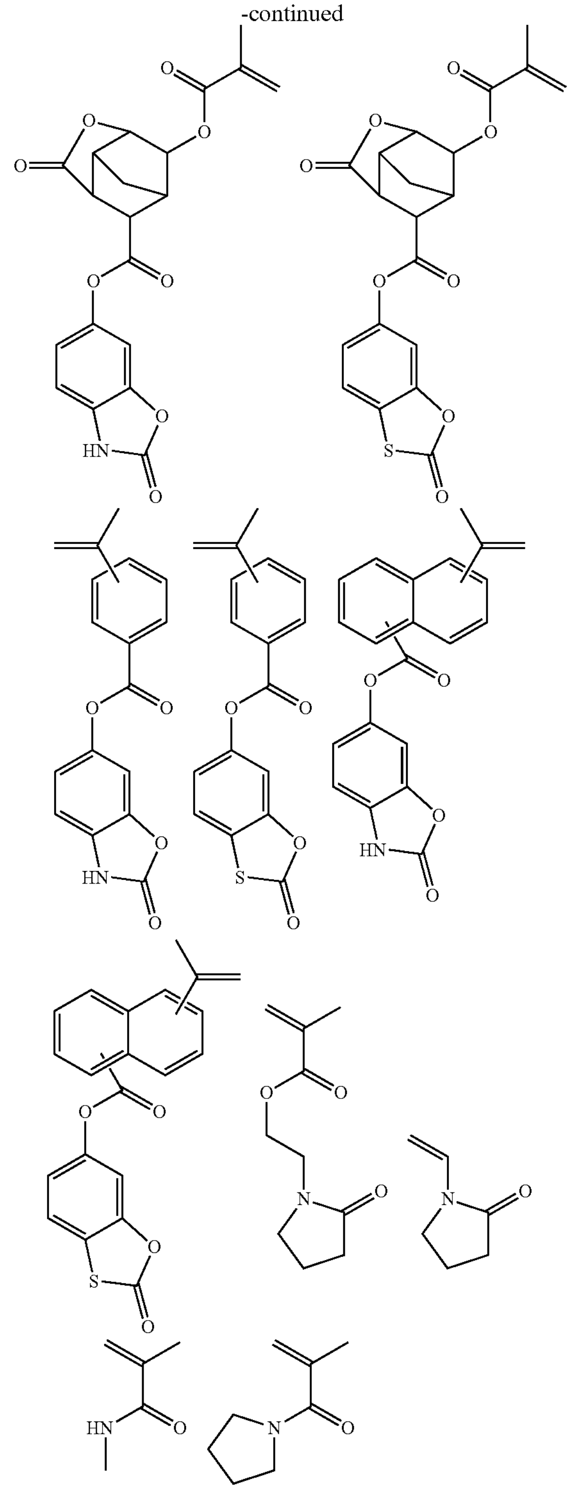

In the case of the monomer having a hydroxy group, the hydroxy group may be substituted by an acetal group that is easy to deprotect by an acid, such as an ethoxyethoxy group, and then, this may be deprotected by a weak acid and water after polymerization thereof; or alternatively, the hydroxy group may be substituted by an acetyl group, a formyl group, a pivaloyl group, or the like, and then, this may be subjected to an alkaline hydrolysis after polymerization thereof.

In the positive resist composition of the present invention, a repeating unit d1, d2, or d3, having the sulfonium salts shown by the following general formula (3), may be copolymerized. In the Japanese Patent Laid-Open Publication No. 2006-045311, a sulfonium salt and an iodonium salt having a polymerizable olefin, capable of generating a specific sulfonic acid, are proposed. In the Japanese Patent Laid-Open Publication No. 2006-178317, a sulfonium salt in which a sulfonic acid is directly bonded to a main chain is proposed.

(3)

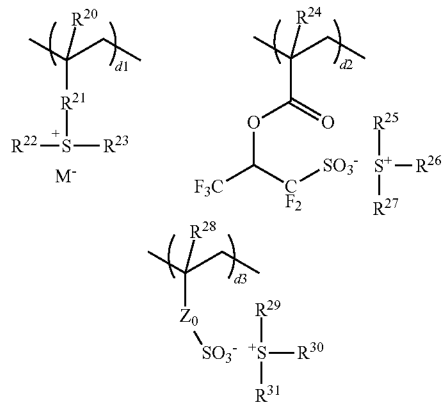

Wherein $R^{20}$, $R^{24}$, and $R^{28}$ represent a hydrogen atom or a methyl group; and $R^{21}$ represents a single bond, a phenylene group, —O—R—, or —C(═O)—$Y_0$—R—. $Y_0$ represents an oxygen atom or NH; and R represents a linear, a branched, or a cyclic alkylene group having 1 to 6 carbon atoms, an alkenylene group, or a phenylene group, wherein R may optionally contain a carbonyl group (—CO—), an ester group (—COO—), an ether group (—O—), or a hydroxy group. $R^{22}$, $R^{23}$, $R^{25}$, $R^{26}$, $R^{27}$, $R^{29}$, $R^{30}$, and $R^{31}$ are the same or different, representing a linear, a branched, or a cyclic alkyl group having 1 to 12 carbon atoms which may optionally contain a carbonyl group, an ester group, or an ether group, an aryl group having 6 to 12 carbon atoms, an aralkyl group or a thiophenyl group having 7 to 20 carbon atoms. $Z_0$ represents a single bond, a methylene group, an ethylene group, a phenylene group, a fluorinated phenylene group, —O—$R^{32}$—, or —C(═O)—$Z_1$—$R^{32}$—. $Z_1$ represents an oxygen atom or NH; $R^{32}$ represents a linear, a branched, or a cyclic alkylene group having 1 to 6 carbon atoms, an alkenylene group, or a phenylene group, wherein these may optionally contain a carbonyl group, an ester group, an ether group, or a hydroxy group; and $M^-$ represents a non-nucleophilic counter ion.

Note that, d1, d2, and d3 represent the numbers satisfying $0 \le d1 \le 0.5$, $0 \le d2 \le 0.5$, $0 \le d3 \le 0.5$, and $0 \le d1+d2+d3 \le 0.5$; while in the case of blending, the preferable numbers satisfy $0 < d1+d2+d3 \le 0.5$ and $0.2 \le a+b1+b2+c+d1+d2+d3 \le 1.0$.

By bonding an acid-generator to the polymer main chain, the acid diffusion can be made smaller so that deterioration of the resolution due to obscurity caused by the acid diffusion may be prevented from occurring. In addition, edge roughness (LER and LWR) may be improved because the acid generator is dispersed uniformly.

Illustrative example of the non-nucleophilic counter ion $M^-$ includes halide ions such as a chloride ion and a bromide ion; fluoroalkylsulfonates such as triflate, 1,1,1-trifluoroethanesulfonate, and nonafluorobutanesulfonate; arylsulfonates such as tosylate, benzenesulfonate, 4-fluorobenzenesulfonate, and 1,2,3,4,5-pentafluorobenzenesulfonate;

alkylsulfonates such as mesylate and butanesulfonate; imides such as bis(trifluoromethylsulfonyl)imide, bis(perfluoroethylsulfonyl)imide, and bis(perfluorobutylsulfonyl)imide; and methide acids such as tris(trifluoromethylsulfonyl)methide and tris(perfluoroethylsulfonyl)methide.

In addition, a sulfonate whose α-position shown in the following general formula (K-1) is fluoro-substituted and a sulfonate whose α-position and β-position shown in the following general formula (K-2) are fluoro-substituted may be mentioned.

$$R^{102}—F_2C—SO_3^- \quad (K\text{-}1)$$

(K-2)

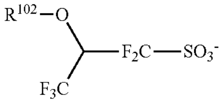

In the general formula (K-1), $R^{102}$ represents a hydrogen atom, or a linear, a branched, or a cyclic alkyl group having 1 to 20 carbon atoms, an alkenyl group having 2 to 20 carbon atoms, or an aryl group having 6 to 20 carbon atoms, wherein these groups may optionally contain an ether group, an ester group, a carbonyl group, a lactone ring, or a fluorine atom.

In the general formula (K-2), $R^{103}$ represents a hydrogen atom, or a linear, a branched, or a cyclic alkyl group, an acyl group having 1 to 30 carbon atoms, an alkenyl group having 2 to 20 carbon atoms, an aryl group or an aryloxy group having 6 to 20 carbon atoms, wherein these groups may optionally contain an ether group, an ester group, a carbonyl group, or a lactone ring.

Alternatively, repeating units "e" such as indene e1, acenaphthylene e2, chromone e3, cumarine e4, and norbonadiene e5, shown by the following general formula (4), may be copolymerized.

(4)

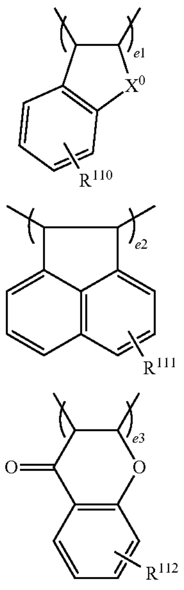

-continued

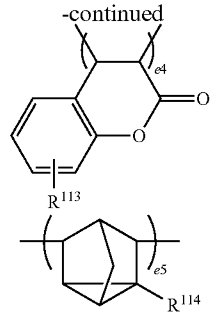

wherein $R^{110}$ to $R^{114}$ represent a hydrogen atom, an alkyl group having 1 to 30 carbon atoms or an alkyl group a part or all of which is substituted with a halogen atom, a hydroxy group, an alkoxy group, an alkanoyl group, an alkoxycarbonyl group, an aryl group having 6 to 10 carbon atoms, a halogen atom, or a 1,1,1,3,3,3-hexafluoro-2-propanol group. $X^0$ represents a methylene group, an oxygen atom, or a sulfur atom; e1 represents a number satisfying $0 \le e1 \le 0.5$, e2 represents a number satisfying $0 \le e2 \le 0.5$, e3 represents a number satisfying e4 represents a number satisfying $0 \le e4 \le 0.5$, e5 represents a number satisfying $0 \le e5 \le 0.5$, and $0 < e1+e2+e3+e4+e5 \le 0.5$.

Illustrative example of the repeating unit "f" that can be copolymerized other than the repeating units "a", "b", "c", "d", and "e" includes styrene, vinyl naphthalene, vinyl anthracene, vinyl pyrene, and methylene indane.

To synthesize these polymer compounds, one method thereof is a thermal polymerization of intended monomers selected from the monomers to give the repeating units "a" to "f" in the presence of a radical polymerization initiator in an organic solvent to obtain a copolymer compound.

Illustrative example of the organic solvent used in the polymerization includes toluene, benzene, tetrahydrofuran, diethyl ether, dioxane, cyclohexane, cyclopentane, methyl ethyl ketone, and γ-butyrolactone. Illustrative example of the polymerization initiator includes 2,2'-azobisisobutyronitrile (AIBN), 2,2'-azobis(2,4-dimethylvaleronitrile), dimethyl 2,2-azobis(2-methylpropionate), benzoyl peroxide, and lauroyl peroxide. The polymerization may be done preferably by heating in the temperature range of 50 to 80° C., and for the time range of 2 to 100 hours, or preferably in the range of 5 to 20 hours.

In the case that hydroxy styrene or hydroxy vinyl naphthalene is copolymerized, there is a method wherein acetoxy styrene or acetoxy vinyl naphthalene, in place of hydroxy styrene or hydroxy vinyl naphthalene, is used for polymerization, followed by deprotection of these acetoxy groups by an alkaline hydrolysis to obtain polyhydroxystyrene or hydroxy polyvinyl naphthalene.

As to the base for the alkaline hydrolysis, an aqueous ammonia, triethylamine, and the like may be used. The reaction temperature is in the range of −20 to 100° C., or preferably in the range of 0 to 60° C.; and the reaction time is in the range of 0.2 to 100 hours, or preferably in the range of 0.5 to 20 hours.

Here, the ratios of the repeating units "a" to "d" satisfy: $0 < a < 1.0$, $0 \le b1 < 1.0$, $0 \le b2 < 1.0$, $0.1 \le b1+b2 < 1.0$, $0 \le c \le 0.9$, $0 \le d1 \le 0.5$, $0 \le d2 \le 0.5$, and $0 \le d3 \le 0.5$, and $0 \le d1+d2+d3 \le 0.5$; preferably $0.02 \le a \le 0.9$, $0 \le b1 \le 0.8$, $0 \le b2 \le 0.8$, $0.1 \le b1+b2 \le 0.8$, $0.1 \le c \le 0.9$, $0 \le d1 \le 0.4$, $0 \le d2 \le 0.4$, $0 \le d3 \le 0.4$, and $0 \le d1+d2+d3 \le 0.4$; more preferably $0.01 \le a \le 0.7$, $0 \le b1 \le 0.7$, $0 \le b2 \le 0.7$, $0.1 \le b1+b2 \le 0.75$, $0.15 \le c \le 0.8$, $0 \le d1 \le 0.3$, $0 \le d2 \le 0.3$, $0 \le d3 \le 0.3$, and $0 \le d1+d2+d3 \le 0.4$; or still more preferably $0.03 \le a \le 0.5$, $0 \le b1 \le 0.65$, $0 \le b2 \le 0.65$, $0.1 \le b1+b2 \le 0.70$, $0.20 \le c \le 0.8$, $0 \le d1 \le 0.2$, $0 \le d2 \le 0.2$, $0 \le d3 \le 0.2$, and $0 \le d1+d2+d3 \le 0.25$.

The ratios of the repeating units "e" and "f" satisfy: $0 \le e1 \le 0.5$, $0 \le e2 \le 0.5$, $0 \le e3 \le 0.5$, $0 \le e4 \le 0.5$, and $0 \le e5 \le 0.5$; preferably $0 \le e1 \le 0.4$, $0 \le e2 \le 0.4$, $0 \le e3 \le 0.4$, $0 \le e4 \le 0.4$, and $0 \le e5 \le 0.4$; or more preferably $0 \le e1 \le 0.3$, $0 \le e2 \le 0.3$, $0 \le e3 \le 0.3$, $0 \le e4 \le 0.3$, and $0 \le e5 \le 0.3$; and $0 \le f \le 0.5$, preferably $0 \le f \le 0.4$, or more preferably $0 \le f \le 0.3$.

Meanwhile, $a+b1+b2+c+d1+d2+d3+e1+e2+e3+e4+e5+f=1$ is preferable.

In the polymer compounds used in the positive resist composition of the present invention, the weight-average molecular weight of each of them is in the range of 1,000 to 500,000, or preferably in the range of 2,000 to 30,000. If the weight-average molecular weight is less than 1,000, heat resistance of the resist composition becomes poor, while the weight-average molecular weight is more than 500,000, solubility thereof in the alkaline solution becomes poor thereby leading to readily causing a footing profile after patterning.

Note that, the weight-average molecular weight (Mw) is the polystyrene-equivalent value measured by a gel permeation chromatography (GPC) using tetrahydrofuran (THF) as the solvent.

In the polymer compound used in the positive resist composition of the present invention, if the molecular weight distribution (Mw/Mn) of the multicomponent copolymer is narrow, there are no problems of foreign matters on the pattern or deterioration of the pattern form after the photo-exposure caused by a polymer of a low molecular weight or a high molecular weight. Accordingly, in order to obtain the resist composition advantageously usable for a fine pattern size, the molecular weight distribution of the multicomponent polymer compound to be used is preferably in the range of 1.0 to 2.0, in particular in the narrow range of 1.0 to 1.5, because influences of the molecular weight and the molecular weight distribution tend to become more significant as the pattern rule progresses toward further miniaturization.

Alternatively, it is also possible to blend two or more polymers which are different in their composition ratios, molecular weight distributions, or molecular weights, or to blend with a polymer not copolymerized with the repeating unit "a" shown by the general formula (1).

The polymer compound used in the positive resist composition of the present invention is suitable as the base resin of the positive resist composition; and thus, if this polymer compound is used as the base resin and is blended in an appropriate combination with an organic solvent, an acid-generator, a dissolution control agent, a basic compound, a surfactant, and so forth in accordance with the intended purpose to obtain a positive resist composition, the dissolution rate of this polymer compound into a developer by a catalytic reaction thereof is enhanced in the exposed part, thereby leading to a highly sensitive positive resist composition; as a result, the dissolution contrast and the resolution of the resist film can be made high, a large exposure margin can be realized, and an excellent process adaptability can be obtained. Accordingly, a further excellent etching resistance can be obtained while having a good pattern form after the photo-exposure; and especially the acid diffusion can be suppressed thereby leading to reduction in the coarse-dense size difference. Because of all the above-mentioned advantageous effects, this positive resist composition is of highly practical value and can be a highly effective resist composition for the VLSI. Especially, a chemically amplifying positive resist composition utilizing an acid catalyst reaction by incorporating an acid-generator thereinto is extremely useful because sensitivity and various properties thereof can be improved furthermore.

By blending a dissolution control agent into the positive resist composition of the present invention, difference in the dissolution rates between the exposed part and the unexposed part becomes further larger, so that the resolution can be enhanced furthermore.

Further, by adding a basic compound, for example, the acid diffusion rate in the resist film can be suppressed, and the resolution can be enhanced furthermore; and by blending a surfactant, coating property of the resist composition can be enhanced furthermore or controlled more appropriately.

The positive resist composition of the present invention may contain an acid-generator so as to function as the chemically amplifying positive resist composition for the patterning process of the present invention; and thus, a compound capable of generating an acid, for example, by responding to an active beam or a radiation beam (photo acid generator) may be contained therein. The photo acid generator component is not particularly restricted so far as the compound can generate an acid by exposure to a high energy beam. Illustrative example of the suitable photo acid generator includes a sulfonium salt, an iodonium salt, a sulfonyl diazomethane, an N-sulfonyloxyimide, and an oxime-O-sulfonate. These will be explained in more detail below, wherein they can be used solely or as a mixture of two or more of them.

Specific examples of the acid-generator are described in the paragraphs [0122] to [0142] of the Japanese Patent Laid-Open Publication No. 2008-111103.

As mentioned above, the positive resist composition of the present invention can further contain any one or more of an organic solvent, a basic compound, a dissolution control agent, a surfactant, and an acetylene alcohol.

Specific examples of the organic solvent are described in the paragraphs [0144] to [0145] of the Japanese Patent Laid-Open Publication No. 2008-111103; similarly, the basic compounds in the paragraphs [0146] to [0164] of the same; the surfactants in the paragraphs [0165] to [0166] of the same; the dissolution control agent in the paragraphs [0155] to [0178] of the Japanese Patent Laid-Open Publication No. 2008-122932; and the acetylene alcohols in the paragraphs [0179] to [0182] of the same. Alternatively, a polymer-type quencher described in the Japanese Patent Laid-Open Publication No. 2008-239918 may also be added. This quencher is orientated on the resist surface after coating, thereby leading to enhancement of the resist rectangularity after patterning. The polymer-type quencher also has the effects to prevent film loss of the pattern when a top coat is formed on the resist as well as rounding of the pattern head from occurring.

Meanwhile, blending amount of the acid-generator is preferably in the range of 0.01 to 100 parts by mass, in particular in the range of 0.1 to 80 parts by mass, relative to 100 parts by mass of the base resin; and blending amount of the organic solvent is preferably in the range of 50 to 10,000 parts by mass, in particular in the range of 100 to 5,000, relative to 100 parts by mass of the base resin. Preferable blending amounts of others relative to 100 parts by mass of the base resin are; in the range of 0 to 50 parts by mass, in particular in the range of 0 to 40 parts by mass, for the dissolution control agent; in the range of 0 to 100 parts by mass, in particular in the range of 0.001 to 50 parts by mass, for the basic compound; and in the range of 0 to 10 parts by mass, in particularly in the range of 0.0001 to 5 parts by mass, for the surfactant.

In the case that the positive resist composition of the present invention, for example, the chemically amplifying positive resist composition comprising an organic solvent, a polymer compound containing the repeating unit having the cyclopentadienyl complex shown by the general formula (1) and the repeating unit having the acid-labile group, an acid-generator, a basic compound, and so forth, is used for manufacturing of various integrated circuits, heretofore known lithography technologies not particularly restricted may be used.

For example, the positive resist composition of the present invention is applied onto a substrate for the integrated circuit manufacturing (Si, $SiO_2$, SiN, SiON, TiN, WSi, BPSG, SOG, an organic anti-reflective film, and so forth) or onto a substrate for the mask circuit manufacturing (Cr, CrO, CrON, MoSi, and so forth) by an appropriate coating method including a spin coating method, a roll coating method, a flow coating method, a dip coating method, a spray coating method, and a doctor coating method, so as to give the film thickness of 0.1 to 2.0 μm. This is then pre-baked on a hot plate in the temperature range of 60 to 150° C. and for the time range of 10 seconds to 30 minutes, or preferably in the temperature range of 80 to 120° C. and for the time range of 30 seconds to 20 minutes. A top coat may be formed on the resist film. The top coat is preferably of the type that is soluble in an alkaline developer, so that the top coat may be removed simultaneously with formation of the resist pattern during development. The top coat has functions to reduce amount of the outgoing gas from the resist film, to act as a filter to cut the out of the bound light in the wavelength range of 140 to 300 nm except for the beam with the wavelength of 13.5 nm emitted from an EUV laser, to suppress the enlarged head of the resist form as well as the film loss caused by an environmental effect, and so forth. Then, the intended pattern is exposed directly or through a prescribed mask to the light source selected from a UV beam, a far UV beam, an electron beam, a X-ray beam, an excimer laser beam, a γ-beam, a synchrotron radiation beam, a vacuum UV beam (soft X-ray beam), and the like. The exposure is preferably done such that the exposure amount may be in the range of about 1 to about 200 $mJ/cm^2$, in particular in the range of 10 to 100 $mJ/cm^2$, or in the range of 0.1 to 100 $\mu C/cm^2$, in particular about 0.5 to about 50 $\mu C/cm^2$. Thereafter, the post exposure bake (PEB) is done on a hot plate in the temperature range of 60 to 150° C. and for the time range of 10 seconds to 30 minutes, or preferably in the temperature range of 80 to 120° C. and for the time range of 30 seconds to 20 minutes.

Then, by using an aqueous alkaline developer such as tetramethylammonium hydroxide (TMAH), tetraethylammonium hydroxide (TEAH), tetrapropylammonium hydroxide (TPAH), and tetrabutylammonium hydroxide (TBAH), with the concentrations thereof being in the range of 0.1 to 10% by mass, or preferably in the range of 2 to 5% by mass, development is done for the time range of 3 seconds to 3 minutes, or preferably for the time range of 5 seconds to 2 minutes by a usual method such as a dipping method, a puddle method, and a spray method, whereby dissolving the photo-exposed part into the developer, while not dissolving the unexposed part, so that the intended positive pattern is formed on the substrate. Note that, the resist composition of the present invention is especially useful for fine patterning by the g-beam of the wavelength 430 nm, the i-beam of the wavelength of 365 nm, the KrF excimer laser beam of the wavelength of 248 nm, the electron beam, or the soft X-ray with the wavelength range of 3 to 15 nm, among the high energy beams.

As compared with the generally and widely used aqueous TMAH solution, TEAH, TPAH, and TBAH, all these having a longer alkyl chains, swell less during development thereby having an effect to prevent the pattern fall from occurring. In the Japanese Patent No. 3429592, an example of using the aqueous TBAH solution is shown to develop a polymer not having a hydrophilic group thereby having a high water-repellent property obtained by copolymerizing a monomer giving a repeating unit having an alicyclic structure such as adamantyl methacrylate with a monomer giving a repeating unit having an acid-labile group such as t-butyl methacrylate.

As to the developer using tetramethylammonium hydroxide (TMAH), an aqueous solution with the concentration thereof being 2.38% by mass is most widely used. This concentration corresponds to 0.26 N; and it is preferable that the same normality be used for the aqueous solutions of TEAH, TPAH, and TBAH. To obtain 0.26 N, concentrations of TEAH, TPAH, and TBAH are 3.84% by mass, 5.31% by mass, and 6.78% by mass, respectively.

In the pattern with the resolution size of 32 nm or less with EB or EUV, the phenomena such as a quirked line, clinging of lines, and fall of the clung line take place. It is considered that this occurs because the lines are swollen during development so that the swollen lines are clung with each other. The swollen lines are so soft like a sponge having the developer therein that they fall down easily by a stress during rinsing. Accordingly, the developers having longer alkyl chains are difficult to be swollen thereby effective to prevent the pattern fall from occurring.

After completion of the development, rinsing is carried out. As to the rinsing solution, a solvent miscible with the developer while not dissolving the resist film is preferable. Preferable example of the solvent like this includes an alcohol having 3 to 10 carbon atoms; an ether compound having 8 to 12 carbon atoms; and an alkane, an alkene, an alkyne, and an aromatic solvent, having 6 to 12 carbon atoms.

Specific example of the alkane having 6 to 12 carbon atoms includes hexane, heptane, octane, nonane, decane, undecane, dodecane, methylcyclopentane, dimethylcyclopentane, cyclohexane, methylcyclohexane, dimethylcyclohexane, cycloheptane, cyclooctane, and cyclononane. Specific example of the alkene having 6 to 12 carbon atoms includes hexene, heptene, octene, cyclohexane, methylcyclohexene, dimethylcyclohexene, cycloheptene, and cyclooctene; specific example of the alkyne having 6 to 12 carbon atoms includes hexyne, heptyne, and octyne; specific example of the alcohol having 3 to 10 carbon atoms includes n-propyl alcohol, isopropyl alcohol, 1-butyl alcohol, 2-butyl alcohol, isobutyl alcohol, tert-butyl alcohol, 1-pentanol, 2-pentanol, 3-pentanol, tert-amyl alcohol, neopentyl alcohol, 2-methyl-1-butanol, 3-methyl-1-butanol, 3-methyl-3-pentanol, cyclopentanol, 1-hexanol, 2-hexanol, 3-hexanol, 2,3-dimethyl-2-butanol, 3,3-dimethyl-1-butanol, 3,3-dimethyl-2-butanol, 2-ethyl-1-butanol, 2-methyl-1-pentanol, 2-methyl-2-pentanol, 2-methyl-3-pentanol, 3-methyl-1-pentanol, 3-methyl-2-pentanol, 3-methyl-3-pentanol, 4-methyl-1-pentanol, 4-methyl-2-pentanol, 4-methyl-3-pentanol, cyclohexanol, and 1-octanol.

As to the ether compound having 8 to 12 carbon atoms, one or more solvents selected from di-n-butyl ether, diisobutyl ether, di-sec-butyl ether, di-n-pentyl ether, diisopentyl ether, di-sec-pentyl ether, di-t-amyl ether, and di-n-hexyl ether may be mentioned.

In addition to the foregoing solvents, aromatic solvents including toluene, xylene, ethylbenzene, isopropylbenzene, t-butylbenzene, and mesitylene may be used.

Further in the present invention, it is preferable that the resist pattern after development be cured by baking it in the temperature range of 130 to 300° C. and for the time range of 5 to 1000 seconds. By carrying out the post-baking under the conditions as mentioned above, the developer and the rinsing solution can be evaporated thereby securing the cure of the pattern of the resist film, so that adhesion with the substrate can be strengthened furthermore.

EXAMPLES

Hereinafter, the present invention will be explained specifically by showing Synthesis Examples, Comparative Synthesis Examples, Examples, and Comparative Examples; but the present invention is not limited to the following Examples.

Adhesive Monomer 1 and PAG Monomer 1 used in Synthesis Examples of the present invention are as following.

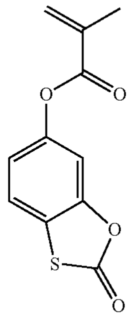 [SMILES: C=C(C)C(=O)Oc1ccc2sc(=O)oc2c1]

Adhesive Monomer 1: (2-oxo-1,3-benzooxathiol-5-yl) methacrylate

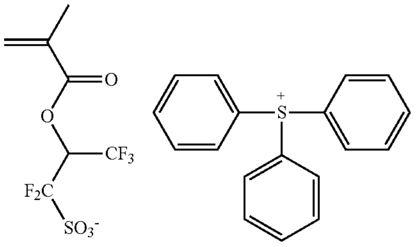

PAG Monomer 1: triphenylsulfonium 1,1,3,3,3-pentafluoro-2-methacryloyloxypropane-1-sulfonate

Synthesis Example 1

Into a 2-L flask were taken 5.5 g of 3-ethyl-3-exotetracyclo[4.4.0.1$^{2,5}$.1$^{7,10}$]dodecanyl methacrylate, 2.1 g of vinyl ferrocene, 11.4 g of 4-acetoxy styrene, and 40 g of tetrahydrofuran as a solvent. After this reactor was cooled under the nitrogen atmosphere to −70° C., this was degassed under vacuum and then blown by the nitrogen gas; this operation was repeated for three times. After the temperature was raised to room temperature, 1.2 g of AIBN (azobisisobutyronitrile) was added thereinto as the polymerization initiator; and then, after the temperature of the resulting mixture was raised to 60° C., the reaction was carried out for 15 hours. After this reaction solution was poured into 1-L of isopropyl alcohol for precipitation, the obtained white solid was dissolved again into the mixed solvent of 100 mL of methanol and 200 mL of tetrahydrofuran; and then, the deprotection reaction of the acetyl group was carried out at 70° C. for 5 hours with the addition of 10 g of triethylamine and 10 g of water. After the reaction solution was neutralized by acetic acid and then concentrated, the resulted residue was dissolved in 100 mL of acetone; and then, precipitation similarly to the above-mentioned operation, filtration, and drying at 60° C. were carried out in turn to obtain a white polymer. This obtained polymer was analyzed by $^{13}$C-NMR, $^{1}$H-NMR, and GPC to obtain the following analysis results.

Copolymer composition ratio (molar ratio): 3-Ethyl-3-exotetracyclo[4.4.0.1$^{2,5}$.1$^{7,10}$]dodecanyl methacrylate:vinyl ferrocene:4-hydroxystyrene=0.20:0.15:0.65

Weight-average molecular weight (Mw): 7,400

Molecular weight distribution (Mw/Mn): 1.76

This polymer compound is designated as Polymer 1.

Polymer 1

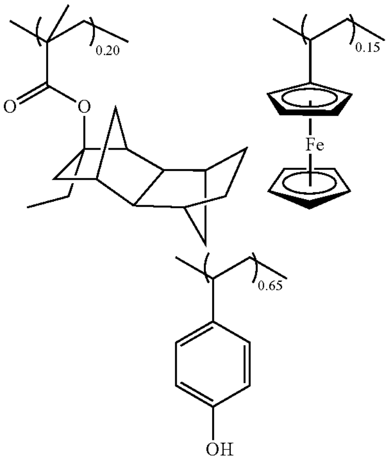

Synthesis Example 2

Into a 2-L flask were taken 5.7 g of 4-amyloxy styrene, 2.6 g of vinyl ruthenocene, 10.5 g of 4-acetoxy styrene, and 40 g of tetrahydrofuran as a solvent. After this reactor was cooled under the nitrogen atmosphere to −70° C., this was degassed under vacuum and then blown by the nitrogen gas; this operation was repeated for three times. After the temperature was raised to room temperature, 1.2 g of AIBN (azobisisobutyronitrile) was added thereinto as the polymerization initiator; and then, after the temperature of the resulting mixture was raised to 60° C., the reaction was carried out for 15 hours. After this reaction solution was poured into 1-L of isopropyl alcohol for precipitation, the obtained white solid was dissolved again into the mixed solvent of 100 mL of methanol and 200 mL of tetrahydrofuran; and then, the deprotection reaction of the acetyl group was carried out at 70° C. for 5 hours with the addition of 10 g of triethylamine and 10 g of water. After the reaction solution was neutralized by acetic acid and then concentrated, the resulted residue was dissolved in 100 mL of acetone; and then, precipitation similar to the above-mentioned operation, filtration, and drying at 60° C. were carried out in turn to obtain a white polymer. This obtained polymer was analyzed by $^{13}$C-NMR, $^{1}$H-NMR, and GPC to obtain the following analysis results.

Copolymer composition ratio (molar ratio): 4-Amyloxy styrene:vinyl ruthenocene:4-hydroxystyrene=0.30:0.10:0.60

Weight-average molecular weight (Mw): 7,800

Molecular weight distribution (Mw/Mn): 1.79

This polymer compound is designated as Polymer 2.

Polymer 2

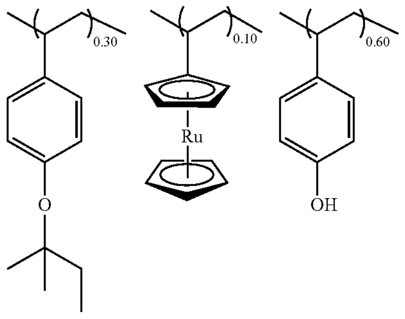

Synthesis Example 3

Into a 2-L flask were taken 5.1 g of t-butyl styrene-4-carboxylate, 3.2 g of vinyl ferrocene, 10.5 g of 4-acetoxy styrene, and 40 g of tetrahydrofuran as a solvent. After this reactor was cooled under the nitrogen atmosphere to −70° C., this was degassed under vacuum and then blown by the nitrogen gas; this operation was repeated for three times. After the temperature was raised to room temperature, 1.2 g of AIBN (azobisisobutyronitrile) was added thereinto as the polymerization initiator; and then, after the temperature of the resulting mixture was raised to 60° C., the reaction was carried out for 15 hours. After this reaction solution was poured into 1-L of isopropyl alcohol for precipitation, the obtained white solid was dissolved again into the mixed solvent of 100 mL of methanol and 200 mL of tetrahydrofuran; and then, the deprotection reaction of the acetyl group was carried out at 70° C. for 5 hours with the addition of 10 g of triethylamine and 10 g of water. After the reaction solution was neutralized by acetic acid and then concentrated, the resulted residue was dissolved in 100 mL of acetone; and then, precipitation similar to the above-mentioned operation, filtration, and drying at 60° C. were carried out in turn to obtain a white polymer. This obtained polymer was analyzed by $^{13}$C-NMR, $^{1}$H-NMR, and GPC to obtain the following analysis results.

Copolymer composition ratio (molar ratio): t-Butyl styrene-4-carboxylate:vinyl ferrocene:4-hydroxystyrene=0.25:0.15:0.60

Weight-average molecular weight (Mw): 7,800

Molecular weight distribution (Mw/Mn): 1.67

This polymer compound is designated as Polymer 3.

Polymer 3

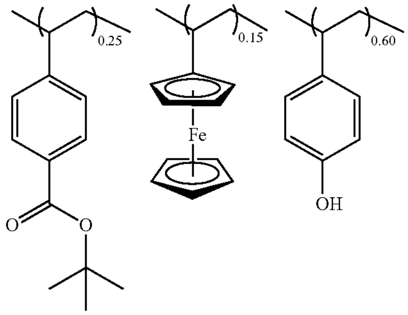

Synthesis Example 4

Into a 2-L flask were taken 8.2 g of 3-ethyl-3-exotetracyclo[4.4.0.1$^{2,5}$.1$^{7,10}$]dodecanyl methacrylate, 5.6 g of methylferrocene methacrylate, 11.1 g of 5-oxo-4-oxatricyclo[4.2.1.0$^{3,7}$]nonane-2-yl methacrylate, and 40 g of tetrahydrofuran as a solvent. After this reactor was cooled under the nitrogen atmosphere to −70° C., this was degassed under vacuum and then blown by the nitrogen gas; this operation was repeated for three times. After the temperature was raised to room temperature, 1.2 g of AIBN (azobisisobutyronitrile) was added thereinto as the polymerization initiator; and then, after the temperature of the resulting mixture was raised to 60° C., the reaction was carried out for 15 hours. After this reaction solution was poured into 1-L of isopropyl alcohol for precipitation, the obtained white solid was filtrated and then dried under reduced pressure at 60° C. to obtain a white polymer. This obtained polymer was analyzed by $^{13}$C-NMR, $^{1}$H-NMR, and GPC to obtain the following analysis results.

Copolymer composition ratio (molar ratio): 3-Ethyl-3-exotetracyclo[4.4.0.1$^{2,5}$.1$^{7,10}$]dodecanyl methacrylate:methylferrocene methacrylate:5-oxo-4-oxatricyclo[4.2.1.0$^{3,7}$]nonane-2-yl methacrylate=0.30:0.20:0.50

Weight-average molecular weight (Mw): 7,800

Molecular weight distribution (Mw/Mn): 1.89

This polymer compound is designated as Polymer 4.

Polymer 4

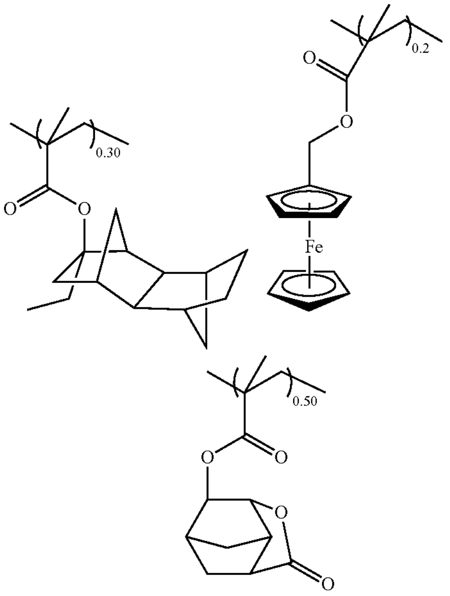

Synthesis Example 5

Into a 2-L flask were taken 8.2 g of 3-ethyl-3-exotetracyclo[4.4.0.1$^{2,5}$.1$^{7,10}$]dodecanyl methacrylate, 4.2 g of vinyl ferrocene, 5.3 g of 4-hydroxyphenyl methacrylate, 4.7 g of Adhesive Monomer 1, and 40 g of tetrahydrofuran as a solvent. After this reactor was cooled under the nitrogen atmosphere to −70° C., this was degassed under vacuum and then blown by the nitrogen gas; this operation was repeated for three times. After the temperature was raised to room temperature, 1.2 g of AIBN (azobisisobutyronitrile) was added thereinto as the polymerization initiator; and then, after the temperature of the resulting mixture was raised to 60° C., the reaction was carried out for 15 hours. After this reaction solution was poured into 1-L of isopropyl alcohol for precipitation, the obtained white solid was filtrated and then dried under reduced pressure at 60° C. to obtain a white polymer. This obtained polymer was analyzed by $^{13}$C-NMR, $^{1}$H-NMR, and GPC to obtain the following analysis results.

Copolymer composition ratio (molar ratio): 3-Ethyl-3-exotetracyclo[4.4.0.1$^{2,5}$.1$^{7,10}$]dodecanyl methacrylate:vinyl ferrocene:4-hydroxyphenyl methacrylate:Adhesive Monomer 1=0.30:0.20:0.30:0.20

Weight-average molecular weight (Mw): 7,300

Molecular weight distribution (Mw/Mn): 1.79

This polymer compound is designated as Polymer 5.

Polymer 5

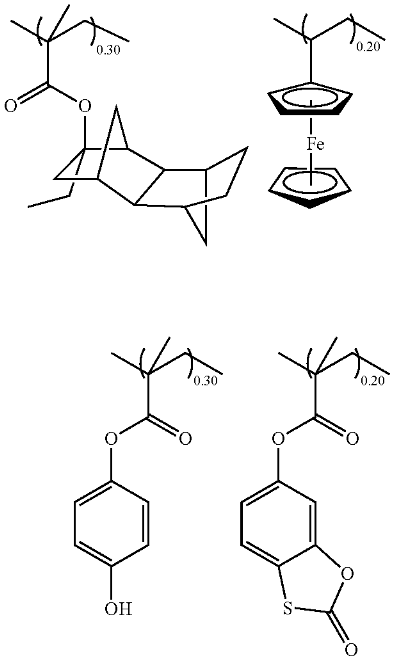

Synthesis Example 6

Into a 2-L flask were taken 8.9 g of Monomer 1 shown below, 2.1 g of vinyl ferrocene, 10.5 g of 4-acetoxy styrene, and 40 g of tetrahydrofuran as a solvent. After this reactor was cooled under the nitrogen atmosphere to −70° C., this was degassed under vacuum and then blown by the nitrogen gas; this operation was repeated for three times. After the temperature was raised to room temperature, 1.2 g of AIBN (azobisisobutyronitrile) was added thereinto as the polymerization initiator; and then, after the temperature of the resulting mixture was raised to 60° C., the reaction was carried out for 15 hours. After this reaction solution was poured into 1-L of isopropyl alcohol for precipitation, the obtained white solid was dissolved again into the mixed solvent of 100 mL of methanol and 200 mL of tetrahydrofuran; and then, the deprotection reaction of the acetyl group was carried out at 70° C. for 5 hours with the addition of 10 g of triethylamine and 10 g of water. After the reaction solution was neutralized by acetic acid and then concentrated, the resulted residue was dissolved in 100 mL of acetone; and then, precipitation similar to the above-mentioned operation, filtration, and drying at 60° C. were carried out in turn to obtain a white polymer. This obtained polymer was analyzed by $^{13}$C-NMR, $^{1}$H-NMR, and GPC to obtain the following analysis results.

Copolymer composition ratio (molar ratio): Monomer 1:vinyl ferrocene:4-hydroxystyrene=0.30:0.10:0.60

Weight-average molecular weight (Mw): 8,300

Molecular weight distribution (Mw/Mn): 1.86

This polymer compound is designated as Polymer 6.

Polymer 6

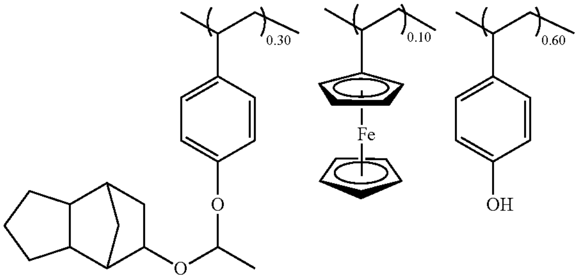

Monomer 1

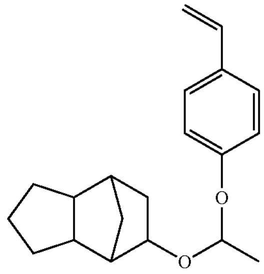

Synthesis Example 7

Into a 2-L flask were taken 8.2 g of 3-ethyl-3-exotetracyclo[4.4.0.1$^{2,5}$.1$^{7,10}$]dodecanyl methacrylate, 5.6 g of methylferrocene methacrylate, 8.9 g of 4-hydroxyphenyl methacrylate, and 40 g of tetrahydrofuran as a solvent. After this reactor was cooled under the nitrogen atmosphere to −70° C., this was degassed under vacuum and then blown by the nitrogen gas; this operation was repeated for three times. After the temperature was raised to room temperature, 1.2 g of AIBN (azobisisobutyronitrile) was added thereinto as the polymerization initiator; and then, after the temperature of the resulting mixture was raised to 60° C., the reaction was carried out for 15 hours. After this reaction solution was poured into 1-L of isopropyl alcohol for precipitation, the obtained white solid was filtrated and then dried under reduced pressure at 60° C. to obtain a white polymer. This obtained polymer was analyzed by $^{13}$C-NMR, $^{1}$H-NMR, and GPC to obtain the following analysis results.

Copolymer composition ratio (molar ratio): 3-Ethyl-3-exotetracyclo[4.4.0.1$^{2,5}$.1$^{7,10}$]dodecanyl methacrylate:methylferrocene methacrylate:4-hydroxyphenyl methacrylate=0.30:0.20:0.50

Weight-average molecular weight (Mw): 7,700

Molecular weight distribution (Mw/Mn): 1.77

This polymer compound is designated as Polymer 7.

Polymer 7

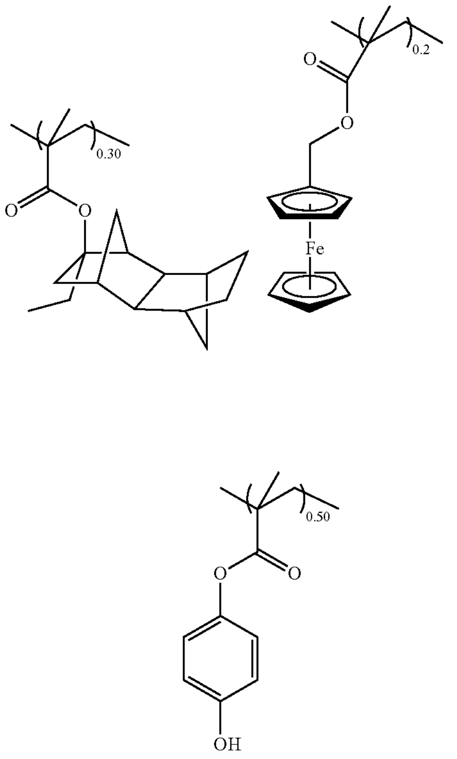

Synthesis Example 8

Into a 2-L flask were taken 8.2 g of 3-ethyl-3-exotetracyclo[4.4.0.1$^{2,5}$.1$^{7,10}$]dodecanyl methacrylate, 5.6 g of methylferrocene methacrylate, 3.6 g of 4-hydroxyphenyl methacrylate, 10.0 g of 3-oxo-2,7-dioxatricyclo[4.2.1.0$^{4,8}$]nonane-9-yl methacrylate, 5.6 g of PAG Monomer 1, and 40 g of tetrahydrofuran as a solvent. After this reactor was cooled under the nitrogen atmosphere to −70° C., this was degassed under vacuum and then blown by the nitrogen gas; this operation was repeated for three times. After the temperature was raised to room temperature, 1.2 g of AIBN (azobisisobutyronitrile) was added thereinto as the polymerization initiator; and then, after the temperature of the resulting mixture was raised to 60° C., the reaction was carried out for 15 hours. After this reaction solution was poured into 1-L of isopropyl alcohol for precipitation, the obtained white solid was filtrated and then dried under reduced pressure at 60° C. to obtain a white polymer. This obtained polymer was analyzed by $^{13}$C-NMR, $^{1}$H-NMR, and GPC to obtain the following analysis results.

Copolymer composition ratio (molar ratio): 3-Ethyl-3-exotetracyclo[4.4.0.1$^{2,5}$.1$^{7,10}$]dodecanyl methacrylate:methylferrocene methacrylate:4-hydroxyphenyl methacrylate:3-oxo-2,7-dioxatricyclo[4.2.1.0$^{4,8}$]nonane-9-yl methacrylate: PAG Monomer 1=0.30:0.20:0.20:0.20:0.10

Weight-average molecular weight (Mw): 7,700

Molecular weight distribution (Mw/Mn): 1.77

This polymer compound is designated as Polymer 8.

Polymer 8

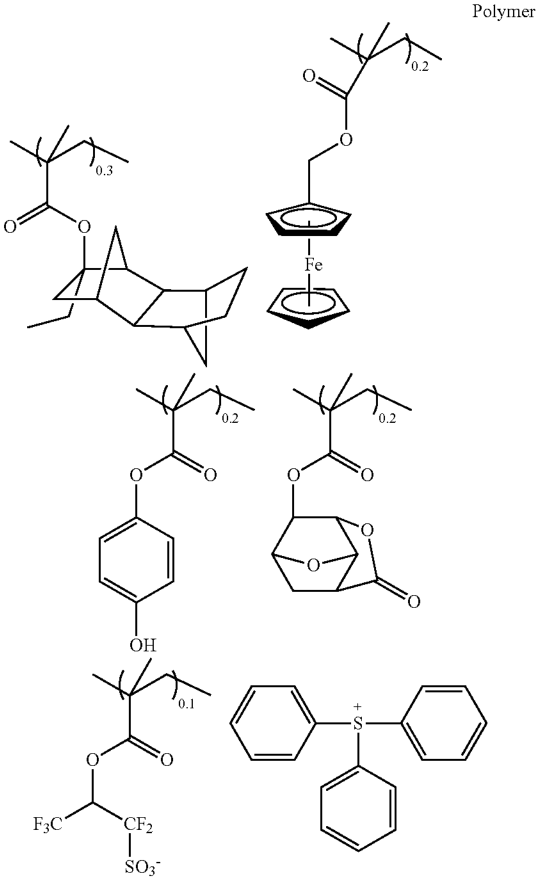

Comparative Synthesis Example 1

By the method similar to the above, the below-shown polymer was synthesized.

Copolymer composition ratio (molar ratio): 3-Ethyl-3-exotetracyclo[4.4.0.1$^{2,5}$.1$^{7,10}$]dodecanyl methacrylate:4-hydroxyphenyl methacrylate=0.30:0.70

Weight-average molecular weight (Mw): 9,900

Molecular weight distribution (Mw/Mn): 1.99

This polymer compound is designated as Comparative Polymer 1.

Comparative Polymer 1

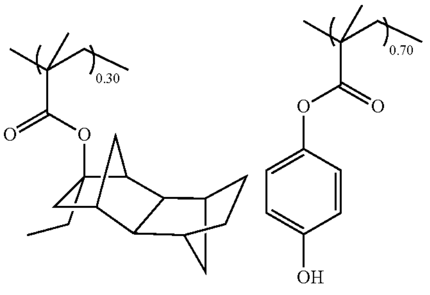

Comparative Synthesis Example 2

By the method similar to the above, the below-shown polymer was synthesized.

Copolymer composition ratio (molar ratio): 3-Ethyl-3-exotetracyclo[4.4.0.$1^{2,5}$.$1^{7,10}$]dodecanyl methacrylate: acenaphthylene:4-hydroxyphenyl methacrylate=0.30:0.20:0.50

Weight-average molecular weight (Mw): 8,900

Molecular weight distribution (Mw/Mn): 1.85

This polymer compound is designated as Comparative Polymer 2.

Comparative Polymer 2

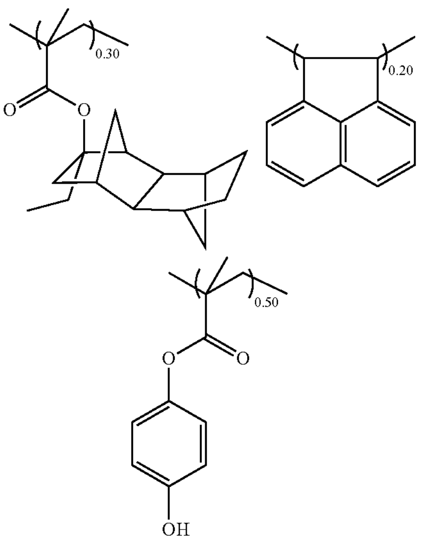

Examples and Comparative Examples

By using each of the polymer compounds synthesized as described above, a solution with the composition ratio shown in Table 1 containing 100 ppm of the dissolved surfactant (FC-4430, manufactured by Sumitomo 3M, Ltd.) therein was filtrated with a 0.2-μm filter to obtain a positive resist composition.

Ingredients in Table 1 are as follows.

Polymers 1 to 8: Polymer compounds obtained by the Synthesis Examples 1 to 8

Comparative Polymers 1 to 2: Polymer compounds obtained by the Comparative Synthesis Examples 1 to 2

Organic Solvents:

PGMEA: Propyleneglycol monomethyl ether acetate

PGME: Propyleneglycol monomethyl ether

CyH: Cyclohexanone

Acid-generator: PAG 1 (see the structural formula shown below)

Basic compound: Amine 1 (see the structural formula shown below)

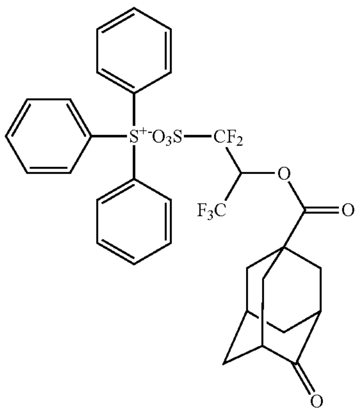

PAG 1

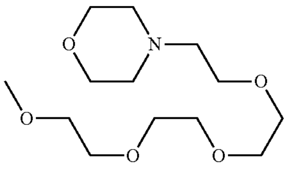

Amine 1

Evaluation of Electron Beam Drawing:

The obtained positive resist compositions were applied by spin coating by using Clean Track Mark 5 (manufactured by Tokyo Electron Ltd.) onto the Si substrates with the diameter of 6 inches treated with vapor primer of hexamethyl disilazane (HMDS); and then, the substrates were pre-baked on a hot plate at 110° C. for 60 seconds to obtain a resist film having the film thickness of 100 nm. To this was drawn in a vacuum chamber by using HL-800D (manufactured by Hitachi, Ltd.) with the HV voltage of 50 kV.

Immediately after drawing, the substrates were subjected to the post-exposure bake (PEB) on a hot plate at the temperature shown in Table 1 for 60 seconds by using Clean Track Mark 5 (manufactured by Tokyo Electron Ltd.), and then, puddle-developed by using the aqueous TMAH solution with the concentration thereof being 2.38% by mass for 30 seconds to obtain a positive pattern.

The positive pattern thus obtained was evaluated as follows.

The minimum size with the exposure amount to dissolve the 100-nm line-and-space by 1:1 was taken as the resolution; and the edge roughness (LWR) with 100 nmLS was measured by SEM.

Resist composition, sensitivity, and resolution by the EB exposure are shown in Table 1.

TABLE 1

| | Polymer (parts by mass) | Acid-generator (parts by mass) | Basic compound (parts by mass) | Organic solvent (parts by mass) | PEB Temp. (° C.) | Sensitivity (μC/$cm^2$) | Resolution (nm) | LWR (nm) |
|---|---|---|---|---|---|---|---|---|
| Example 1-1 | Polymer 1 (100) | PAG 1 (20) | Amine 1 (1.0) | PGMEA (1500) CyH (200) | 90 | 21.6 | 75 | 6.7 |

TABLE 1-continued

| | Polymer (parts by mass) | Acid-generator (parts by mass) | Basic compound (parts by mass) | Organic solvent (parts by mass) | PEB Temp. (° C.) | Sensitivity ($\mu C/cm^2$) | Resolution (nm) | LWR (nm) |
|---|---|---|---|---|---|---|---|---|
| Example 1-2 | Polymer 2 (100) | PAG 1 (20) | Amine 1 (1.0) | PGMEA (1500) CyH (200) | 95 | 20.6 | 75 | 6.8 |
| Example 1-3 | Polymer 3 (100) | PAG 1 (20) | Amine 1 (1.0) | PGMEA (1500) CyH (200) | 95 | 20.3 | 75 | 6.4 |
| Example 1-4 | Polymer 4 (100) | PAG 1 (20) | Amine 1 (1.0) | PGMEA (1500) CyH (200) | 90 | 19.0 | 75 | 6.1 |
| Example 1-5 | Polymer 5 (100) | PAG 1 (20) | Amine 1 (1.0) | PGMEA (1500) CyH (200) | 95 | 20.3 | 70 | 6.4 |
| Example 1-6 | Polymer 6 (100) | PAG 1 (20) | Amine 1 (1.0) | PGMEA (1500) CyH (200) | 95 | 20.1 | 70 | 6.6 |
| Example 1-7 | Polymer 7 (100) | PAG 1 (20) | Amine 1 (1.0) | PGMEA (1800) | 90 | 21.3 | 70 | 6.3 |
| Example 1-8 | Polymer 8 (100) | — | Amine 1 (0.8) | PGMEA (500) CyH (1450) PGME (50) | 90 | 21.2 | 70 | 4.0 |
| Comparative Example 1-1 | Comparative Polymer 1 (100) | PAG 1 (12) | Amine 1 (1.0) | PGMEA (1500) CyH (200) | 90 | 23.5 | 90 | 8.9 |
| Comparative Example 1-2 | Comparative Polymer 2 (100) | PAG 1 (12) | Amine 1 (1.0) | PGMEA (1500) CyH (200) | 90 | 33.6 | 85 | 8.2 |

Evaluation of Dry Etching Resistance:

In the dry etching resistance test, 2 g of each of the foregoing polymers was dissolved in 10 g of cyclohexanone; and then, this solution was filtrated through a 0.2-μm filter. The polymer solution thus obtained was applied on the Si substrate by spin coating to obtain a film having the thickness of 300 nm, which was then evaluated with the following conditions.

Etching Test in the $CHF_3/CF_4$ Gas System:

Difference in film thickness of the polymer film before and after etching was measured by using the dry etching instrument TE-8500P (manufactured by Tokyo Electron, Ltd.); and then, the etching rate per 1 minute was obtained.

The etching condition was as following:

Chamber pressure: 40.0 Pa

RF power: 1,000 W

Gap: 9 mm $CHF_3$ gas flow rate: 30 mL/minute $CF_4$ gas flow rate: 30 mL/minute Ar gas flow rate: 100 mL/minute Time: 60 seconds In this evaluation, smaller difference in the film thickness, namely smaller film loss, shows higher etching resistance.

Results of the dry etching resistance are shown in Table 2.

TABLE 2

| | Etching rate in $CHF_3/CF_4$ gas system (nm/minute) |
|---|---|
| Polymer 1 | 89 |
| Polymer 2 | 61 |
| Polymer 3 | 62 |
| Polymer 4 | 78 |
| Polymer 5 | 72 |
| Polymer 6 | 60 |
| Polymer 7 | 79 |
| Polymer 8 | 74 |
| Comparative Polymer 1 | 122 |
| Comparative Polymer 2 | 105 |

From the results shown in Tables 1 and 2, it can be seen that the positive resist composition of the present invention using the base resin of the polymer compound, i.e., the copolymer of the repeating unit having the hydrogen atom in the carboxyl group and/or the phenolic hydroxy group therein been substituted by an acid-labile group and the repeating unit having a cyclopentadienyl complex satisfies fully the resolution, the sensitivity, and the edge roughness; and moreover, by copolymerizing further an acid-generator therewith, characteristics with respect to the resolution and the edge roughness can be improved furthermore.

It must be noted here that the present invention is not limited to the embodiments as described above. The foregoing embodiments are mere examples; any form having substantially the same composition as the technical concept described in claims of the present invention and showing similar effects is included in the technical scope of the present invention.

What is claimed is:

1. A positive resist composition, wherein a polymer compound having the weight-average molecular weight in the range of 1,000 to 500,000 and comprising a repeating unit having a hydrogen atom in a carboxyl group and/or in a phenolic hydroxy group therein been substituted by an acid-labile group and a repeating unit "a" having a cyclopentadienyl complex shown by the following general formula (1) is used as a base resin therein, (1)

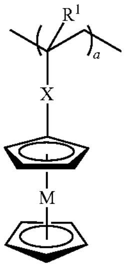

wherein $R^1$ represents a hydrogen atom or a methyl group; X represents a single bond, a methylene group, —C(═O)—O—$R^2$—, —O—$R^2$—, —O—C(═O)—$R^2$—, or —Ar—$R^2$—; M represents Fe, Co, Ni, Cr, or Ru; Ar represents a phenylene group or a naphthylene group; $R^2$ are the same or different, representing a single bond, or a linear, a branched, or a cyclic alkylene group having 3 to 6 carbon atoms, an arylene group having 6 to 10 carbon atoms, or an alkenylene group having 2 to 10 carbon atoms, wherein $R^2$ may optionally contain an ester group or an ether group.

2. The positive resist composition according to claim 1, wherein a polymer compound shown by the following general formula (2) having a repeating unit shown by the following general formula (b1) and/or (b2) as the repeating unit having a hydrogen atom in a carboxyl group and/or in a phenolic hydroxy group therein been substituted by an acid-labile group is used as the base resin, (2)

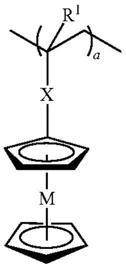

(a)

-continued

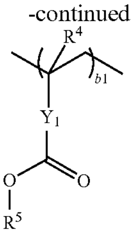

(b1)

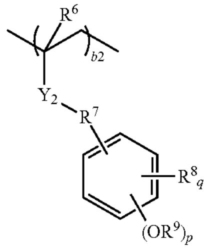

(b2)

wherein $R^1$, X, and M represent the same meanings as before; $R^4$ and $R^6$ represent a hydrogen atom or a methyl group; $R^5$ and $R^9$ represent an acid-labile group; $R^7$ represents a single bond, or a linear or a branched alkylene group having 1 to 6 carbon atoms; $R^8$ represents a hydrogen atom, a fluorine atom, a trifluoromethyl group, a cyano group, or a linear, a branched, or a cyclic alkyl group having 1 to 6 carbon atoms; "p" represents 1 or 2; "q" represents an integer of 0 to 4; $Y_1$ represents a single bond, a connecting group having 1 to 12 carbon atoms which has an ester group, an ether group, or a lactone ring, a phenylene group, or a naphthylene group; $Y_2$ represents a single bond, —C(═O)—O—, or —C(═O)—NH—; and $0<a<1.0$, $0\le b1<1.0$, $0\le b2<1.0$, $0<b1+b2<1.0$, and $0.1\le a+b1+b2\le 1.0$.

3. The positive resist composition according to claim 2, wherein a polymer compound having, in addition to the repeating unit "a" and the repeating unit shown by (b1) and/or (b2) in the general formula (2), a repeating unit "c" which has an adhesive group selected from a hydroxy group, a carboxyl group, a lactone ring, a carbonate group, a thiocarbonate group, a carbonyl group, a cyclic acetal group, an ether group, an ester group, a sulfonate ester group, a cyano group, an amide group, and —O—C(═O)-G- is used as a base resin, provided that G represents a sulfur atom or NH, $0<c\le 0.9$, and $0.2\le a+b1+b2+c\le 1.0$.

4. The positive resist composition according to claim 1, wherein the positive resist composition is a chemically amplifying resist composition which contains an organic solvent and an acid-generator further.

5. The positive resist composition according to claim 2, wherein the positive resist composition is a chemically amplifying resist composition which contains an organic solvent and an acid-generator further.

6. The positive resist composition according to claim 3, wherein the positive resist composition is a chemically amplifying resist composition which contains an organic solvent and an acid-generator further.

7. The positive resist composition according to claim 1, wherein the positive resist composition contains a basic compound and/or a surfactant further as additives.

8. The positive resist composition according to claim 2, wherein the positive resist composition contains a basic compound and/or a surfactant further as additives.

9. The positive resist composition according to claim 3, wherein the positive resist composition contains a basic compound and/or a surfactant further as additives.

10. The positive resist composition according to claim 4, wherein the positive resist composition contains a basic compound and/or a surfactant further as additives.

11. The positive resist composition according to claim 5, wherein the positive resist composition contains a basic compound and/or a surfactant further as additives.

12. The positive resist composition according to claim 6, wherein the positive resist composition contains a basic compound and/or a surfactant further as additives.

13. A patterning process comprising a step of applying the positive resist composition according to claim 1 onto a substrate, after heat treatment thereof, a step of exposing to a high energy beam, and a step of development by using a developer.

14. The patterning process according to claim 13, wherein the high energy beam for exposure is a g-beam of the wavelength of 430 nm, an i-beam of the wavelength of 365 nm, a KrF excimer laser beam of the wavelength of 248 nm, an electron beam, or a soft X-ray with the wavelength in the range of 3 to 15 nm.

15. The patterning process according to claim 13, wherein a resist pattern after development is cured by baking it in the temperature range of 130 to 300° C. and for the time range of 5 to 1000 seconds.

16. The patterning process according to claim 14, wherein a resist pattern after development is cured by baking it in the temperature range of 130 to 300° C. and for the time range of 5 to 1000 seconds.

* * * * *